US012713627B2

(12) United States Patent
Lane et al.

(10) Patent No.: US 12,713,627 B2
(45) Date of Patent: Aug. 18, 2026

(54) PACKAGE WITH A SUBSTRATE COMPRISING EMBEDDED STACKED TRENCH CAPACITOR DEVICES

(71) Applicant: QUALCOMM Incorporated, San Diego, CA (US)

(72) Inventors: Ryan Lane, San Diego, CA (US); Charles David Paynter, Encinitas, CA (US); Durodami Lisk, San Diego, CA (US); Darko Popovic, San Diego, CA (US); Yue Li, San Diego, CA (US); Shree Krishna Pandey, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 922 days.

(21) Appl. No.: 17/878,758

(22) Filed: Aug. 1, 2022

(65) Prior Publication Data

US 2024/0038831 A1 Feb. 1, 2024

(51) Int. Cl.
*H10D 1/00* (2025.01)
*H10D 1/68* (2025.01)
(Continued)

(52) U.S. Cl.
CPC ............. *H10D 1/042* (2025.01); *H10D 1/716* (2025.01); *H10W 20/496* (2026.01); *H10W 70/685* (2026.01); *H10W 90/724* (2026.01)

(58) Field of Classification Search
CPC .... H10D 1/042; H10D 1/716; H01L 23/5223; H01L 23/49822; H01L 24/16;
(Continued)

(56) References Cited

U.S. PATENT DOCUMENTS

2004/0108587 A1* 6/2004 Chudzik ................ H05K 1/162 257/E23.079
2010/0084175 A1 4/2010 Suzuki et al.
(Continued)

FOREIGN PATENT DOCUMENTS

EP 1139705 A1 10/2001

OTHER PUBLICATIONS

International Search Report and Written Opinion—PCT/US2023/069794—ISA/EPO—Oct. 4, 2023.

*Primary Examiner* — Marlon T Fletcher
*Assistant Examiner* — Da Wei Lee
(74) *Attorney, Agent, or Firm* — Loza & Loza, LLP

(57) ABSTRACT

A package comprising a substrate and an integrated device. The substrate includes a core layer comprising a first surface and a second surface; a plurality of core interconnects located in the core layer; at least one first dielectric layer coupled to the first surface of the core layer; a first plurality of interconnects located in the at least one first dielectric layer; at least one second dielectric layer coupled to the second surface of the core layer; a second plurality of interconnects located in the at least one second dielectric layer; and a capacitor structure located in the core layer. The capacitor structure includes a first trench capacitor device comprising a first front side and a first back side; and a second trench capacitor device coupled to the first trench capacitor device, where the second trench capacitor device comprises a second front side and a second back side.

30 Claims, 41 Drawing Sheets

PROFILE CROSS SECTIONAL VIEW

(51) Int. Cl.

| | |
|---|---|
| ***H10W 20/40*** | (2026.01) |
| *H10W 70/685* | (2026.01) |
| *H10W 90/00* | (2026.01) |

(58) Field of Classification Search

CPC . H01L 2224/16225; H01L 2924/19041; H01L 21/4857; H01L 23/49816; H10W 20/496; H10W 70/685; H10W 90/724; H10W 90/701; H10W 70/05; H10W 72/20

See application file for complete search history.

(56) References Cited

U.S. PATENT DOCUMENTS

| | | | | |
|---|---|---|---|---|
| 2013/0081866 | A1 | 4/2013 | Furutani et al. | |
| 2017/0018497 | A1 | 1/2017 | Zhai et al. | |
| 2020/0294908 | A1 | 9/2020 | Haba et al. | |
| 2021/0305164 | A1 | 9/2021 | Tseng et al. | |
| 2021/0343684 | A1 | 11/2021 | Kim et al. | |
| 2022/0148953 | A1 | 5/2022 | Kim et al. | |
| 2022/0223585 | A1 | 7/2022 | Kim et al. | |
| 2023/0060324 | A1* | 3/2023 | Liu | H10D 1/042 |
| 2023/0062775 | A1* | 3/2023 | Hsu | H10W 70/05 |
| 2023/0215849 | A1* | 7/2023 | Choi | H10W 20/496 257/737 |
| 2025/0125276 | A1* | 4/2025 | Cai | H10W 20/20 |

* cited by examiner

PROFILE CROSS SECTIONAL VIEW

PROFILE CROSS SECTIONAL VIEW

PROFILE CROSS SECTIONAL VIEW

PROFILE CROSS SECTIONAL VIEW

PROFILE CROSS SECTIONAL VIEW

PROFILE CROSS SECTIONAL VIEW

PROFILE CROSS SECTIONAL VIEW

PROFILE CROSS SECTIONAL VIEW

PROFILE CROSS SECTIONAL VIEW

PROFILE CROSS SECTIONAL VIEW

ELECTRICALLY CONDUCTIVE LAYER FORMATION

DIELECTRIC LAYER FORMATION

Figure 13D:
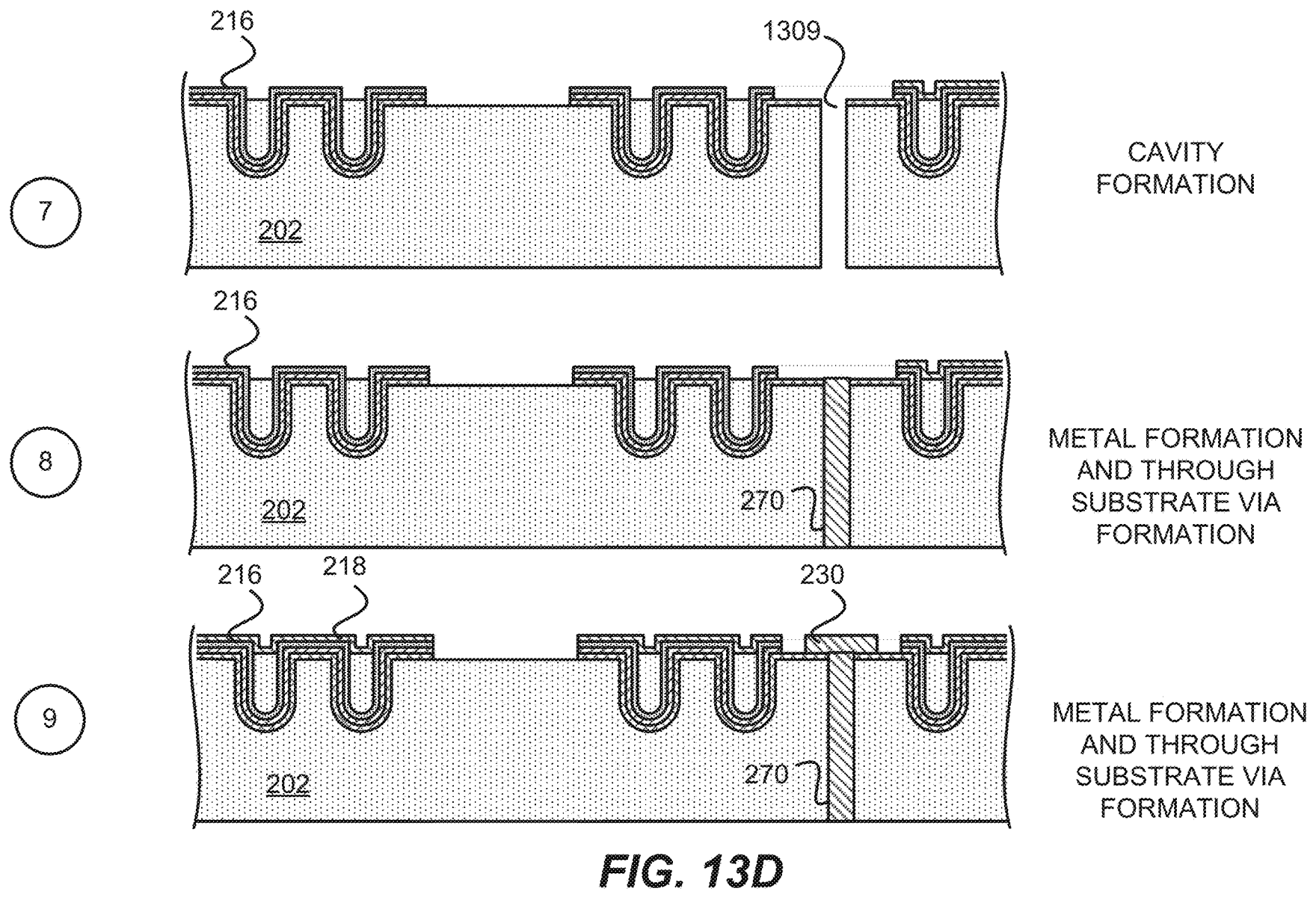

CAVITY FORMATION

METAL FORMATION AND THROUGH SUBSTRATE VIA FORMATION

METAL FORMATION AND THROUGH SUBSTRATE VIA FORMATION

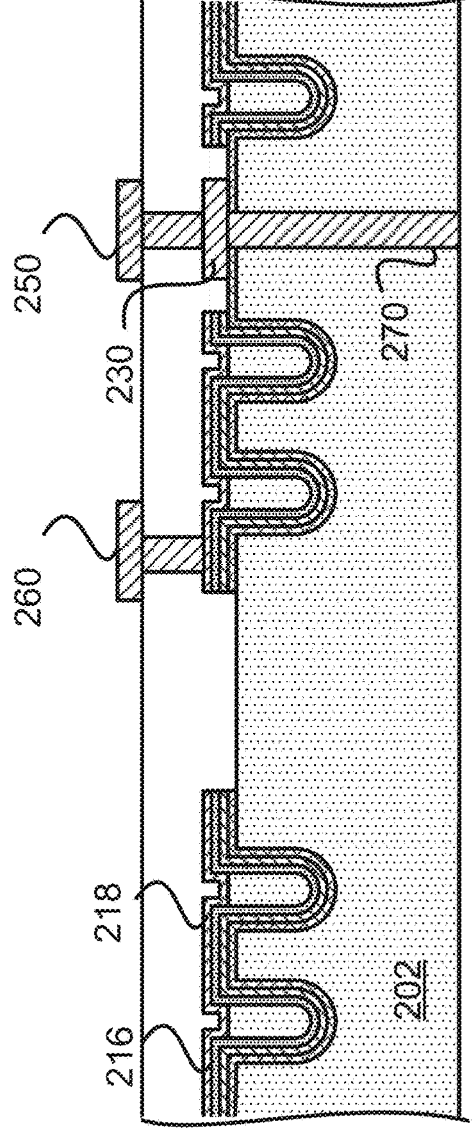
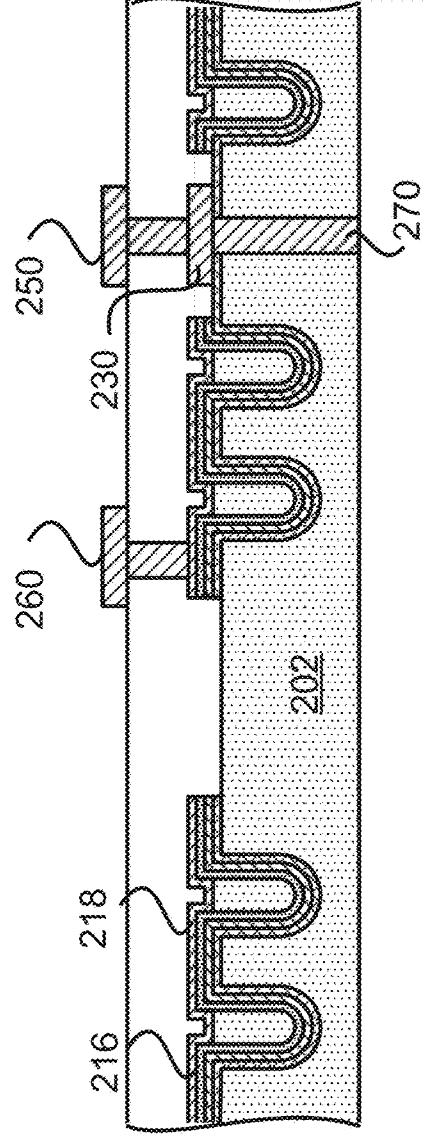
*FIG. 13F*

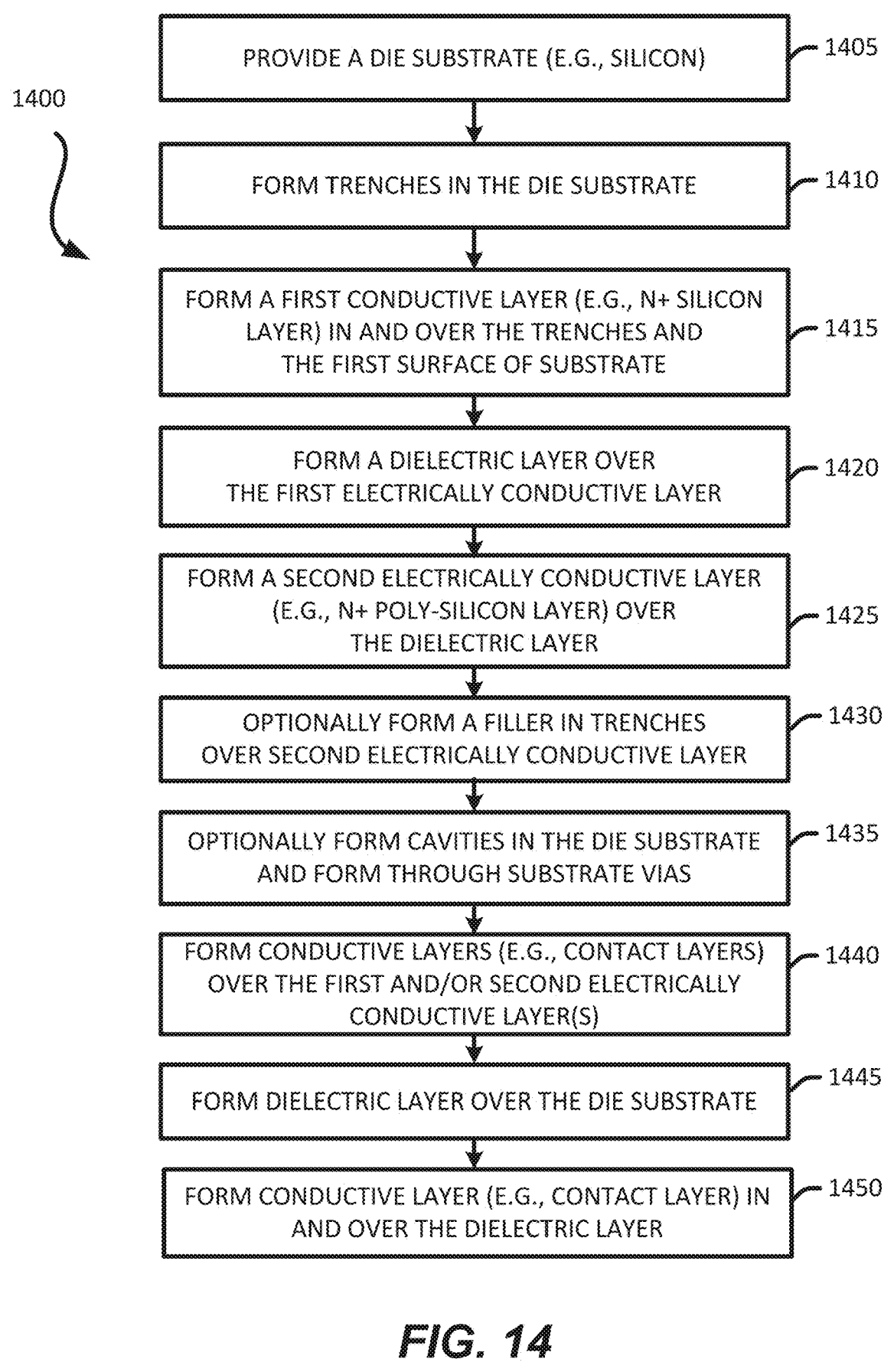

1400

PROVIDE A DIE SUBSTRATE (E.G., SILICON) — 1405

FORM TRENCHES IN THE DIE SUBSTRATE — 1410

FORM A FIRST CONDUCTIVE LAYER (E.G., N+ SILICON LAYER) IN AND OVER THE TRENCHES AND THE FIRST SURFACE OF SUBSTRATE — 1415

FORM A DIELECTRIC LAYER OVER THE FIRST ELECTRICALLY CONDUCTIVE LAYER — 1420

FORM A SECOND ELECTRICALLY CONDUCTIVE LAYER (E.G., N+ POLY-SILICON LAYER) OVER THE DIELECTRIC LAYER — 1425

OPTIONALLY FORM A FILLER IN TRENCHES OVER SECOND ELECTRICALLY CONDUCTIVE LAYER — 1430

OPTIONALLY FORM CAVITIES IN THE DIE SUBSTRATE AND FORM THROUGH SUBSTRATE VIAS — 1435

FORM CONDUCTIVE LAYERS (E.G., CONTACT LAYERS) OVER THE FIRST AND/OR SECOND ELECTRICALLY CONDUCTIVE LAYER(S) — 1440

FORM DIELECTRIC LAYER OVER THE DIE SUBSTRATE — 1445

FORM CONDUCTIVE LAYER (E.G., CONTACT LAYER) IN AND OVER THE DIELECTRIC LAYER — 1450

FIG. 14

SOLDER RESIST LAYER FORMATION

102

122b
122a
120
126a
126b
106
140
125
121
127
142
16

SOLDER INTERCONNECT FORMATION

102

122b
122a
120
126a
126b
106
140
125
121
127
142
150

DIELECTRIC FORMATION
CAVITY FORMATION
INTERCONNECT FORMATION
122a
120
126a
506
121
1542
1546
1525
1527
11
12
13

SOLDER RESIST LAYER FORMATION

SOLDER INTERCONNECT FORMATION

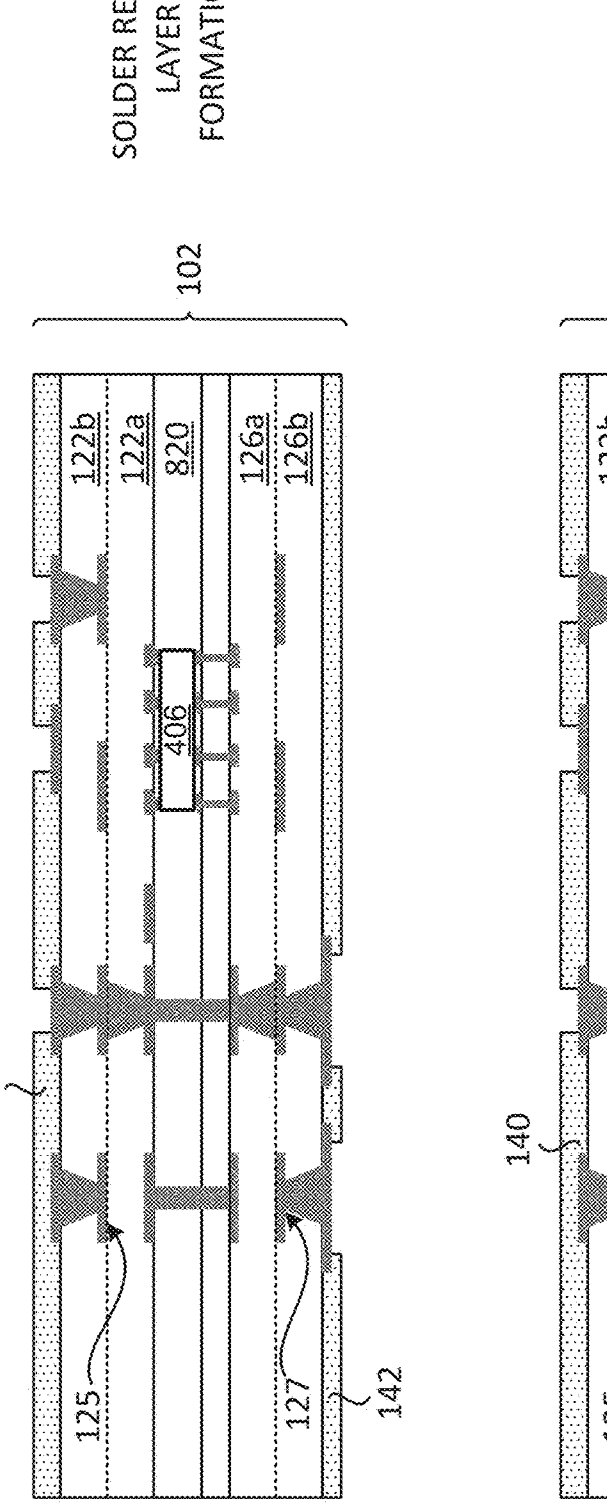
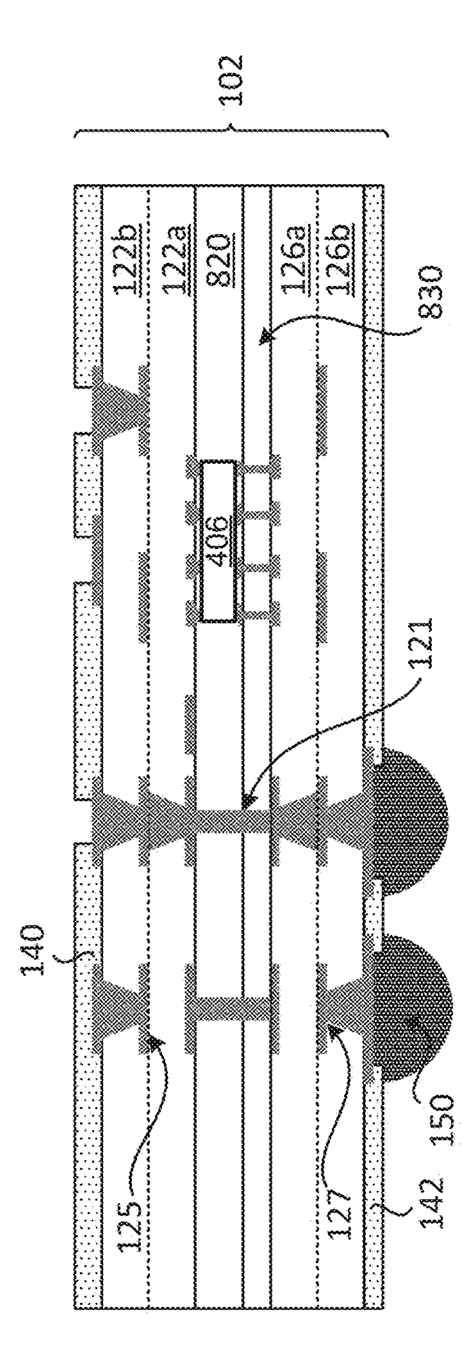
*FIG. 17E*

DIELECTRIC FORMATION
CAVITY FORMATION
INTERCONNECT FORMATION
10
11
12
124
122a
120
126a
106
121
1823
1833
1542
1546
1525
1527

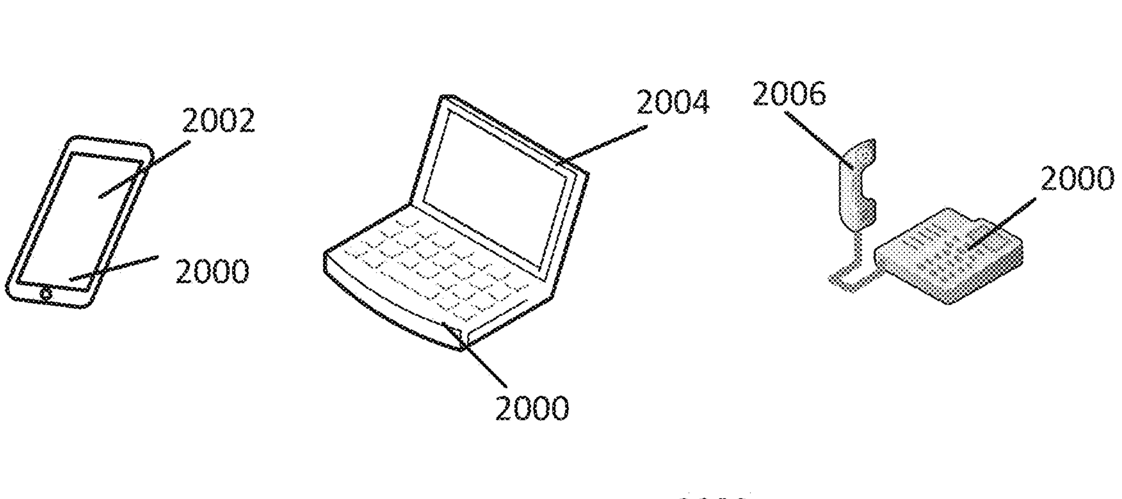
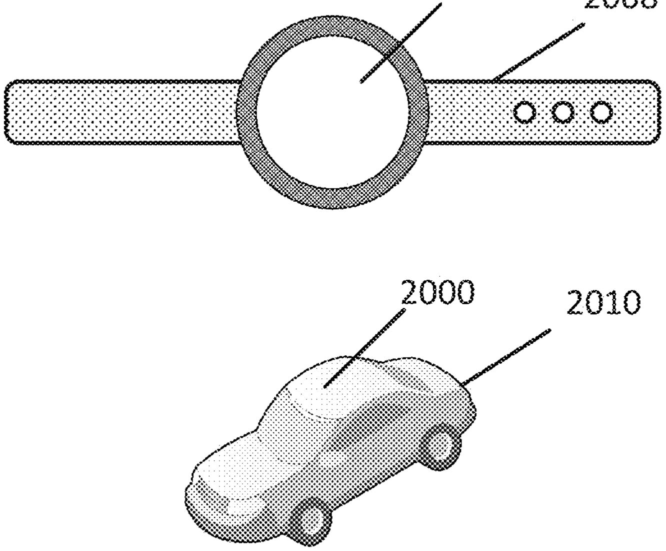
FIG. 20

PACKAGE WITH A SUBSTRATE COMPRISING EMBEDDED STACKED TRENCH CAPACITOR DEVICES

FIELD

Various features relate to packages that include a substrate.

BACKGROUND

A package may include a substrate and integrated devices. These components are coupled together to provide a package that may perform various electrical functions. There is an ongoing need to provide better performing packages and reduce the overall size of the packages.

SUMMARY

Various features relate to packages that include a substrate.

One example provides a package comprising a substrate and an integrated device coupled to the substrate. The substrate includes a core layer comprising a first surface and a second surface; a plurality of core interconnects located in the core layer; at least one first dielectric layer coupled to the first surface of the core layer; a first plurality of interconnects located in the at least one first dielectric layer; at least one second dielectric layer coupled to the second surface of the core layer; a second plurality of interconnects located in the at least one second dielectric layer; and a capacitor structure located in the core layer. The capacitor structure includes a first trench capacitor device comprising a first front side and a first back side; and a second trench capacitor device coupled to the first trench capacitor device, wherein the second trench capacitor device comprises a second front side and a second back side.

Another example provides a device comprising a package. The package includes a substrate and an integrated device coupled to the substrate. The substrate includes a core layer comprising a first surface and a second surface; a plurality of core interconnects located in the core layer; at least one first dielectric layer coupled to the first surface of the core layer; a first plurality of interconnects located in the at least one first dielectric layer; at least one second dielectric layer coupled to the second surface of the core layer; a second plurality of interconnects located in the at least one second dielectric layer; and means for stacked trench capacitance located in the core layer.

Another example provides method for fabricating a substrate. The method provides a capacitor structure comprising a first trench capacitor device comprising a first front side and a first back side; and a second trench capacitor device coupled to the first trench capacitor device, where the second trench capacitor device comprises a second front side and a second back side. The method forms a core layer such that the capacitor structure is located in the core layer. The core layer includes a first surface and a second surface. The method forms a plurality of core interconnects in the core layer. The method forms at least one first dielectric layer coupled to the first surface of the core layer. The method forms at least one second dielectric layer coupled to the second surface of the core layer. The method forms a first plurality of interconnects in the at least one first dielectric layer. The method forms a second plurality of interconnects in the at least one second dielectric layer.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 13A-13F illustrate an exemplary sequence for fabricating a trench capacitor device.

FIG. 14 illustrates an exemplary flow diagram of a method for fabricating a trench capacitor device.

FIGS. 16A-16E illustrate an exemplary sequence for fabricating a substrate comprising a stacked capacitor structure.

FIGS. 17A-17E illustrate an exemplary sequence for fabricating a substrate comprising a stacked capacitor structure.

FIG. 20 illustrates various electronic devices that may integrate a die, an electronic circuit, an integrated device, an integrated passive device (IPD), a passive component, a package, and/or a device package described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a substrate and an integrated device coupled to the substrate. The substrate includes a core layer comprising a first surface and a second surface; a plurality of core interconnects located in the core layer; at least one first dielectric layer coupled to the first surface of the core layer; a first plurality of interconnects located in the at least one first dielectric layer; at least one second dielectric layer coupled to the second surface of the core layer; a second plurality of interconnects located in the at least one second dielectric layer; and a capacitor structure located in the core layer. The capacitor structure includes a first trench capacitor device comprising a first front side and a first back side; and a second trench capacitor device coupled to the first trench capacitor device, wherein the second trench capacitor device comprises a second front side and a second back side. The use of the stacked trench capacitor devices helps improve the performance of the integrated device and the package by providing high capacitance density capacitors in the substrate, while maintaining and/or reducing package inductance. Capacitors with higher capacitance density allow for more compact form factors for the package, since these capacitors take up less space but can provide capacitance that are the same and/or comparable to larger sized capacitors. The compact form factor of the stacked trench capacitor devices allows them to be located in the core layer of a substrate.

Figure 1:
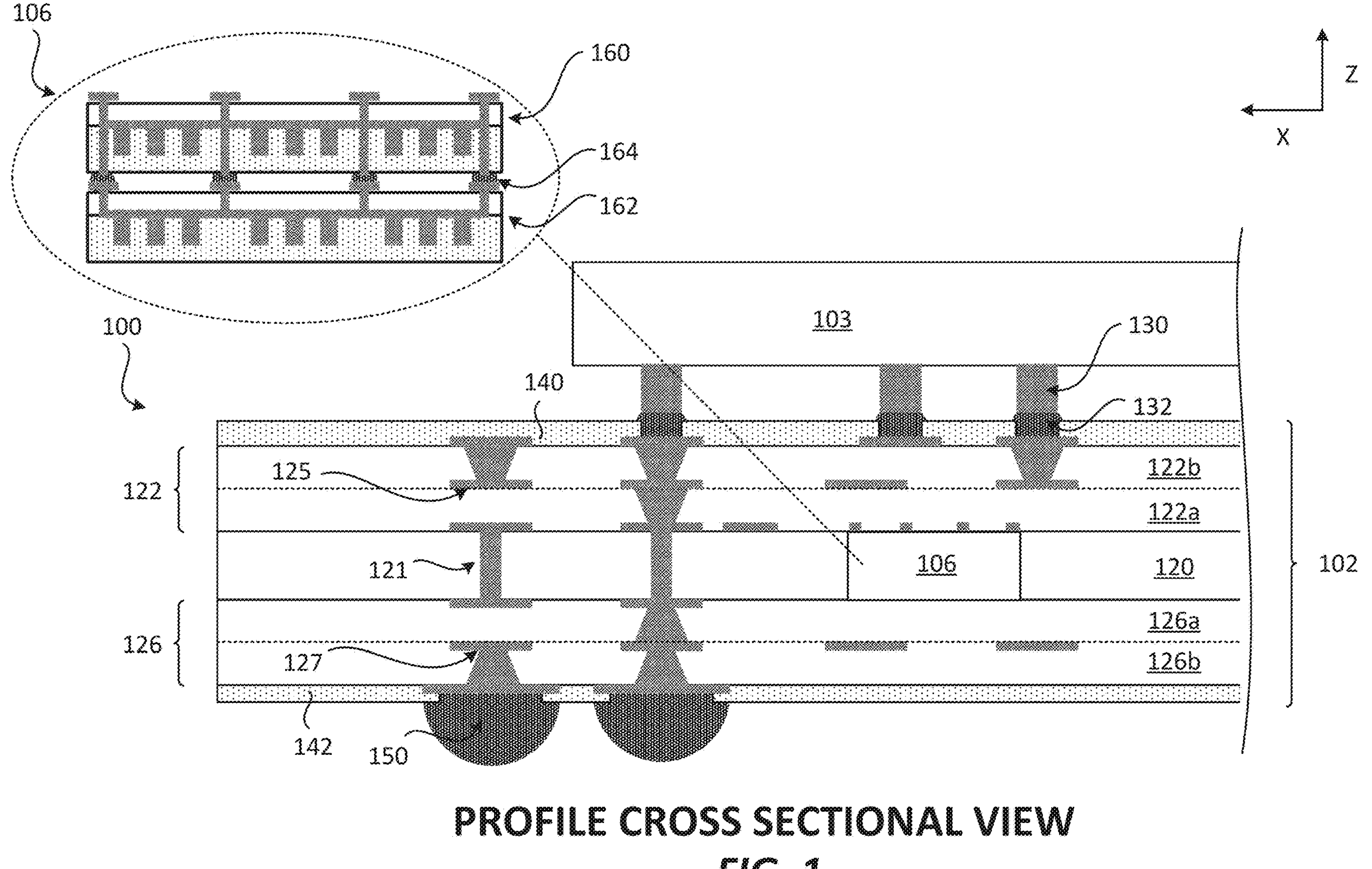
FIG. 1 illustrates a profile cross sectional view of a package that includes a substrate with a stacked capacitor structure.

Exemplary Package Comprising a Substrate Comprising Embedded Stacked Trench Capacitor Devices FIG. 1 illustrates a profile cross sectional view of a package 100 that includes a substrate with embedded stacked trench capacitor devices. The package 100 includes a substrate 102 and an integrated device 103. The substrate 102 includes a core layer 120, at least one first dielectric layer 122, at least one second dielectric layer 126, a plurality of core interconnects 121, a first plurality of interconnects 125, a second plurality of interconnects 127, a solder resist layer 140, a solder resist layer 142, a plurality of solder interconnects 150, and a capacitor structure 106.

The capacitor structure 106 may be a stacked trench capacitor structure (e.g., means for stacked trenched capacitance). As shown in FIG. 1, the capacitor structure 106 is located in the core layer 120 of the substrate 102. The capacitor structure 106 is laterally surrounded by the core layer 120. The core layer 120 may touch the lateral sides of the capacitor structure 106. The capacitor structure 106 includes at least two trench capacitor devices. For example, the capacitor structure 106 includes a first trench capacitor device 160 and a second trench capacitor device 162. The first trench capacitor device 160 is coupled to the second trench capacitor device 162 through a plurality of solder interconnects 164. Similarly, the second trench capacitor device 162 is coupled to the first trench capacitor device 160 through a plurality of solder interconnects 164. As will be further described below, interconnects from the first trench capacitor device 160 may be coupled to interconnects from the second trench capacitor device 162 through the plurality of solder interconnects 164. As will be further described below, the first trench capacitor device 160 may be coupled to the second trench capacitor device 162 through copper to copper bonding.

The first trench capacitor device 160 is located (e.g., located vertically) over the second trench capacitor device 162. However, the second trench capacitor device 162 may be located (e.g., located vertically) over the first trench capacitor device 160. The first trench capacitor device 160 includes a first front side and a first back side. The second trench capacitor device 162 includes a second front side and a second back side. As shown in FIG. 1, the first back side of the first trench capacitor device 160 faces the second front side of the second trench capacitor device 162. Thus, the first back side of the first trench capacitor device 160 may be coupled (e.g., electrically coupled) to the second front side of the second trench capacitor device 162. However, in some implementations, the first back side of the first trench capacitor device 160 may be coupled (e.g., electrically coupled) to the second back side of the second trench capacitor device 162, such that the first back side of the first trench capacitor device 160 faces the second back side of the second trench capacitor device 162. A more detailed example of a trench capacitor device is described further below in at least FIGS. 2 and 3.

The core layer 120 includes a first surface (e.g., top surface) and a second surface (e.g., bottom surface). The core layer 120 may include a core dielectric layer. The plurality of core interconnects 121 is located in the core layer 120. The plurality of core interconnects 121 may include core via interconnects that extend through the entirety of the thickness of the core layer 120. For example, a core via interconnect may extend between the first surface and the second surface of the core layer 120. As mentioned above, the capacitor structure 106 is located in the core layer 120 of the substrate 102. The lateral side(s) of the capacitor structure 106 may be in direct contact with the core layer 120. Thus, for example, the lateral side(s) of the first trench capacitor device 160 and/or the lateral side(s) of the second trench capacitor device 162 may be in direct contact with the core layer 120. The capacitor structure 106 may have a thickness that is about the same, smaller or greater than the thickness of the core layer 120. As will be further described below in at least FIGS. 15A-15E and FIGS. 16A-16E, the core layer 120 may be defined by two or more core dielectric layers.

The at least one first dielectric layer 122 is located above and coupled to the first surface of the core layer 120. The at least one first dielectric layer 122 may include a first dielectric layer 122*a* and a first dielectric layer 122*b*. The first plurality of interconnects 125 may be located in the at least one first dielectric layer 122. The first plurality of interconnects 125 may be configured to be electrically coupled to the plurality of core interconnects 121 and the capacitor structure 106. In particular, the first plurality of interconnects 125 may be configured to be coupled (e.g., electrically coupled) to the first trench capacitor device 160 and/or the second trench capacitor device 162.

The at least one second dielectric layer 126 is located below and coupled to the second surface of the core layer 120. The at least one second dielectric layer 126 may include a second dielectric layer 126*a* and a second dielectric layer 126*b*. The second plurality of interconnects 127 may be located in the at least one second dielectric layer 126. The second plurality of interconnects 127 may be configured to be electrically coupled to the plurality of core interconnects 121 and the capacitor structure 106. In particular, the second plurality of interconnects 127 may be configured to be coupled (e.g., electrically coupled) to the first trench capacitor device 160 and/or the second trench capacitor device 162.

The core layer 120 may include the same material or a different material than the at least one first dielectric layer 122 and/or the at least one second dielectric layer 126. In some implementations, the at least one first dielectric layer 122 and/or the at least one second dielectric layer 126 may include prepreg.

The use of the capacitor structure (e.g., 106) helps improve the performance of the integrated device and the package by providing high capacitance density capacitors in the substrate, while maintaining and/or reducing package inductance. The vertically stacked trench capacitor devices have higher capacitance density that allow for more compact form factors for the package, since these trench capacitors take up less space but can provide capacitance that are the same and/or comparable to a single larger sized capacitor. Moreover, the compact form factor of the stacked trench capacitor devices allows them to be located in the core layer 120 of the substrate 102, thus these stacked trench capacitor devices may be placed in locations that other capacitors may not be able to be located in, resulting in better utilization of space in the package 100.

The integrated device 103 is coupled to the substrate 102 through a plurality of pillar interconnects 130 and/or a plurality of solder interconnects 132. For example, the integrated device 103 may be coupled to the first plurality of interconnects 125 of the substrate 102 through the plurality of pillar interconnects 130 and/or the plurality of solder interconnects 132. The integrated device 103 may be configured to be electrically coupled to the capacitor structure 106 (e.g., to the first trench capacitor device 160 and/or the second trench capacitor device 162) through one or more electrical paths that include the plurality of pillar interconnects 130, the plurality of solder interconnects 132, the first plurality of interconnects 125, the plurality of core interconnects 121 and/or the second plurality of interconnects 127.

FIG. 1 illustrates that the capacitor structure 106 includes two trench capacitor devices. However, in some implementations, the capacitor structure 106 may include more than two trench capacitors that are vertically stacked on top of one another. Different implementations may have trench capacitor devices that are oriented in the same direction or different directions. Moreover, the capacitor structure 106 may be located differently in a package. FIGS. 4-12 illustrate other examples of packages with other similar and/or different configurations of a capacitor structure.

Exemplary Trench Capacitor Device

Figure 2:
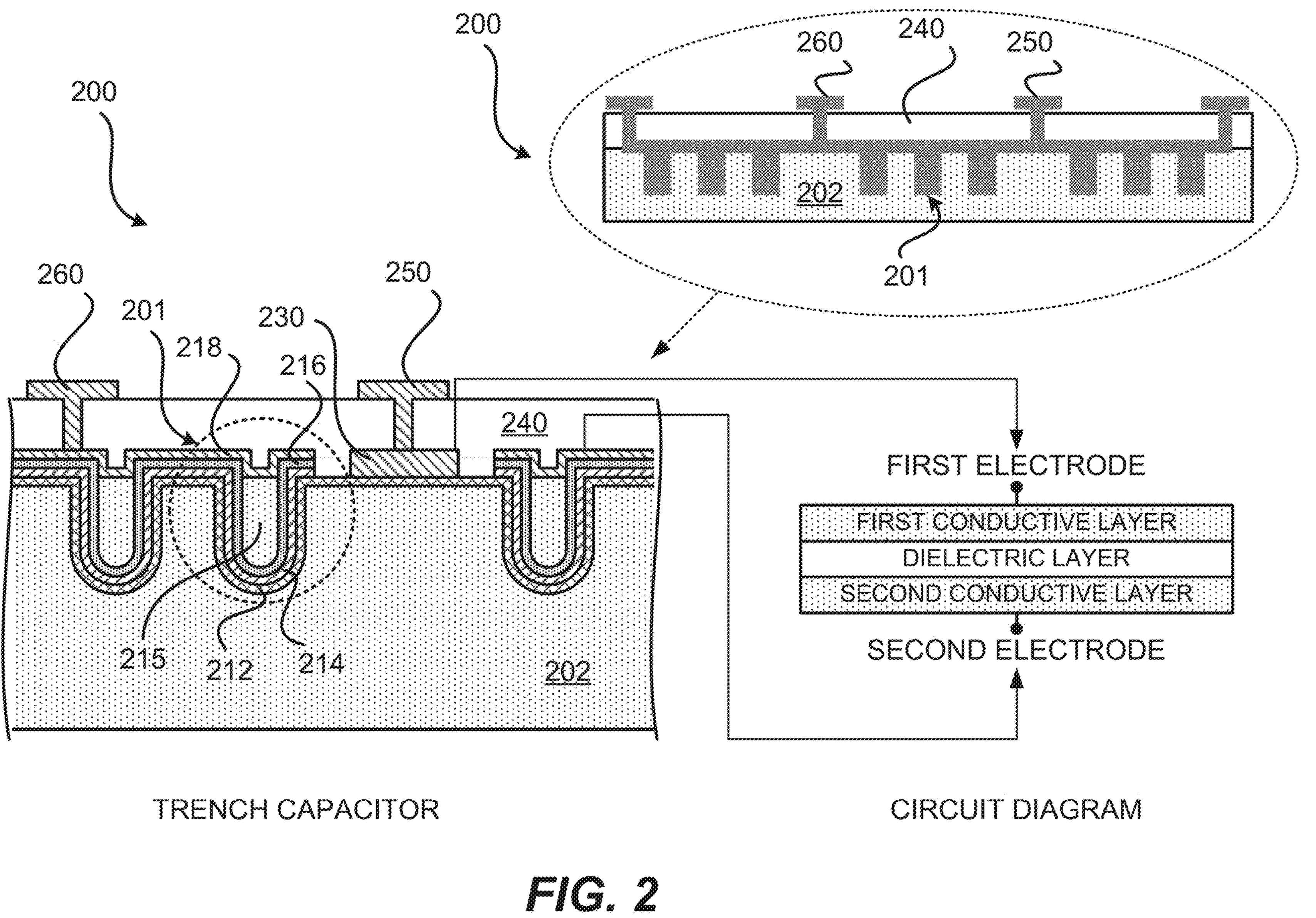
FIG. 2 illustrates a profile cross sectional view of a trench capacitor that can be implemented in a stacked capacitor structure.

FIG. 2 illustrates an example of a trench capacitor device 200. The trench capacitor device 200 includes at least one trench capacitor 201. FIG. 2 illustrates a die substrate 202, a first electrically conductive layer 212, a dielectric layer 214, a second electrically conductive layer 216, a filler 215, a second contact layer 218, a first contact layer 230, a dielectric layer 240, a first capacitor interconnect 250 and a second capacitor interconnect 260.

The trench capacitor device 200 may include one or more trench capacitors 201. The trench capacitor device 200 may include a plurality of trench capacitors 201 that may be configured to be electrically coupled together to provide a trench capacitor device with high capacitance (e.g., high capacitance density). The trench capacitor device 200 may be a means for trench capacitance (e.g., means for first trench capacitance, means for second trench capacitance). The trench capacitor device 200 may represent a detailed example of the second trench capacitor device 162. Each of the trench capacitor from the plurality of trench capacitors 201 of the trench capacitor device 200 may be located horizontally (e.g., laterally) to each other.

The first electrically conductive layer 212, the dielectric layer 214, the second electrically conductive layer 216, and the filler 215 may be located over (i) a first surface of the die substrate 202 and (ii) in one or more trenches of the die substrate 202. The first electrically conductive layer 212 is located (e.g., formed) over (i) the first surface of the die substrate 202 and (ii) in one or more trenches of the die substrate 202. The dielectric layer 214 is located over the first electrically conductive layer 212. Portions of the dielectric layer 214 may be located in one or more trenches of the die substrate 202. The second electrically conductive layer 216 may be located over the dielectric layer 214. Portions of the second electrically conductive layer 216 may be located in one or more trenches of the die substrate 202. The second contact layer 218 may be located over the second electrically conductive layer 216. The first contact layer 230 may be located over the first electrically conductive layer 212. The dielectric layer 240 may be located over the die substrate 202, the first electrically conductive layer 212, the second contact layer 218 and/or the first contact layer 230. The first capacitor interconnect 250 is coupled to the first contact layer 230. The second capacitor interconnect 260 is coupled to the second contact layer 218. The first capacitor interconnect 250 and the second capacitor interconnect 260 may be located over the dielectric layer 240 and may extend through the dielectric layer 240.

The trench capacitor device 200 includes the first electrically conductive layer 212, the dielectric layer 214 and the second electrically conductive layer 216. In some implementations, the trench capacitor 201 may be defined by portions of the first electrically conductive layer 212, portions of the dielectric layer 214 and portions of the second electrically conductive layer 216 that are located in the trench of the die substrate 202. It is noted that the trenches of the die substrate 202 may not be visible in FIG. 2 because the trenches of the die substrate 202 may be filled or partially filled with material (e.g., solid material). The shape and/or size of the trenches may vary with different implementations. An example of a trench in a die substrate is illustrated and described in FIG. 13A.

The die substrate 202 may include silicon (Si). The first electrically conductive layer 212 may include N+ silicon. The second electrically conductive layer 216 may include N+ poly silicon. The first electrically conductive layer 212 may include N+ poly silicon, and the second electrically conductive layer 216 may include N+ silicon. It is noted that different implementations may use different materials and/or different combinations of materials for the first electrically conductive layer 212 and/or the second electrically conductive layer 216. For example, the first electrically conductive layer 212 and/or the second electrically conductive layer 216 may include P+ silicon, P+ poly silicon, copper (Cu), aluminum (Al), and/or other metals. The dielectric layer 214 may include $Al_2O_3$, $HfO_2$, $Ta_2O_5$, SiN, and/or combinations thereof. The filler 215 may include Ajinomoto Buildup Film (ABF) or other similar materials. The second contact layer 218 and/or the first contact layer 230 may include metal (e.g., copper, aluminum).

FIG. 2 also illustrates a circuit diagram that may conceptually represent the trench capacitor 201. The first electrode of the circuit diagram may be the first contact layer 230. The second electrode of the circuit diagram may be the second contact layer 218. As will be further described below, several trench capacitor devices may be configured to be electrically coupled together to provide an effective capacitor with high capacitance (e.g., high capacitance density).

Figure 3:
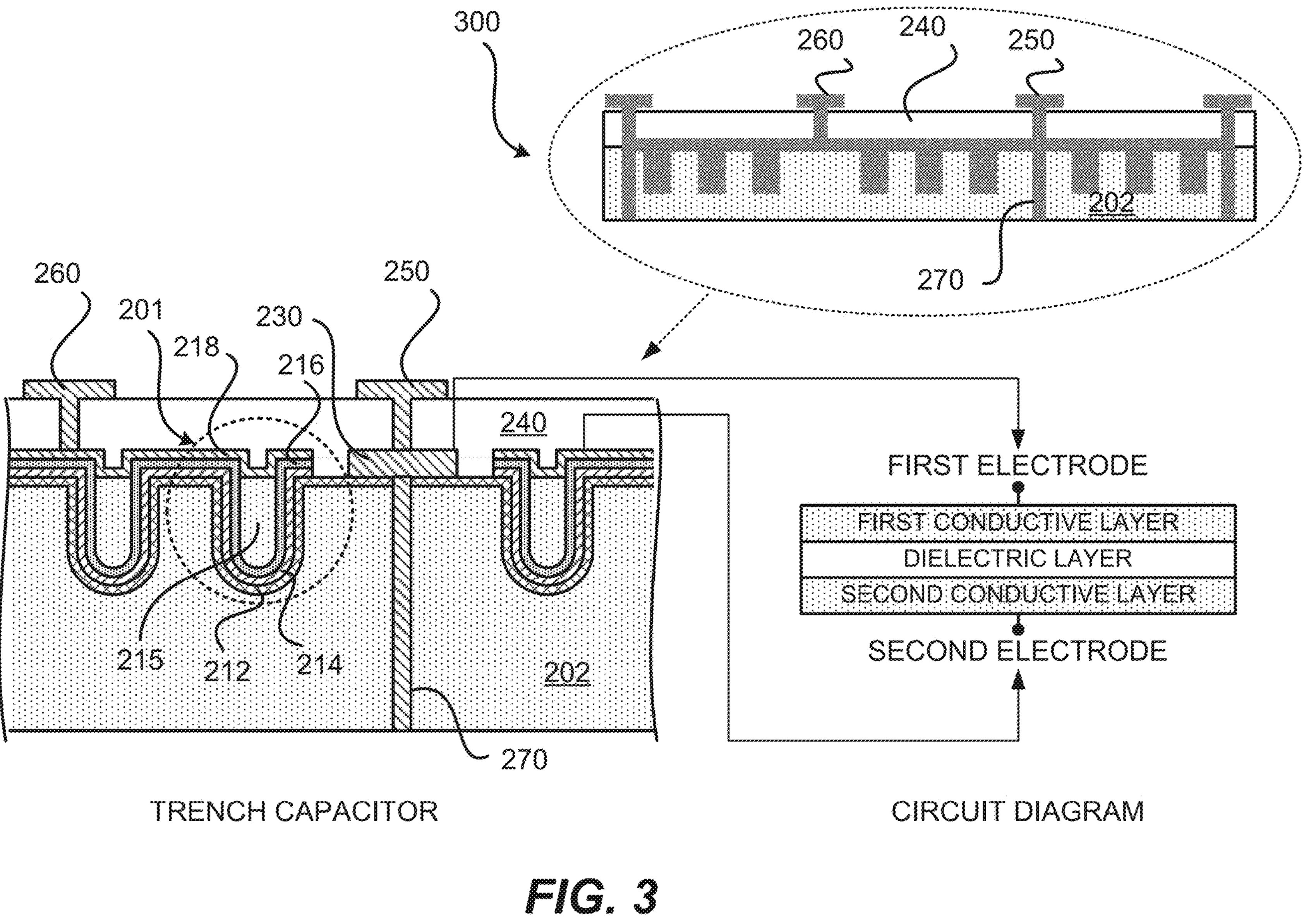
FIG. 3 illustrates a profile cross sectional view of a trench capacitor that can be implemented in a stacked capacitor structure.

FIG. 3 illustrates an example of a trench capacitor device 300. The trench capacitor device 300 includes at least one trench capacitor 201. FIG. 3 illustrates the die substrate 202, a first electrically conductive layer 212, a dielectric layer 214, a second electrically conductive layer 216, a filler 215, a second contact layer 218, a first contact layer 230, a dielectric layer 240, a first capacitor interconnect 250, a second capacitor interconnect 260 and a through substrate via 270. The trench capacitor device 300 is similar to the trench capacitor device 200, and thus may include the same or similar components as the trench capacitor device 200. The trench capacitor device 300 also includes the through substrate via 270 that extends through the die substrate 202.

In FIG. 3, the through substrate via 270 is coupled to the first electrically conductive layer 212, the first contact layer 230 and/or the first capacitor interconnect 250. However, the through substrate via 270 and/or other through substrate vias (TSVs) may be configured to be coupled (e.g., electrically coupled) to the second electrically conductive layer 216, the second contact layer 218 and/or the second capacitor interconnect 260. In some implementations, the through substrate via 270 and/or other through substrate vias are not directly coupled to a trench capacitor 201 of the trench capacitor device 200. In some implementations, the capacitor interconnect 250 and/or the capacitor interconnect 260 of a particular trench capacitor device (e.g., first trench capacitor device) may be configured to be coupled to other capacitor interconnects (e.g., 250, 260) of other trench capacitor devices (e.g., second trench capacitor device) through a solder interconnect or through copper to copper bonding. In some implementations, the capacitor interconnect 250 and/or the capacitor interconnect 260 of a particular trench capacitor device (e.g., first trench capacitor device) may be configured to be coupled to other through substrate vias (e.g., 270) of other trench capacitor devices (e.g., second trench capacitor device) through a solder interconnect or through copper to copper bonding. In some implementations, the capacitor interconnect 250, the capacitor interconnect 260, and/or the through substrate via 270 of a trench capacitor device may be configured to be coupled to interconnects of a substrate. Thus, when the disclosure describes that one or more interconnects from a substrate is coupled to a capacitor structure, the one or more interconnects from the substrate may be coupled to a capacitor interconnect 250, a capacitor interconnect 260, and/or a through substrate via 270 of the trench capacitor device of the capacitor structure (either directly or indirectly through solder interconnects).

The trench capacitor device 300 may include one or more trench capacitors 201. The trench capacitor device 300 may include a plurality of trench capacitors 201 that may be configured to be electrically coupled together to provide a trench capacitor device with high capacitance (e.g., high capacitance density). The trench capacitor device 300 may be means for trench capacitance (e.g., means for first trench capacitance, means for second trench capacitance). The trench capacitor device 300 may represent a detailed example of the first trench capacitor device 160. Each of the trench capacitor from the plurality of trench capacitors 201 of the trench capacitor device 300 may be located horizontally (e.g., laterally) to each other.

Figure 4:
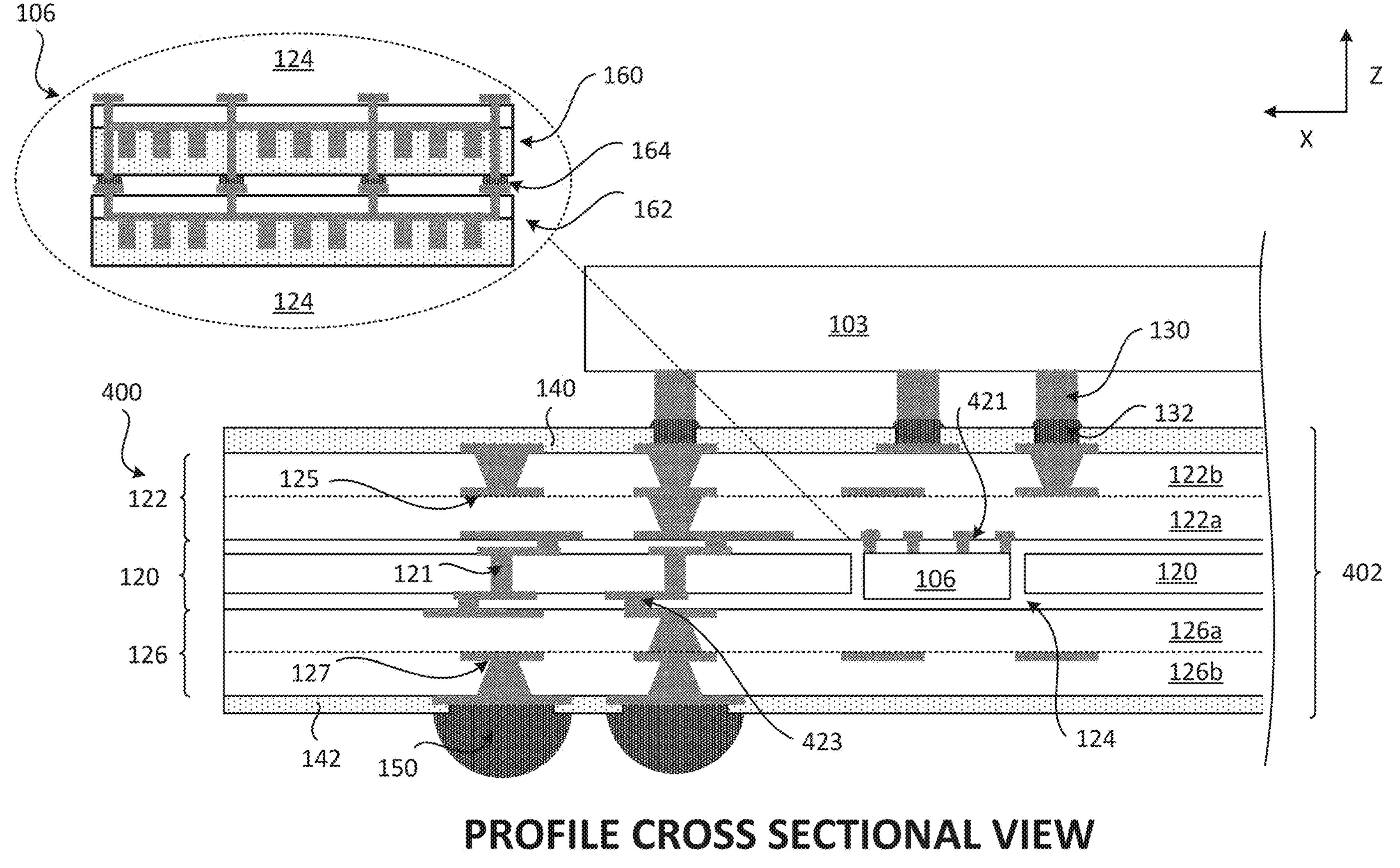
FIG. 4 illustrates a profile cross sectional view of a package that includes a substrate with a stacked capacitor structure.

Exemplary Packages Comprising a Substrate Comprising Embedded Stacked Trench Capacitor Devices FIG. 4 illustrates a profile cross sectional view of a package 400 that includes a substrate with embedded stacked trench capacitor devices. The package 400 includes the substrate 402 and the integrated device 103. The substrate 402 includes a core layer 120, at least one first dielectric layer 122, at least one second dielectric layer 126, at least one dielectric layer 124, a plurality of core interconnects 121, a first plurality of interconnects 125, a second plurality of interconnects 127, a solder resist layer 140, a solder resist layer 142, a plurality of solder interconnects 150, and a capacitor structure 106.

The package 400 is similar to the package 100, and thus include similar components as the package 100. Similarly, the package 400 may be arranged and/or configured in a similar manner as the package 100. The substrate 402 is similar to the substrate 102. The capacitor structure 106 may be located in a cavity of the core layer 120. The dielectric layer 124 may surround the capacitor structure 106 in the cavity of the core layer 120. The dielectric layer 124 may touch the capacitor structure 106. For example, the dielectric layer 124 may touch the sidewalls (e.g., side portions) of the capacitor structure 106, a top portion of the capacitor structure 106, and/or a bottom portion of the capacitor structure 106. The capacitor structure 106 may be surrounded (e.g., laterally surrounded) by the core layer 120. The dielectric layer 124 may be located in a cavity of the core layer 120. The dielectric layer 124 may be located over (e.g., above) a first surface (e.g., top surface) of the core layer 120, and over (e.g., below) a second surface (e.g., bottom surface) of the core layer 120.

A plurality of interconnects 421 and a plurality of interconnects 423 may be located in, above and/or below the dielectric layer 124. The plurality of interconnects 421 may be configured to be coupled to the capacitor structure 106 (e.g., interconnects of the capacitor structure 106), the plurality of core interconnects 121 and/or the plurality of interconnects 125. The plurality of interconnects 423 may be configured to be coupled to the plurality of core interconnects 121 and/or the plurality of interconnects 127.

The capacitor structure 106 may be a stacked trench capacitor structure (e.g., means for stacked trench capacitance). As shown in FIG. 4, the capacitor structure 106 is located in a cavity of the core layer 120 of the substrate 102. The cavity of the core layer 120 is filled with the dielectric layer 124. The capacitor structure 106 includes at least two trench capacitor devices. For example, the capacitor structure 106 includes a first trench capacitor device 160 and a second trench capacitor device 162. The first trench capacitor device 160 is coupled to the second trench capacitor device 162 through a plurality of solder interconnects 164. Similarly, the second trench capacitor device 162 is coupled to the first trench capacitor device 160 through a plurality of solder interconnects 164. As will be further described below, interconnects from the first trench capacitor device 160 may be coupled to interconnects from the second trench capacitor device 162 through the plurality of solder interconnects 164. As will be further described below, the first trench capacitor device 160 may be coupled to the second trench capacitor device 162 through copper to copper bonding.

The first trench capacitor device 160 is located (e.g., located vertically) over the second trench capacitor device 162. The first trench capacitor device 160 includes a first front side and a first back side. The second trench capacitor device 162 includes a second front side and a second back side. As shown in FIG. 4, the first back side of the first trench capacitor device 160 faces the second front side of the second trench capacitor device 162. Thus, the first back side of the first trench capacitor device 160 may be coupled (e.g., electrically coupled) to the second front side of the second trench capacitor device 162. However, in some implementations, the first front side of the first trench capacitor device 160 may be coupled (e.g., electrically coupled) to the second front side of the second trench capacitor device 162, such that the first front side of the first trench capacitor device 160 faces the second front side of the second trench capacitor device 162. In some implementations, the first back side of the first trench capacitor device 160 may be coupled to the second back side of the second trench capacitor device 162, such that the first back side of the first trench capacitor device 160 faces the second back side of the second trench capacitor device 162*b*. In another example of a configuration of a capacitor structure, in some implementations, the first front side of the first trench capacitor device 160 may be coupled to the second back side of the second trench capacitor device 162, such that the first back side of the first trench capacitor device 160 faces the second back side of the second trench capacitor device 162. The trench capacitor device 200 of FIG. 2 may illustrate a detailed example of the trench capacitor device 162. The trench capacitor device 300 of FIG. 3 may illustrate a detailed example of the trench capacitor device 160.

The core layer 120 includes a first surface (e.g., top surface) and a second surface (e.g., bottom surface). The plurality of core interconnects 121 is located in the core layer 120. The plurality of core interconnects 121 may include core via interconnects that extend through the entirety of the thickness of the core layer 120. For example, a core via interconnect may extend between the first surface and the second surface of the core layer 120. The capacitor structure 106 may have a thickness that is about the same, smaller or greater than the thickness of the core layer 120.

The integrated device 103 is coupled to the substrate 102 through a plurality of pillar interconnects 130 and/or a plurality of solder interconnects 132. For example, the integrated device 103 may be coupled to the first plurality of interconnects 125 of the substrate 102 through the plurality of pillar interconnects 130 and/or the plurality of solder interconnects 132. The integrated device 103 may be configured to be electrically coupled to the capacitor structure 106 (e.g., to the first trench capacitor device 160 and/or the second trench capacitor device 162) through one or more electrical paths that include the plurality of pillar interconnects 130, the plurality of solder interconnects 132, the first plurality of interconnects 125, the plurality of core interconnects 121, the second plurality of interconnects 127, the plurality of interconnects 421 and/or the plurality of interconnects 423.

Figure 5:
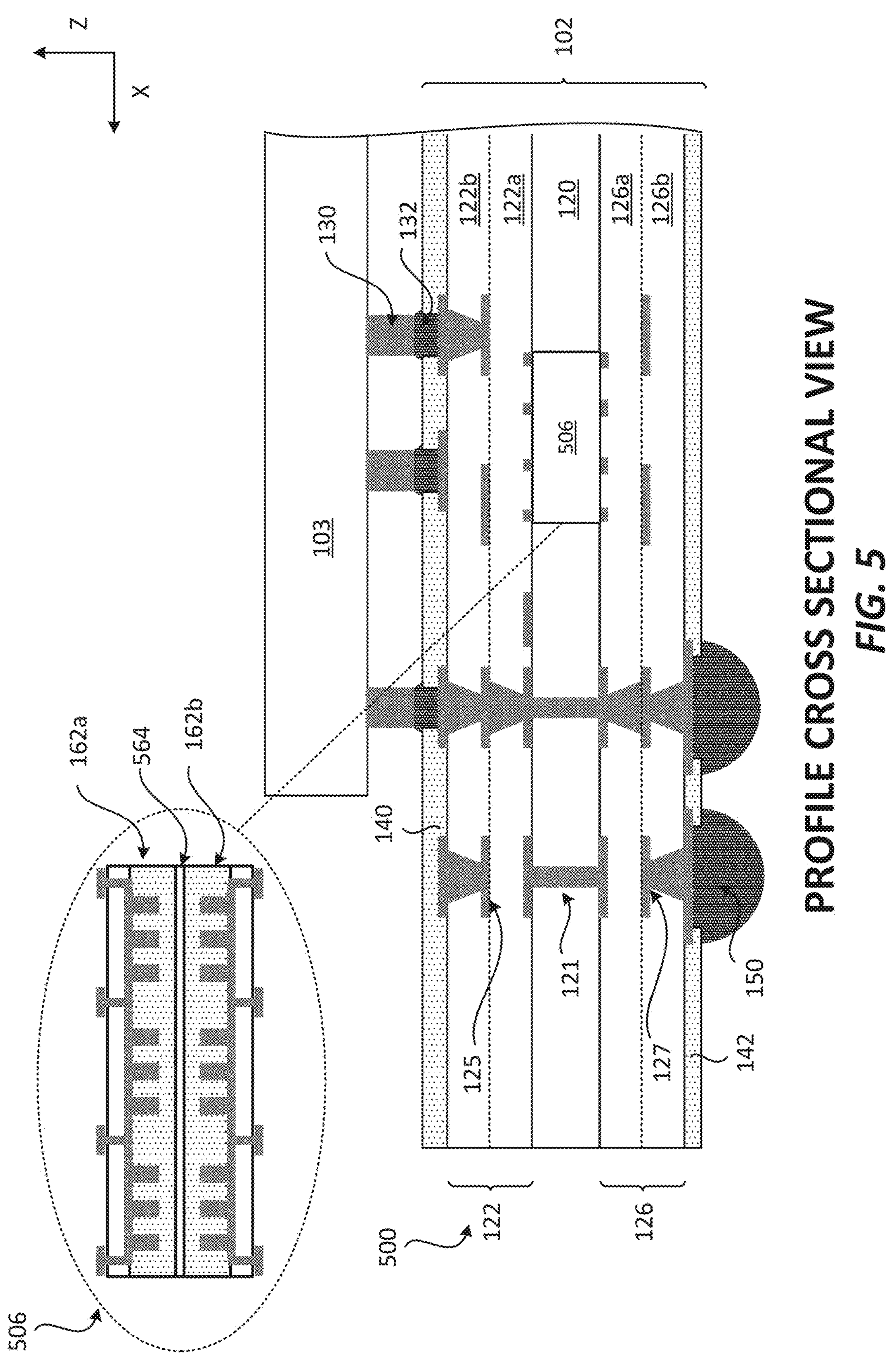
FIG. 5 illustrates a profile cross sectional view of a package that includes a substrate with a stacked capacitor structure.

FIG. 5 illustrates a profile cross sectional view of a package 500 that includes a substrate with embedded stacked trench capacitor devices. The package 500 includes the substrate 102 and the integrated device 103. The substrate 102 includes a core layer 120, at least one first dielectric layer 122, at least one second dielectric layer 126, a plurality of core interconnects 121, a first plurality of interconnects 125, a second plurality of interconnects 127, a solder resist layer 140, a solder resist layer 142, a plurality of solder interconnects 150, and a capacitor structure 506.

The package 500 is similar to the package 100, and thus include similar components as the package 100. Similarly, the package 500 may be arranged and/or configured in a similar manner as the package 100.

The capacitor structure 506 may be a stacked trench capacitor structure (e.g., means for stacked trench capacitance). As shown in FIG. 5, the capacitor structure 506 is located in the core layer 120 of the substrate 102. The capacitor structure 506 includes at least two trench capacitor devices. For example, the capacitor structure 506 includes a first trench capacitor device 162*a* and a second trench capacitor device 162*b*. The first trench capacitor device 162*a* is physically coupled to the second trench capacitor device 162*b* through an adhesive 564. Similarly, the second trench capacitor device 162*b* is coupled to the first trench capacitor device 162*a* an adhesive 564.

The first trench capacitor device 162*a* is located (e.g., located vertically) over the second trench capacitor device 162*b*. The first trench capacitor device 162*a* includes a first front side and a first back side. The second trench capacitor device 162*b* includes a second front side and a second back side. As shown in FIG. 5, the first back side of the first trench capacitor device 162*a* faces the second back side of the second trench capacitor device 162*b*. Thus, the first back side of the first trench capacitor device 162*a* may be physically coupled to the second back side of the second trench capacitor device 162*b*. The trench capacitor device 200 of FIG. 2 may illustrate a detailed example of the trench capacitor device 162*a* and/or the trench capacitor device 162*b*.

The core layer 120 includes a first surface (e.g., top surface) and a second surface (e.g., bottom surface). The plurality of core interconnects 121 is located in the core layer 120. The plurality of core interconnects 121 may include core via interconnects that extend through the entirety of the thickness of the core layer 120. For example, a core via interconnect may extend between the first surface and the second surface of the core layer 120. As mentioned above, the capacitor structure 506 is located in the core layer 120 of the substrate 102. The lateral side(s) of the capacitor structure 506 may be in direct contact with the core layer 120. Thus, for example, the lateral side(s) of the first trench capacitor device 162*a* and/or the lateral side(s) of the second trench capacitor device 162*b* may be in direct contact with the core layer 120. The capacitor structure 506 may have a thickness that is about the same, smaller or greater than the thickness of the core layer 120.

The integrated device 103 is coupled to the substrate 102 through a plurality of pillar interconnects 130 and/or a plurality of solder interconnects 132. For example, the integrated device 103 may be coupled to the first plurality of interconnects 125 of the substrate 102 through the plurality of pillar interconnects 130 and/or the plurality of solder interconnects 132. The integrated device 103 may be configured to be electrically coupled to the capacitor structure 506 (e.g., to the first trench capacitor device 162*a* and/or the second trench capacitor device 162*b*) through one or more electrical paths that include the plurality of pillar interconnects 130, the plurality of solder interconnects 132, the first plurality of interconnects 125, the plurality of core interconnects 121 and/or the second plurality of interconnects 127. In one example, the integrated device 103 may be configured to be electrically coupled to the first trench capacitor device 162*a* through one or more electrical paths that include the plurality of pillar interconnects 130, the plurality of solder interconnects 132 and the first plurality of interconnects 125. In another example, the integrated device 103 may be configured to be electrically coupled to the second trench capacitor device 162*b* through one or more electrical paths that include the plurality of pillar interconnects 130, the plurality of solder interconnects 132, the first plurality of interconnects 125, the plurality of core interconnects 121 and/or the second plurality of interconnects 127.

Figure 6:
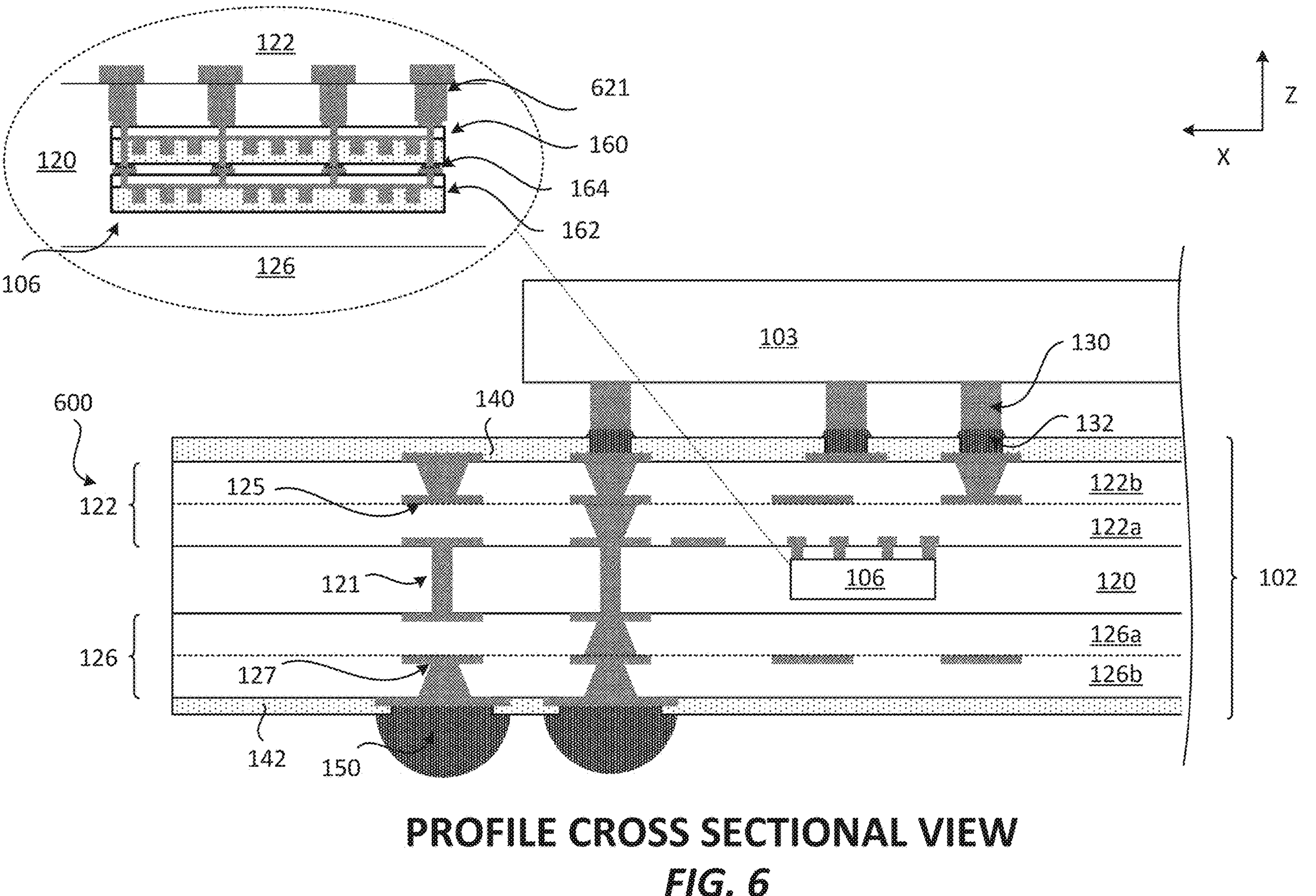
FIG. 6 illustrates a profile cross sectional view of a package that includes a substrate with a stacked capacitor structure.

FIG. 6 illustrates a profile cross sectional view of a package 600 that includes a substrate with embedded stacked trench capacitor devices. The package 600 includes the substrate 102 and the integrated device 103. The substrate 102 includes a core layer 120, at least one first dielectric layer 122, at least one second dielectric layer 126, a plurality of core interconnects 121, a plurality of core interconnects 621, a first plurality of interconnects 125, a second plurality of interconnects 127, a solder resist layer 140, a solder resist layer 142, a plurality of solder interconnects 150, and a capacitor structure 106.

The package 600 is similar to the package 100, and thus include similar components as the package 100. Similarly, the package 600 may be arranged and/or configured in a similar manner as the package 100. The capacitor structure 106 may have a thickness that is thinner (e.g., smaller) than the thickness of the core layer 120.

The capacitor structure 106 may be a stacked trench capacitor structure (e.g., means for stacked trench capacitance). As shown in FIG. 6, the capacitor structure 106 is located in the core layer 120 of the substrate 102. The capacitor structure 106 includes at least two trench capacitor devices. For example, the capacitor structure 106 includes a first trench capacitor device 160 and a second trench capacitor device 162. The first trench capacitor device 160 is coupled to the second trench capacitor device 162 through a plurality of solder interconnects 164. Similarly, the second trench capacitor device 162 is coupled to the first trench capacitor device 160 through a plurality of solder interconnects 164. As will be further described below, interconnects from the first trench capacitor device 160 may be coupled to interconnects from the second trench capacitor device 162 through the plurality of solder interconnects 164. As will be further described below, the first trench capacitor device 160 may be coupled to the second trench capacitor device 162 through copper to copper bonding.

The first trench capacitor device 160 is located (e.g., located vertically) over the second trench capacitor device 162. The first trench capacitor device 160 includes a first front side and a first back side. The second trench capacitor device 162 includes a second front side and a second back side. As shown in FIG. 6, the first back side of the first trench capacitor device 160 faces the second front side of the second trench capacitor device 162. Thus, the first back side of the first trench capacitor device 160 may be coupled (e.g., electrically coupled) to the second front side of the second trench capacitor device 162. However, in some implementations, the first front side of the first trench capacitor device 160 may be coupled (e.g., electrically coupled) to the second front side of the second trench capacitor device 162, such that the first front side of the first trench capacitor device 160 faces the second front side of the second trench capacitor device 162. In some implementations, the first back side of the first trench capacitor device 160 may be coupled (e.g., electrically coupled) to the second back side of the second trench capacitor device 162, such that the first back side of the first trench capacitor device 160 faces the second back side of the second trench capacitor device 162. In some implementations, the first front side of the first trench capacitor device 160 may be coupled (e.g., electrically coupled) to the second front side of the second trench capacitor device 162, such that the first front side of the first trench capacitor device 160 faces the second front side of the second trench capacitor device 162.

The core layer 120 includes a first surface (e.g., top surface) and a second surface (e.g., bottom surface). The plurality of core interconnects 121 is located in the core layer 120. The plurality of core interconnects 121 may include core via interconnects that extend through the entirety of the thickness of the core layer 120. For example, a core via interconnect may extend between the first surface and the second surface of the core layer 120. As mentioned above, the capacitor structure 106 is located in the core layer 120 of the substrate 102. The lateral side(s) of the capacitor structure 106 may be in direct contact with the core layer 120. Thus, for example, the lateral side(s) of the first trench capacitor device 160 and/or the lateral side(s) of the second trench capacitor device 162 may be in direct contact with the core layer 120.

As mentioned above, the capacitor structure 106 may have a thickness that is thinner (e.g., smaller) than the thickness of the core layer 120. The plurality of core interconnects 621 may also be located in the core layer 120. The plurality of core interconnects 621 may extend between the capacitor structure 106 and the first surface of the core layer 120. The plurality of core interconnects 621 are configured to be coupled to the capacitor structure 106 and the second plurality of interconnects 125. For example, the plurality of core interconnects 621 are configured to be coupled to the first trench capacitor device 160 and the first plurality of interconnects 125. The plurality of core interconnects 621 are configured to be coupled to the second trench capacitor device 162 through the first trench capacitor device 160 and/or the plurality of solder interconnects 164. The plurality of core interconnects 621 extend partially through the thickness of the core layer 120.

The integrated device 103 is coupled to the substrate 102 through a plurality of pillar interconnects 130 and/or a plurality of solder interconnects 132. For example, the integrated device 103 may be coupled to the first plurality of interconnects 125 of the substrate 102 through the plurality of pillar interconnects 130 and/or the plurality of solder interconnects 132. The integrated device 103 may be configured to be electrically coupled to the capacitor structure 106 (e.g., to the first trench capacitor device 160 and/or the second trench capacitor device 162) through one or more electrical paths that include the plurality of pillar interconnects 130, the plurality of solder interconnects 132, the first plurality of interconnects 125, the plurality of core interconnects 121, the second plurality of interconnects 127, and/or the plurality of core interconnects 621.

Figure 7:
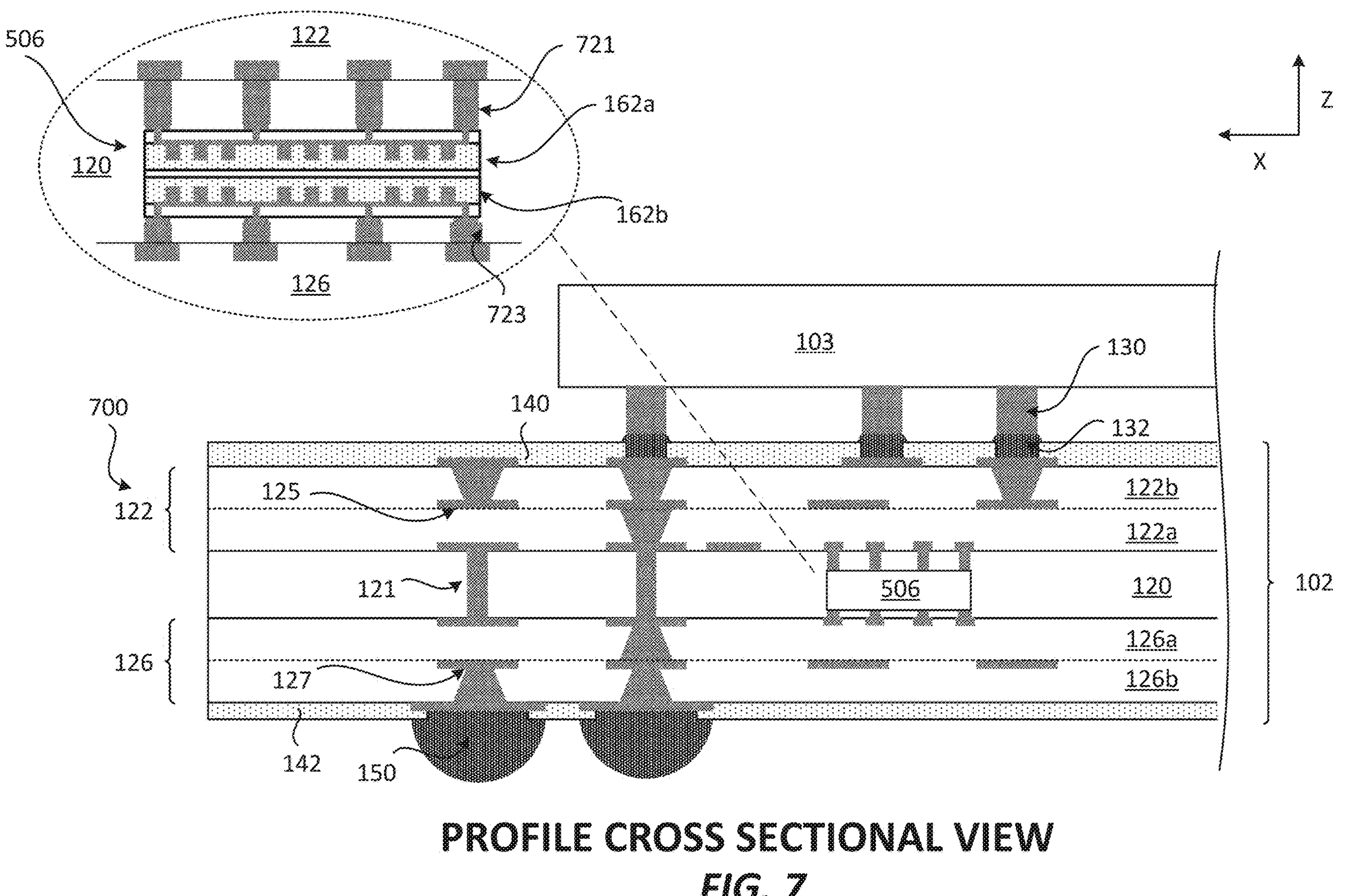
FIG. 7 illustrates a profile cross sectional view of a package that includes a substrate with a stacked capacitor structure.

FIG. 7 illustrates a profile cross sectional view of a package 700 that includes a substrate with embedded stacked trench capacitor devices. The package 700 includes the substrate 102 and the integrated device 103. The substrate 102 includes a core layer 120, at least one first dielectric layer 122, at least one second dielectric layer 126, a plurality of core interconnects 121, a plurality of core interconnects 721, a plurality of core interconnects 723, a first plurality of interconnects 125, a second plurality of interconnects 127, a solder resist layer 140, a solder resist layer 142, a plurality of solder interconnects 150, and a capacitor structure 506.

The package 700 is similar to the package 100, and thus include similar components as the package 100. Similarly, the package 700 may be arranged and/or configured in a similar manner as the package 100. The capacitor structure 506 may have a thickness that is thinner (e.g., smaller) than the thickness of the core layer 120.

The capacitor structure 506 may be a stacked trench capacitor structure (e.g., means for stacked trench capacitance). As shown in FIG. 7, the capacitor structure 506 is located in the core layer 120 of the substrate 102. The capacitor structure 506 includes at least two trench capacitor devices. For example, the capacitor structure 506 includes a first trench capacitor device **162*a* and a second trench capacitor device 162***b*. The first trench capacitor device 162*a* is coupled to the second trench capacitor device 162*b*.

The first trench capacitor device 162*a* is located (e.g., located vertically) over the second trench capacitor device 162*b*. The first trench capacitor device 162*a* includes a first front side and a first back side. The second trench capacitor device 162*b* includes a second front side and a second back side. As shown in FIG. 7, the first back side of the first trench capacitor device 162*a* faces the second back side of the second trench capacitor device 162*b*.

The core layer 120 includes a first surface (e.g., top surface) and a second surface (e.g., bottom surface). The plurality of core interconnects 121 is located in the core layer 120. The plurality of core interconnects 121 may include core via interconnects that extend through the entirety of the thickness of the core layer 120. For example, a core via interconnect may extend between the first surface and the second surface of the core layer 120. As mentioned above, the capacitor structure 506 is located in the core layer 120 of the substrate 102. The lateral side(s) of the capacitor structure 506 may be in direct contact with the core layer 120. Thus, for example, the lateral side(s) of the first trench capacitor device 162*a* and/or the lateral side(s) of the second trench capacitor device 162*b* may be in direct contact with the core layer 120.

As mentioned above, the capacitor structure 506 may have a thickness that is thinner (e.g., smaller) than the thickness of the core layer 120. The plurality of core interconnects 723 may also be located in the core layer 120. The plurality of core interconnects 723 may extend between the capacitor structure 506 and the second surface of the core layer 120. The plurality of core interconnects 723 are configured to be coupled to the capacitor structure 506 and the second plurality of interconnects 127. For example, the plurality of core interconnects 723 are configured to be coupled to the second trench capacitor device 160*b* and the second plurality of interconnects 127. The plurality of core interconnects 723 extend partially through the thickness of the core layer 120.

The plurality of core interconnects 721 may also be located in the core layer 120. The plurality of core interconnects 721 may extend between the capacitor structure 506 and the first surface of the core layer 120. The plurality of core interconnects 721 are configured to be coupled to the capacitor structure 506 and the first plurality of interconnects 125. For example, the plurality of core interconnects 721 are configured to be coupled to the first trench capacitor device 162*a* and the first plurality of interconnects 125. The plurality of core interconnects 721 extend partially through the thickness of the core layer 120.

The integrated device 103 is coupled to the substrate 102 through a plurality of pillar interconnects 130 and/or a plurality of solder interconnects 132. For example, the integrated device 103 may be coupled to the first plurality of interconnects 125 of the substrate 102 through the plurality of pillar interconnects 130 and/or the plurality of solder interconnects 132. The integrated device 103 may be configured to be electrically coupled to the capacitor structure 506 (e.g., to the first trench capacitor device 162*a* and/or the second trench capacitor device 162*b*) through one or more electrical paths that include the plurality of pillar interconnects 130, the plurality of solder interconnects 132, the first plurality of interconnects 125, the plurality of core interconnects 121, the second plurality of interconnects 127, the plurality of core interconnects 723, and/or the plurality of core interconnects 721.

In one example, the integrated device 103 may be configured to be electrically coupled to the first trench capacitor device 162*a* through one or more electrical paths that include the plurality of pillar interconnects 130, the plurality of solder interconnects 132, the first plurality of interconnects 125, and/or the plurality of core interconnects 721.

In another example, the integrated device 103 may be configured to be electrically coupled to the second trench capacitor device 162*b* through one or more electrical paths that include the plurality of pillar interconnects 130, the plurality of solder interconnects 132, the first plurality of interconnects 125, the plurality of core interconnects 121, the second plurality of interconnects 127, and/or the plurality of core interconnects 723.

Figure 8:
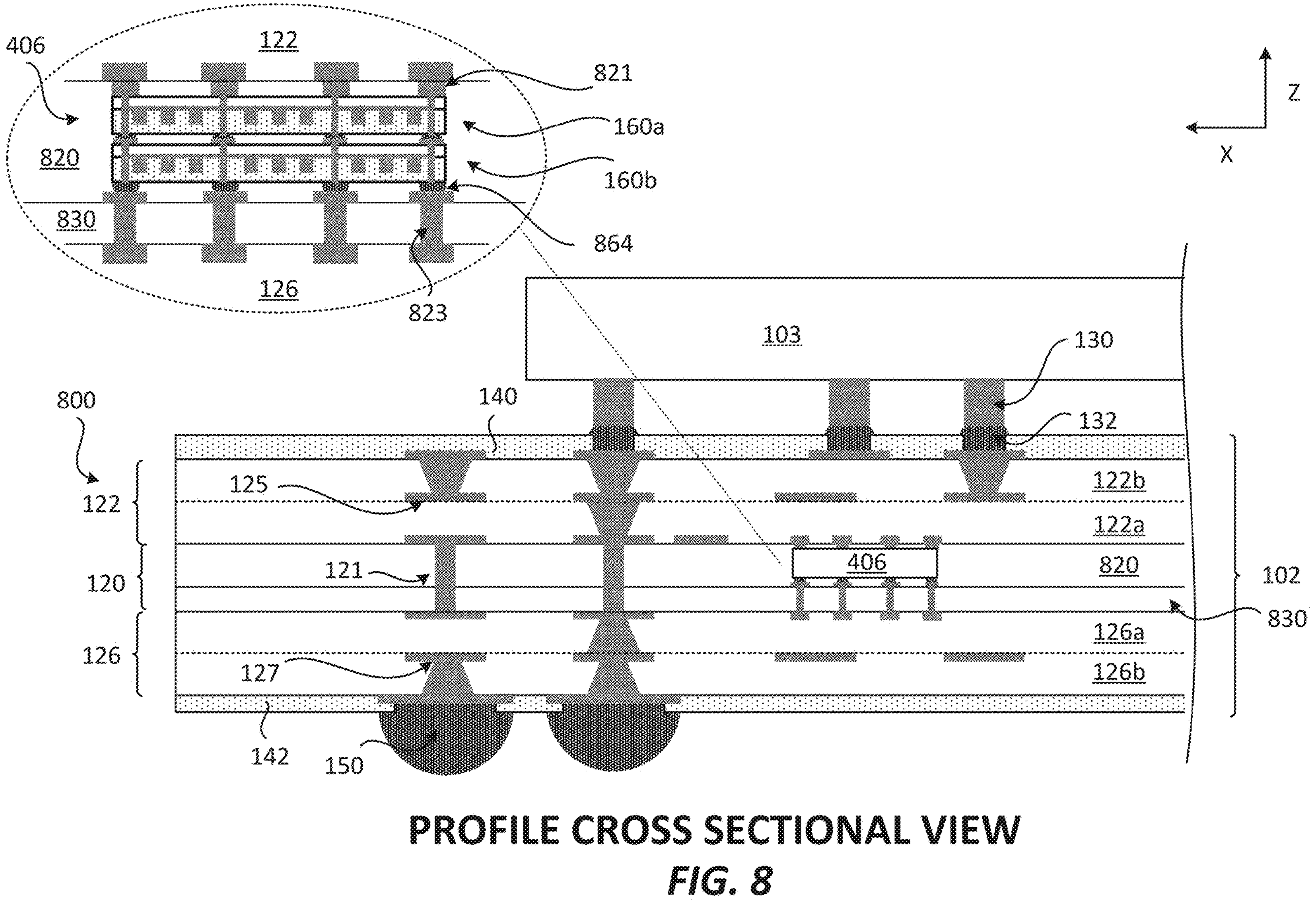
FIG. 8 illustrates a profile cross sectional view of a package that includes a substrate with a stacked capacitor structure.

FIG. 8 illustrates a profile cross sectional view of a package 800 that includes a substrate with embedded stacked trench capacitor devices. The package 800 includes the substrate 102 and the integrated device 103. The substrate 102 includes a core layer 120, at least one first dielectric layer 122, at least one second dielectric layer 126, a plurality of core interconnects 121, a plurality of core interconnects 821, a plurality of solder interconnects 864, a first plurality of interconnects 125, a second plurality of interconnects 127, a solder resist layer 140, a solder resist layer 142, a plurality of solder interconnects 150, and a capacitor structure 406.

The package 800 is similar to the package 100, and thus include similar components as the package 100. Similarly, the package 800 may be arranged and/or configured in a similar manner as the package 100. The capacitor structure 406 may have a thickness that is thinner (e.g., smaller) than the thickness of the core layer 120.

The capacitor structure 406 may be a stacked trench capacitor structure (e.g., means for stacked trench capacitance). As shown in FIG. 8, the capacitor structure 406 is located in the core layer 120 of the substrate 102. The capacitor structure 406 includes at least two trench capacitor devices. For example, the capacitor structure 406 includes a first trench capacitor device 160*a* and a second trench capacitor device 160*b*. The first trench capacitor device 160*a* is coupled to the second trench capacitor device 160*b*.

The first trench capacitor device 160*a* is located (e.g., located vertically) over the second trench capacitor device 160*b*. The first trench capacitor device 160*a* includes a first front side and a first back side. The second trench capacitor device 160*b* includes a second front side and a second back side. As shown in FIG. 8, the first back side of the first trench capacitor device 160*a* faces the second front side of the second trench capacitor device 160*b*.

The core layer 120 includes a first surface (e.g., top surface) and a second surface (e.g., bottom surface). The core layer 120 includes two core dielectric layers, a first core dielectric layer 820 and a second core dielectric layer 830. The first core dielectric layer 820 and the second core dielectric layer 830 may include the same material or different materials. The plurality of core interconnects 121 is located in the core layer 120. The plurality of core interconnects 121 may include core via interconnects that extend through the entirety of the thickness of the core layer 120 (e.g., through the first core dielectric layer 820 and the second core dielectric layer 830). For example, a core via interconnect may extend between the first surface and the second surface of the core layer 120. As mentioned above, the capacitor structure 406 is located in the core layer 120 of the substrate 102. The capacitor structure 406 may be located in the first core dielectric layer 820. The lateral side(s) of the capacitor structure 406 may be in direct contact with the core layer 120 (e.g., direct contact with the first core dielectric layer 820). Thus, for example, the lateral side(s) of the first trench capacitor device 160*a* and/or the lateral side(s) of the second trench capacitor device 160*b* may be in direct contact with the core layer 120 (e.g., direct contact with the first core dielectric layer 820).

As mentioned above, the capacitor structure 406 may have a thickness that is thinner (e.g., smaller) than the thickness of the core layer 120. The plurality of core interconnects 821 may also be located in the first core dielectric layer 820 of the core layer 120. The plurality of core interconnects 821 may extend between the capacitor structure 406 and the first surface of the core layer 120. The plurality of core interconnects 821 are configured to be coupled to the capacitor structure 406 and the first plurality of interconnects 125. For example, the plurality of core interconnects 821 are configured to be coupled to the first trench capacitor device 160*a* and the first plurality of interconnects 125. The plurality of core interconnects 821 extend partially through the thickness of the first core dielectric layer 820 of the core layer 120.

The plurality of core interconnects 823 may also be located in the first core dielectric layer 820 and/or the second core dielectric layer 830 of the core layer 120. The plurality of core interconnects 823 may extend between the capacitor structure 406 and the second surface of the core layer 120. The plurality of core interconnects 823 are configured to be coupled to the capacitor structure 406 and the second plurality of interconnects 127. For example, the plurality of core interconnects 823 are configured to be coupled to the second trench capacitor device 160*b* and the second plurality of interconnects 127. The plurality of core interconnects 823 is configured to be coupled to the second trench capacitor device 160*b* through the plurality of solder interconnects 864. The plurality of core interconnects 823 extend through the thickness of the second core dielectric layer 830 of the core layer 120.

Figure 9:
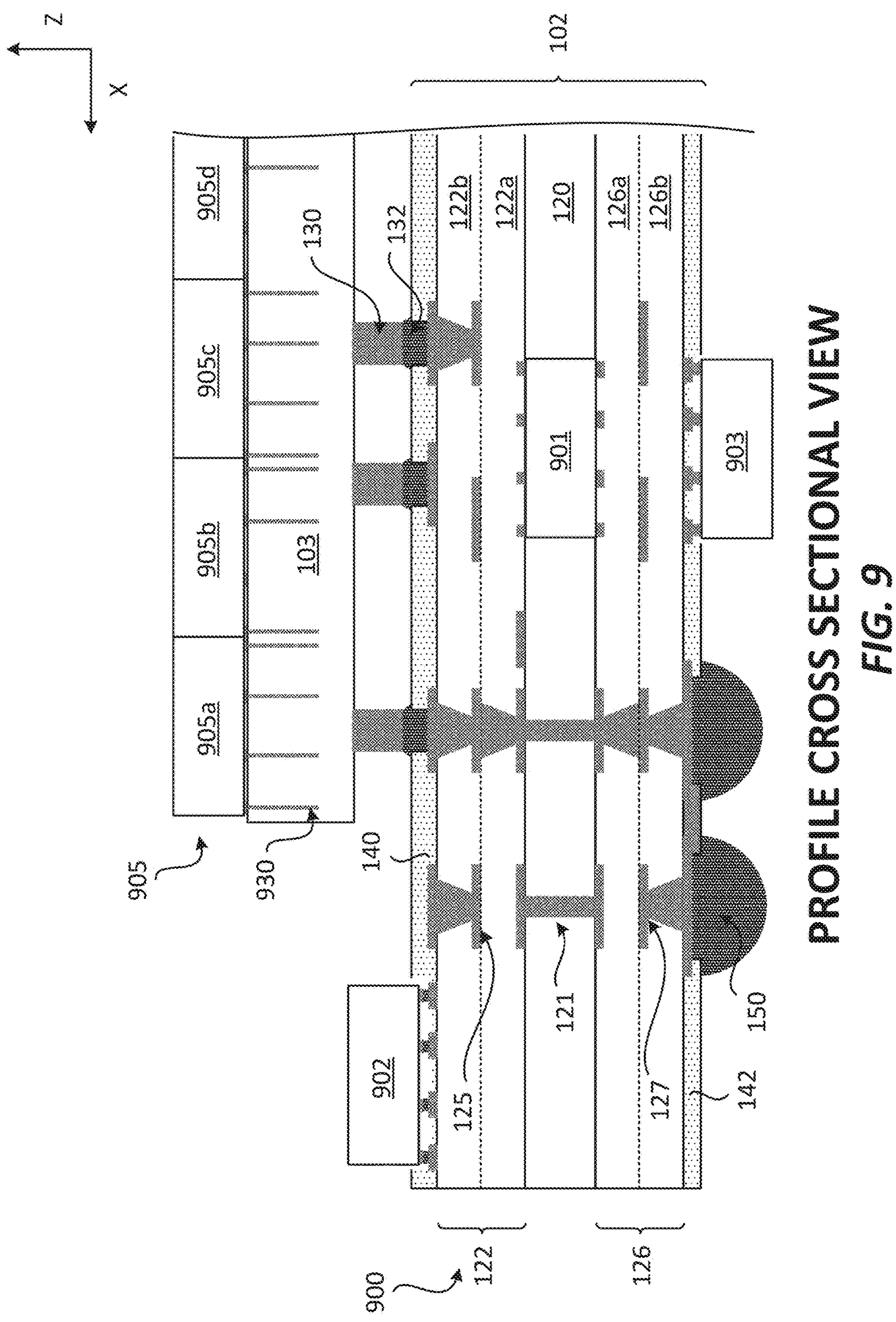
FIG. 9 illustrates a profile cross sectional view of a package that includes a substrate with a stacked capacitor structure.

FIG. 9 illustrates a package 900. The package 900 includes the substrate 102, the integrated device 103, a capacitor structure 901, a capacitor structure 902, a capacitor structure 903 and a capacitor structure 905. The capacitor structure 901, the capacitor structure 902, the capacitor structure 903 and the capacitor structure 905 may represent any of the capacitor structures described in the disclosure, including the capacitor structure 106, the capacitor structure 406 and/or the capacitor structure 506.

FIG. 9 illustrates that a capacitor structure may be (i) located in a substrate, (ii) coupled to a first surface and/or a second surface of a substrate, and/or (iii) coupled to a back side of an integrated device.

The capacitor structure 901 is located in the core layer 120. The capacitor structure 902 is coupled to a first surface (e.g., top surface) of the substrate 102. The capacitor structure 903 is coupled to a second surface (e.g., bottom surface) of the substrate 102. The capacitor structure 905 is coupled to a back side of the integrated device 103. The capacitor structure 905 may include a plurality of capacitor structures (e.g., 905*a*, 905*b*, 905*c*, 905*d*) located laterally to each other. The capacitor structure 905 may be coupled to the back side of the integrated device 103 through a plurality of solder interconnects (not shown). The capacitor structure 905 may be configured to be electrically coupled to the integrated device 103 through a plurality of through substrate vias 930 of the integrated device 103.

FIG. 9 illustrates one example of how the capacitor structure 901 is embedded in the core layer 120. However, the capacitor structure 901 may be located in the core layer 120 in a manner that is similar to how other capacitor structures (e.g., 106, 406, 506) are located in the core layer 120 as described in at least FIGS. 1 and 4-8.

Figure 10:
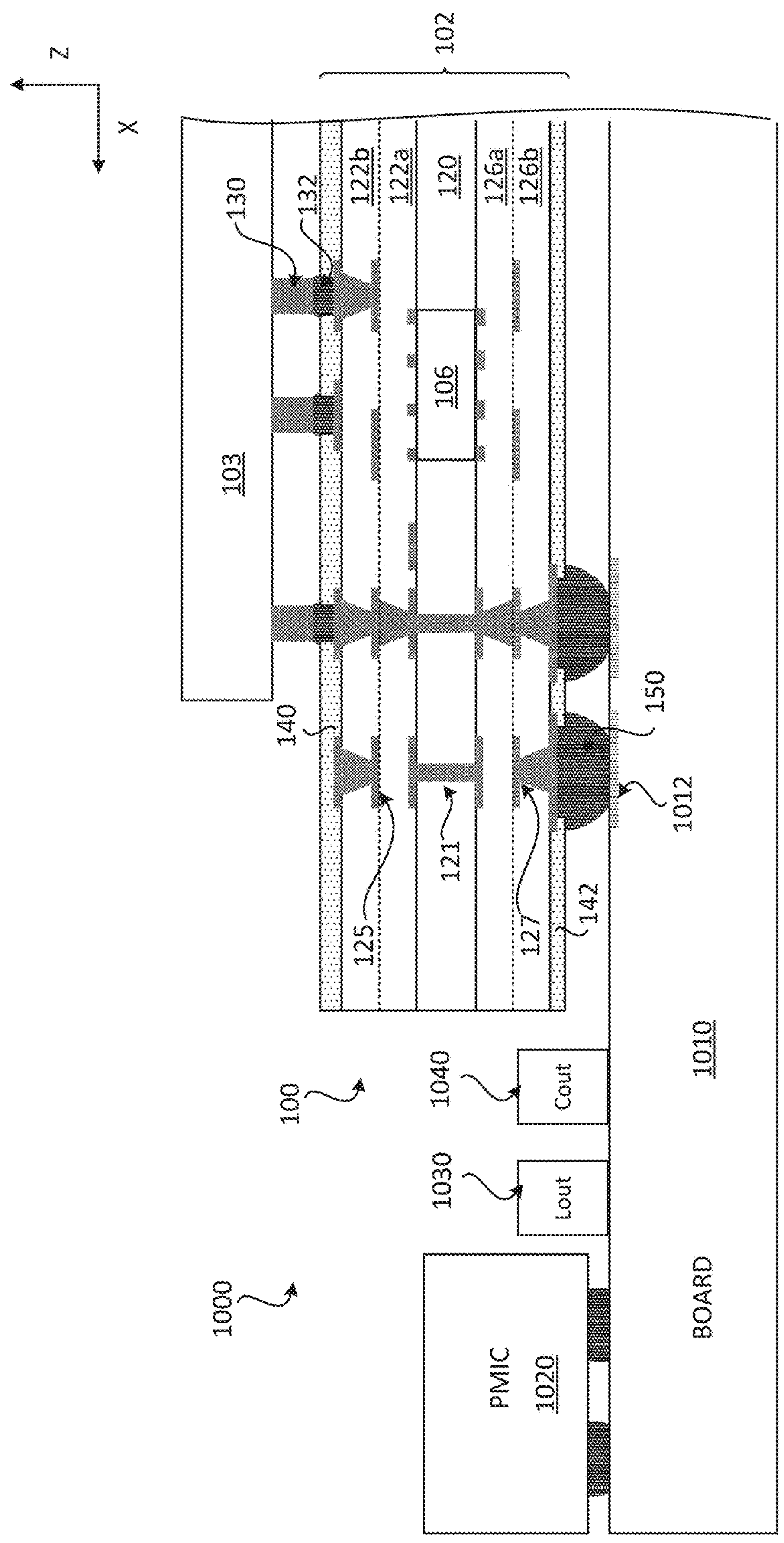
FIG. 10 illustrates a profile cross sectional view of a package that includes a substrate with a stacked capacitor structure.

FIG. 10 illustrates a device 1000 that includes the package 100, a board 1010, an integrated device 1020, an inductor 1030 and a capacitor 1040. The package 100 includes the substrate 102, the integrated device 103 and the capacitor structure 106. The package 100 is coupled to a first surface (e.g., top surface) of the board 1010 through a plurality of solder interconnects 150. For example, the package 100 is coupled to a plurality of board interconnects 1012 of the board 1010 through a plurality of solder interconnects 150. The integrated device 1020 is coupled to a first surface of the board 1010. The integrated device 1020 may include a power management integrated circuit (PMIC). The inductor 1030 is coupled to the first surface of the board 1010. The inductor 1030 may include a discrete inductor device. The capacitor 1040 is coupled to the first surface of the board 1010. The capacitor 1040 may include a discrete capacitor device. Although not shown, other components and/or other capacitors (e.g., input capacitors) may be coupled to the board 1010. The integrated device 1020, the inductor 1030 and the capacitor 1040 may be part of a power distribution network (PDN) that is configured to be coupled (e.g., electrically coupled) to the integrated device 103 through the board 1010 and/or the substrate 102. One or more of the capacitors may be a decoupling capacitor. In some implementations, the capacitor structure 106 may also be part of the power distribution network for the integrated device 103. Other packages (e.g., 400, 500, 600, 700, 800, 900) described in the disclosure may be implemented instead and/or in addition to the package 100 of FIG. 10.

Figure 11:
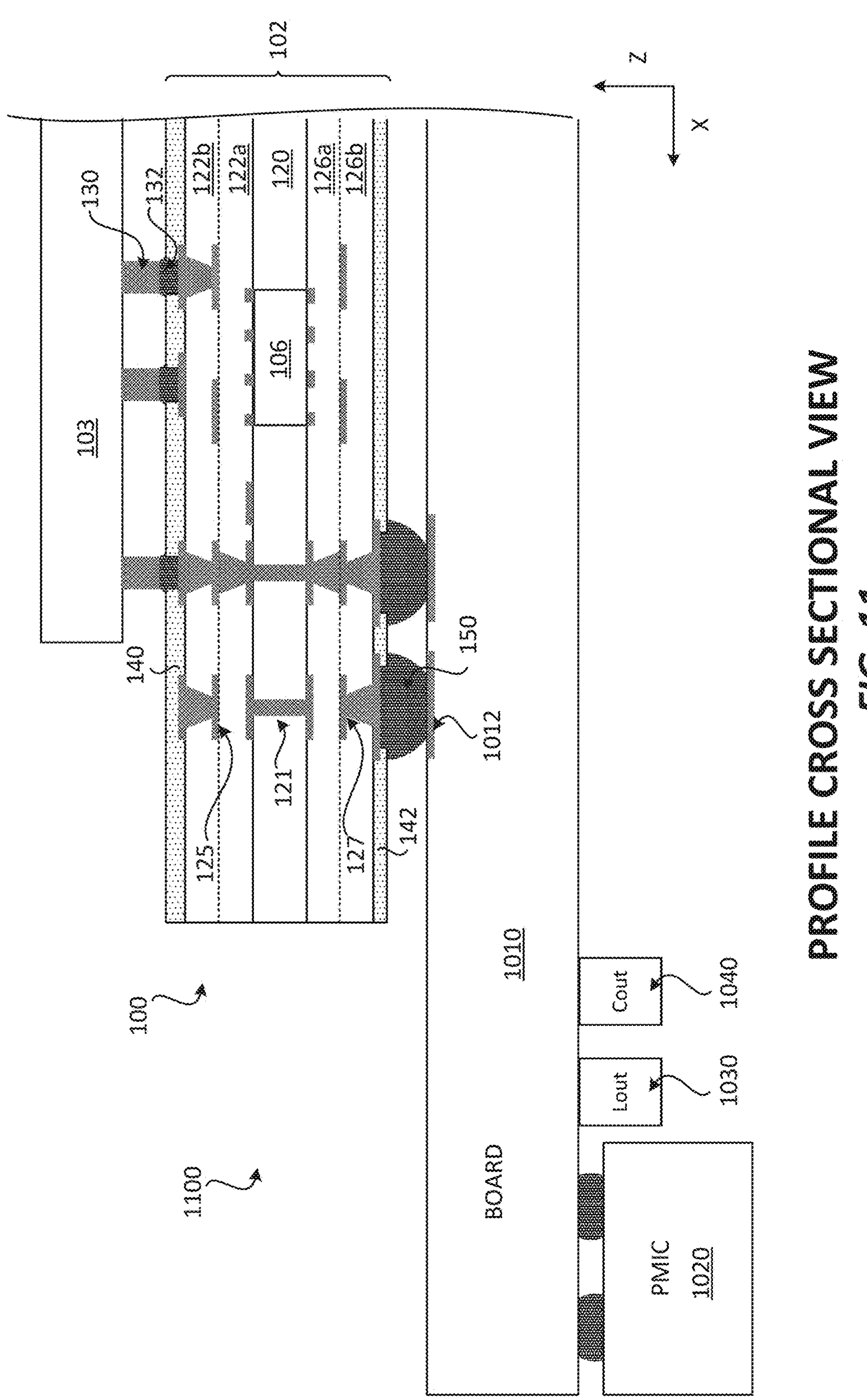
FIG. 11 illustrates a profile cross sectional view of a package that includes a substrate with a stacked capacitor structure.

FIG. 11 illustrates a device 1100 that includes the package 100, a board 1010, an integrated device 1020, an inductor 1030 and a capacitor 1040. The package 100 includes the substrate 102, the integrated device 103 and the capacitor structure 106. The package 100 is coupled to a first surface (e.g., top surface) of the board 1010 through a plurality of solder interconnects 150. For example, the package 100 is coupled to a plurality of board interconnects 1012 of the board 1010 through a plurality of solder interconnects 150. The integrated device 1020 is coupled to a second surface (e.g., bottom surface) of the board 1010. The integrated device 1020 may include a power management integrated circuit (PMIC). The inductor 1030 is coupled to the second surface of the board 1010. The inductor 1030 may include a discrete inductor device. The capacitor 1040 is coupled to the second surface of the board 1010. The capacitor 1040 may include a discrete capacitor device. Although not shown, other components and/or other capacitors (e.g., input capacitors) may be coupled to the board 1010. The integrated device 1020, the inductor 1030 and the capacitor 1040 may be part of a power distribution network (PDN) that is configured to be coupled (e.g., electrically coupled) to the integrated device 103 through the board 1010 and/or the substrate 102. One or more of the capacitors may be a decoupling capacitor. In some implementations, the capacitor structure 106 may also be part of the power distribution network for the integrated device 103. Other packages (e.g., 400, 500, 600, 700, 800, 900) described in the disclosure may be implemented instead and/or in addition to the package 100 of FIG. 10.

Figure 12:
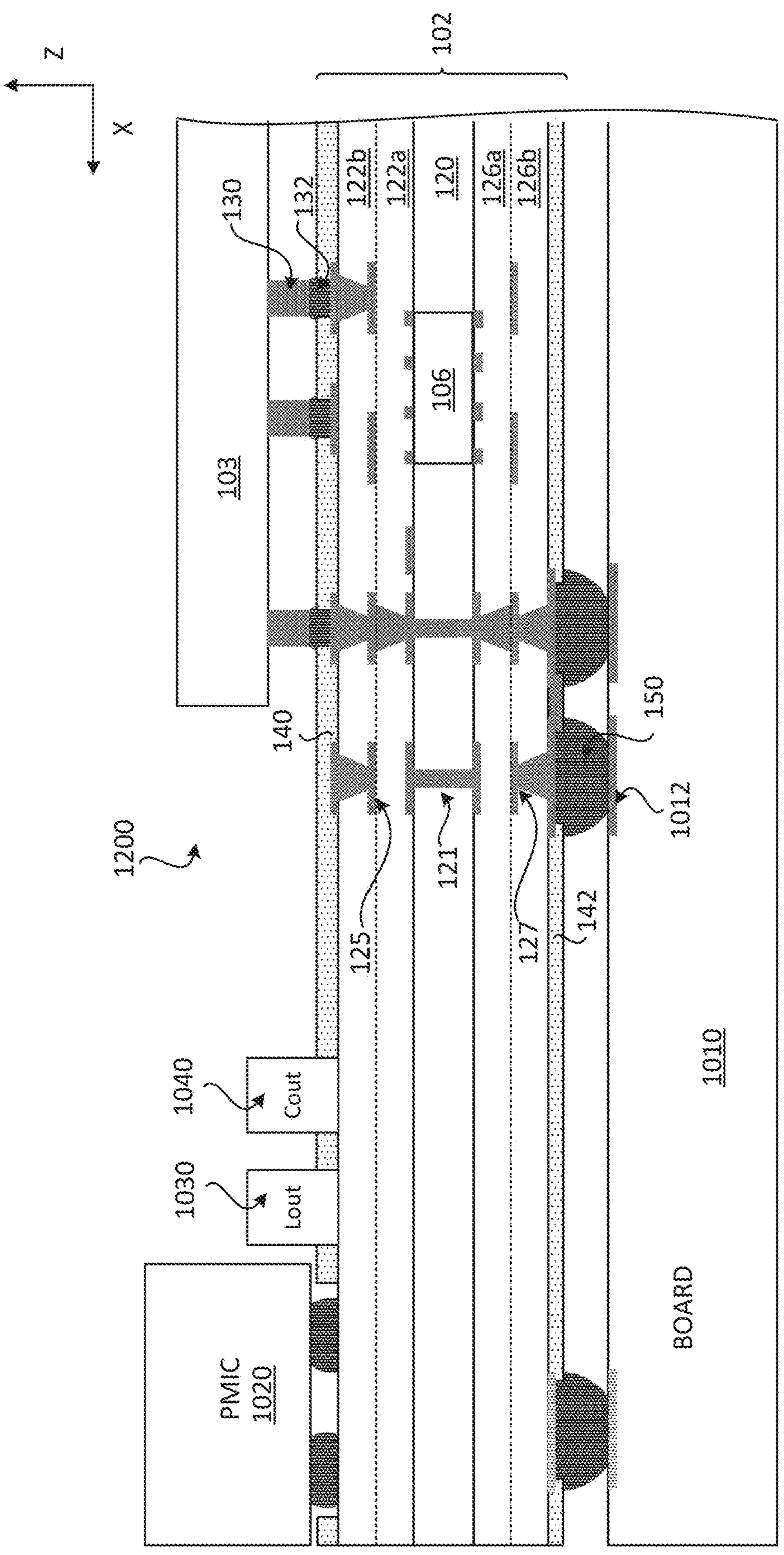
FIG. 12 illustrates a profile cross sectional view of a package that includes a substrate with a stacked capacitor structure.

FIG. 12 illustrates a package 1200 that includes a substrate 102, an integrated device 103, an integrated device 1020, an inductor 1030 and a capacitor 1040. The package 1200 is coupled to a first surface (e.g., top surface) of the board 1010 through a plurality of solder interconnects 150.

For example, the package 1200 is coupled to a plurality of board interconnects 1012 of the board 1010 through a plurality of solder interconnects 150. The integrated device 1020 is coupled to a first surface (e.g., top surface) of the substrate 102. The integrated device 1020 may include a power management integrated circuit (PMIC). The inductor 1030 is coupled to the first surface of the substrate 102. The inductor 1030 may include a discrete inductor device. The capacitor 1040 is coupled to the first surface of the substrate 102. The capacitor 1040 may include a discrete capacitor device. Although not shown, other components and/or other capacitors (e.g., input capacitors) may be coupled to the board 1010. The integrated device 1020, the inductor 1030 and the capacitor 1040 may be part of a power distribution network (PDN) that is configured to be coupled (e.g., electrically coupled) to the integrated device 103 through the substrate 102. One or more of the capacitors may be a decoupling capacitor. In some implementations, the capacitor structure 106 may also be part of the power distribution network for the integrated device 103. Other packages (e.g., 400, 500, 600, 700, 800, 900) described in the disclosure may include the integrated device 1020, the inductor 1030 and/or the capacitor 1040.

FIGS. 1 and 4-12 illustrate examples of possible locations for one or more capacitor structures that include vertically stacked trench capacitor devices. It is noted that the various configurations of components that are shown in FIGS. 1 and 4-12 may be combined and/or interchanged with one another. For example, a capacitor structure that is located in a substrate in a particular configuration of a particular figure of the disclosure, may be implemented in a substrate described in another figure of the disclosure. The disclosure illustrates a capacitor structure with two stacked trench capacitor devices. However, a capacitor structure (e.g., 106, 406, 506) may include more than two stacked trench capacitor devices. In some implementations, the core layer of a substrate may include a different material than the material of the dielectric layers that are formed on either side of the core layer. In some implementations, the core layer of a substrate may include the same materials as the dielectric layers that are formed on both side of the core layer. FIGS. 1 and 4-12 illustrate capacitor structure(s) implemented with a cored substrate. However, the capacitor structure(s) described in the disclosure may be implemented in a coreless substrate. Thus, the capacitor structure(s) described in the disclosure may be implemented in the dielectric layer(s) of a coreless substrate. An example of a coreless substrate includes an embedded trace substrate (ETS). When a coreless substrate is used, a cavity may be formed in the coreless substrate to accommodate the capacitor structure(s). In some implementations, the coreless substrate may be fabricated by forming dielectric layer(s) around the capacitor structure(s). A coreless substrate may be fabricated by forming dielectric layers and interconnects over a carrier instead of a core layer, and decoupling the carrier from the dielectric layers and interconnects once the coreless substrate is fabricated.

An integrated device (e.g., 103) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. A chiplet may be fabricated using a process that provides better yields compared to other processes used to fabricate other types of integrated devices, which can lower the overall cost of fabricating a chiplet. For example, a chiplet may use a different technology node than that of another chiplet and/or another integrated device. A technology node (e.g., 5 nm, 7 nm, 10 nm) may specify the minimum size of the features of gates of transistors of an integrated device and/or a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package.

The package (e.g., 100, 400, 500, 600, 700, 800, 900, 1200) may be implemented in a radio frequency (RF) package. The RF package may be a radio frequency front end (RFFE) package. A package (e.g., 100, 200) may be configured to provide Wireless Fidelity (WiFi) communication and/or cellular communication (e.g., 2G, 3G, 4G, 5G). The packages (e.g., 100, 400, 500, 600, 700, 800, 900, 1200) may be configured to support Global System for Mobile (GSM) Communications, Universal Mobile Telecommunications System (UMTS), and/or Long-Term Evolution (LTE). The packages (e.g., 100, 400, 500, 600, 700, 800, 900, 1200) may be configured to transmit and receive signals having different frequencies and/or communication protocols.

Having described various a trench capacitor device and substrates with stacked trench capacitor devices, sequences and methods for fabricating substrates with stacked trench capacitor devices will now be described below.

Exemplary Sequence for Fabricating a Trench Capacitor Device

FIGS. 13A-13F illustrate an exemplary sequence for providing or fabricating a trench capacitor device. In some implementations, the sequence of FIGS. 13A-13F may be used to provide or fabricate the trench capacitor device 300 of FIG. 3, or any of the trench capacitor devices described in the disclosure.

It should be noted that the sequence of FIGS. 13A-13F may combine one or more stages in order to simplify and/or clarify the sequence for providing or fabricating the trench capacitor device that includes a plurality of trench capacitors. In some implementations, the order of the processes may be changed or modified. In some implementations, one or more of processes may be replaced or substituted without departing from the spirit of the disclosure. However, different implementations may fabricate a capacitor structure differently.

Figure 13A:
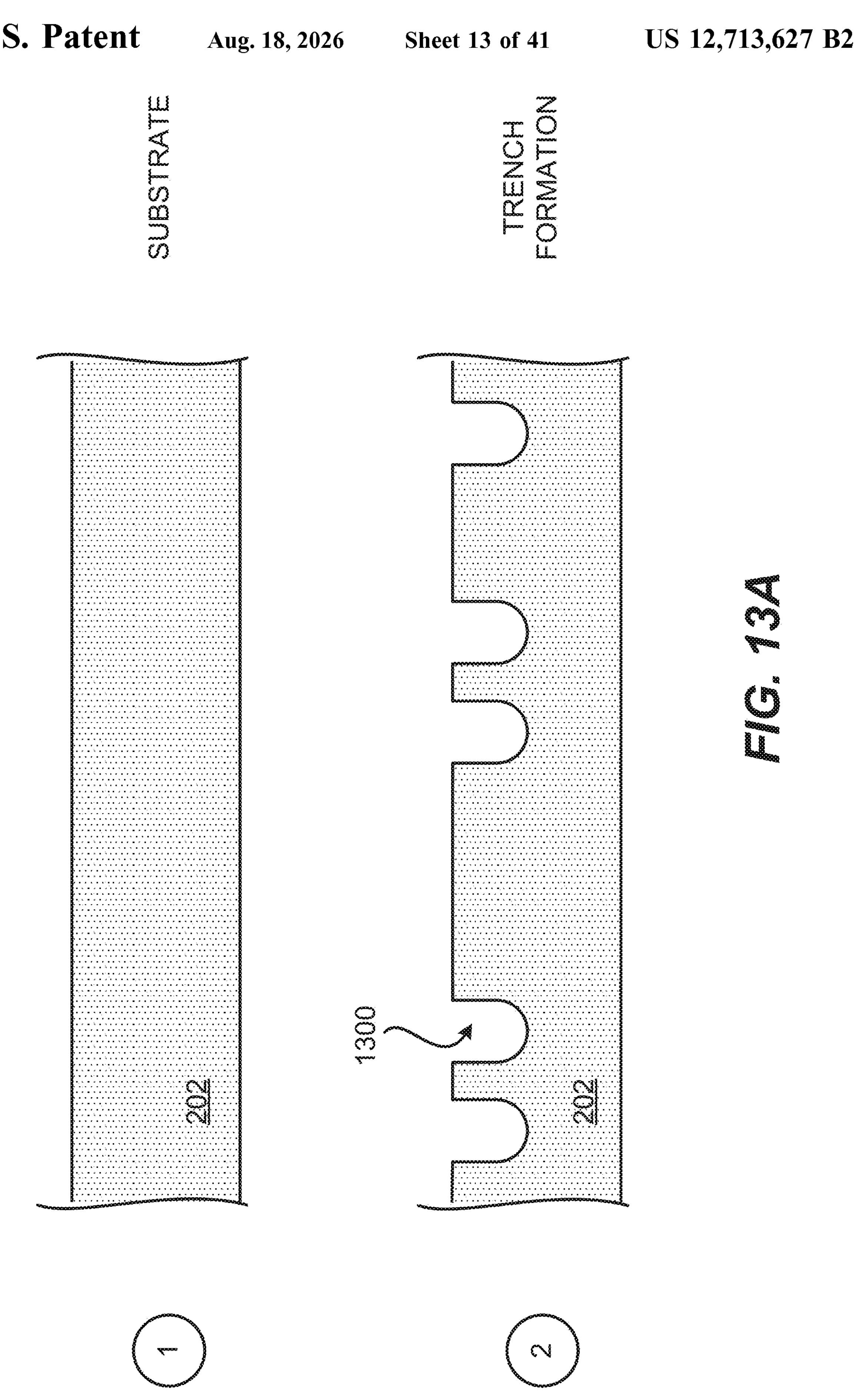

Stage 1, as shown in FIG. 13A, illustrates a state after a die substrate 202 is provided. The die substrate 202 may be part of a wafer. The die substrate 202 may include silicon (Si).

Stage 2 illustrates a state after a plurality of trenches 1300 are formed in the die substrate 202. In particular, the plurality of trenches 1300 (e.g., first trench, second trench, third trench) are formed through a first surface of the die substrate 202. Different implementations may form the trench differently. An etching process (e.g., chemical etching, mechanical etching) and/or a laser process may be used to form the trenches.

Figure 13B:
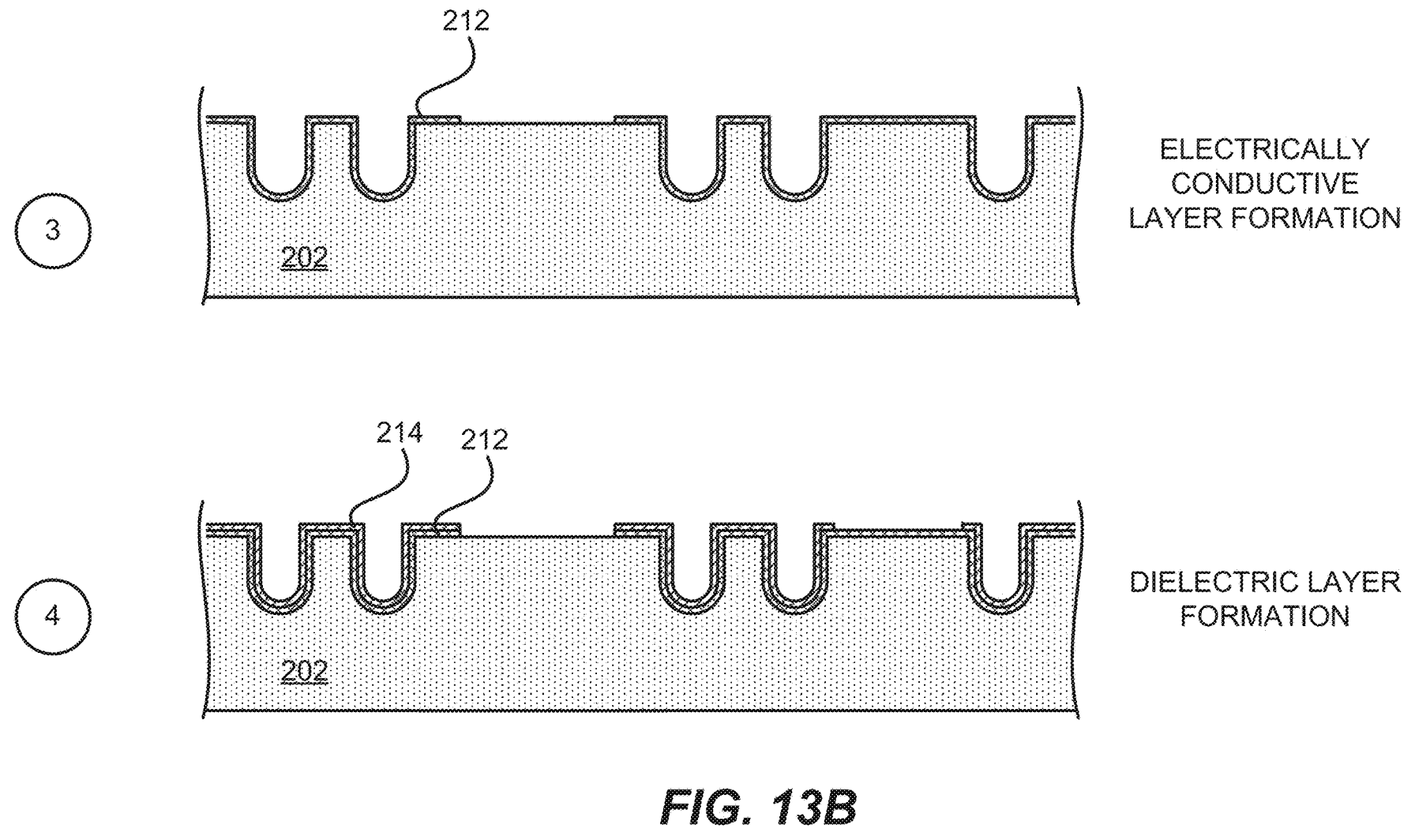

Stage 3, as shown in FIG. 13B, illustrates a state after a first electrically conductive layer 212 is formed (e.g., disposed) over the first surface of the die substrate 202 and/or in the trenches 1300 of the die substrate 202. A deposition process (e.g., chemical vapor deposition) may be used to form the first electrically conductive layer 212. In some implementations, the first electrically conductive layer 212 may include N+ silicon. Other implementations may use different materials and/or different combinations of materials as the first electrically conductive layer 212.

Stage 4 illustrates a state after the dielectric layer 214 is formed over the first electrically conductive layer 212. A deposition process may be used to form the dielectric layer 214 over the first electrically conductive layer 212. The dielectric layer 214 may be touching the first electrically conductive layer 212. At least a portion of the dielectric layer 214 may be formed in the plurality of trenches 1300. Some portions of the dielectric layer 214 may be located over the first surface of the die substrate 202.

Figure 13C:
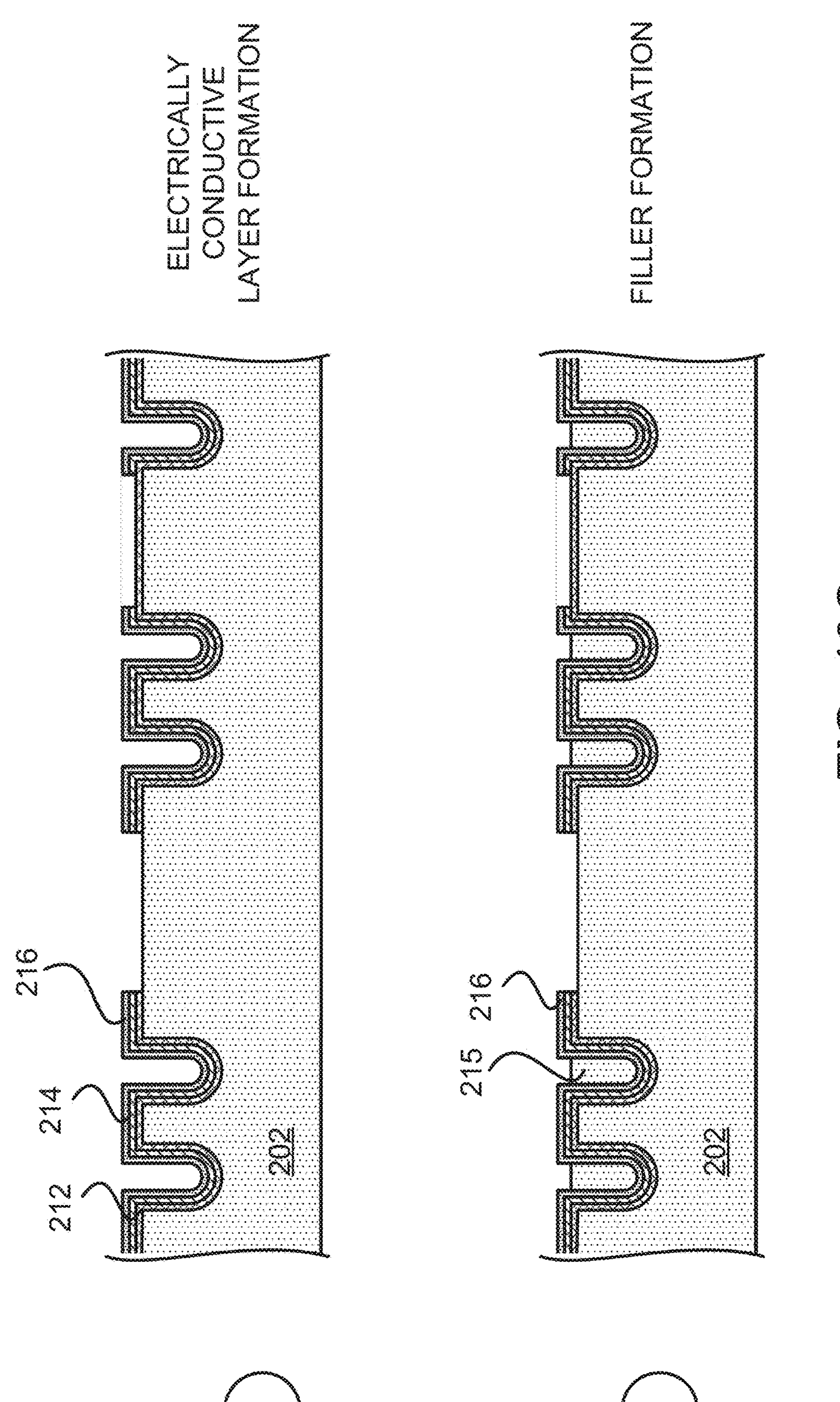

Stage 5, as shown in FIG. 13C, illustrates a state after a second electrically conductive layer 216 is formed (e.g., disposed) over the dielectric layer 214. The second electrically conductive layer 216 may be located over the first surface of the die substrate 202 and/or in the trenches 1300 of the die substrate 202. A deposition process (e.g., chemical vapor deposition) may be used to form the second electrically conductive layer 216. In some implementations, the second electrically conductive layer 216 may include N+ poly silicon. Other implementations may use different materials and/or different combinations of materials as the second electrically conductive layer 216.

Stage 6 illustrates a state after a filler 215 is formed over the second electrically conductive layer 216. The filler 215 may be formed in the trenches of the die substrate 202. A deposition process may be used to form the filler 215 over the second electrically conductive layer 216. The filler 215 may be optional.

Stage 7, as shown in FIG. 13D, illustrates a state after at least one cavity 1309 is formed in the die substrate 202. The cavity 1309 may extend through the die substrate 202. A laser process (e.g., laser ablation process) may be used for form the cavity 1309.

Stage 8 illustrates a state after the through substrate via 270 is formed in the cavity 1309. A plating process may be used to form the through substrate via 270. The through substrate via 270 may be or may not be coupled to the first electrically conductive layer 212. In some implementations, the through substrate via 270 may be coupled to another electrically conductive layer (e.g., 216).

Stage 9 illustrates a state after the first contact layer 230 and the second contact layer 218 are formed. The first contact layer 230 may be formed over the first electrically conductive layer 212 and/or the through substrate via 270, and the second contact layer 218 may be formed over the second electrically conductive layer 216. The first contact layer 230 and the second contact layer 218 may be formed using a plating process (e.g., electro plating process).

Figure 13E:
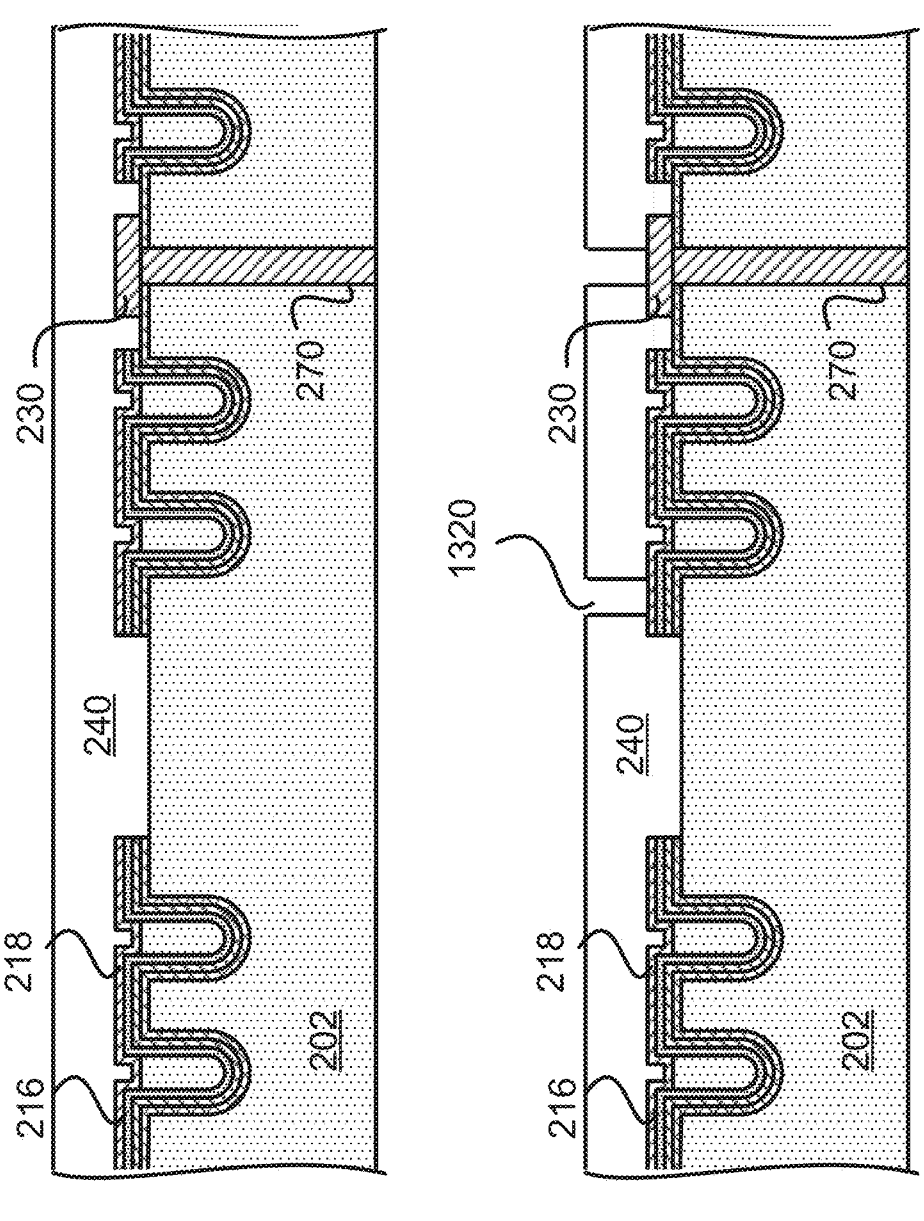

Stage 10, as shown in FIG. 13E, illustrates a state after the dielectric layer 240 is formed over the die substrate 202, the first electrically conductive layer 212, the second electrically conductive layer 216, the first contact layer 230 and/or the second contact layer 218. A deposition process may be used to form the dielectric layer 240.

Stage 11 illustrates a state after a plurality of cavities 1320 are formed in the dielectric layer 240. An etching process and/or a laser process may be used to form the plurality of cavities 1320.

Stage 12, as shown in FIG. 13F, illustrates a state after the first capacitor interconnect 250 and the second capacitor interconnect 260 are formed. The first capacitor interconnect 250 may be coupled to the first contact layer 230. The second capacitor interconnect 260 may be coupled to the second contact layer 218. The first capacitor interconnect 250 and the second capacitor interconnect 260 may be formed using a plating process (e.g., electro plating process).

Stage 13 illustrates a state after portions of the die substrate 202 are removed to thin the die substrate 202. A back side grinding process may be used to remove portions of the die substrate 202. Stage 12 and/or Stage 13 may illustrate an example of a trench capacitor device that includes several trench capacitors.

Exemplary Flow Diagram of a Method for Fabricating a Trench Capacitor Device

In some implementations, fabricating a capacitor structure that includes a plurality of trench capacitors includes several processes. FIG. 14 illustrates an exemplary flow diagram of a method 1400 for providing or fabricating a capacitor structure that includes a plurality of trench capacitors. The method 1400 of FIG. 14 may be used to provide or fabricate the trench capacitor device 300 of FIG. 3 described in the disclosure. However, the method 1400 may be used to provide or fabricate any of the capacitor structures described in the disclosure.

It should be noted that the sequence of FIG. 14 may combine one or more processes in order to simplify and/or clarify the method for providing or fabricating a capacitor structure. In some implementations, the order of the processes may be changed or modified. In some implementations, one or more of processes may be replaced or substituted without departing from the spirit of the disclosure. However, different implementations may fabricate a capacitor structure differently.

The method provides (at 1405) a die substrate (e.g., 202). The die substrate 202 may include silicon (Si). Stage 1 of FIG. 13A, illustrates a state after a die substrate 202 is provided.

The method forms (at 1410) a plurality of trenches. Stage 2 of FIG. 13A illustrates a state after a plurality of trenches 1300 are formed in the die substrate 202. In particular, the plurality of trenches 1300 (e.g., first trench, second trench, third trench) is formed through a first surface of the die substrate 202. Different implementations may form the trench differently. An etching process (e.g., chemical etching, mechanical etching) and/or a laser process may be used to form the trenches.

The method forms (at 1415) a first electrically conductive layer over the trenches and/or the first surface of the die substrate. Stage 3 of FIG. 13B, illustrates a state after a first electrically conductive layer 212 is formed (e.g., disposed) over the first surface of the die substrate 202 and/or in the trenches 1300 of the die substrate 202. A deposition process (e.g., chemical vapor deposition) may be used to form the first electrically conductive layer 212. In some implementations, the first electrically conductive layer 212 may include N+ silicon. Other implementations may use different materials as the first electrically conductive layer 212.

The method forms (at 1420) a dielectric layer over the first conductive layer. Stage 4 of FIG. 13B, illustrates a state after the dielectric layer 214 is formed over the first electrically conductive layer 212. A deposition process may be used to form the dielectric layer 214 over the first electrically conductive layer 212. The dielectric layer 214 may be touching the first electrically conductive layer 212. At least a portion of the dielectric layer 214 may be formed in the plurality of trenches 1300. Some portions of the dielectric layer 214 may be located over the first surface of the die substrate 202.

The method forms (at 1425) a second electrically conductive layer over the dielectric layer. Stage 5 of FIG. 13C, illustrates a state after a second electrically conductive layer 216 is formed (e.g., disposed) over the dielectric layer 214. The second electrically conductive layer 216 may be located over the first surface of the die substrate 202 and/or in the trenches 1300 of the die substrate 202. A deposition process (e.g., chemical vapor deposition) may be used to form the second electrically conductive layer 216. In some implementations, the second electrically conductive layer 216 may include N+ poly silicon. Other implementations may use different materials as the second electrically conductive layer 216.

The method optionally forms (at 1430) a filler in the trenches over the second electrically conductive layer. Stage 6 of FIG. 13C illustrates a state after a filler 215 is formed over the second electrically conductive layer 216. The filler 215 may be formed in the trenches of the die substrate 202. A deposition process may be used to form the filler 215 over the second electrically conductive layer 216.

The method optionally forms (at 1435) cavities through the die substrate. Stage 7 of FIG. 13D, illustrates a state after the cavities 1309 are formed through the die substrate 202. An etching process or a laser process may be used to form the cavities 1309 through the die substrate 202. The method forms (at 1435) through substrate vias (e.g., 270) in the cavities 1309. A plating process may be used to form the through substrate vias 270. Stage 8 of FIG. 13D illustrates an example of through substrate vias.

The method forms (at 1440) first and second conductive layers (e.g., contact layers). Stage 9 of FIG. 13D, illustrates a state after the first contact layer 230 and the second contact layer 218 are formed. The first contact layer 230 may be formed over the first electrically conductive layer 212 and/or the through substrate vias 270, and the second contact layer 218 may be formed over the second electrically conductive layer 216. The first contact layer 230 and the second contact layer 218 may be formed using a plating process (e.g., electro plating process).

The method forms (at 1445) a dielectric layer 240 over the die substrate 202, the first electrically conductive layer 212, the second electrically conductive layer 216, the first contact layer 230 and/or the second contact layer 218. A deposition process may be used to form the dielectric layer 240. The method may form (at 1445) a cavity in the dielectric layer 240. Stages 10 and 11 of FIG. 13E, illustrate a state after the dielectric layer is formed and a cavity is formed in the dielectric layer.

The method forms (at 1450) interconnects in one or more cavities (e.g., 1320) of the dielectric layer 240. Stage 12 of FIG. 13F, illustrates an example of forming interconnects (e.g., 250 and 260). In some implementations, the method may thin a portion of the die substrate. Stage 13 of FIG. 13F illustrates an example of thinning a die substrate.

The method may be performed on a wafer to form several trench capacitor devices that can be singulated. In some implementations, a first wafer that includes a plurality of first trench capacitor devices is coupled to a plurality of second trench capacitor devices through a plurality of solder interconnects or an adhesive, and then the coupled wafers are singulated into individual capacitor structures that include a first trench capacitor device vertically stacked over a second trench capacitor device. In some implementations, the wafers are singulated and then the individual trench capacitors are vertically stacked over each other. As mentioned above, some implementations may include more than two vertically stacked trench capacitors.

Exemplary Sequences for Fabricating a Substrate Comprising Stacked Trench Capacitor Devices FIGS. 15A-15E illustrate an exemplary sequence for providing or fabricating a substrate that includes stacked trench capacitors. In some implementations, the sequence of FIGS. 15A-15E may be used to provide or fabricate the substrate 102 of FIG. 6, or other substrates described in the disclosure.

It should be noted that the sequence of FIGS. 15A-15E may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate a substrate differently.

Figure 15A:
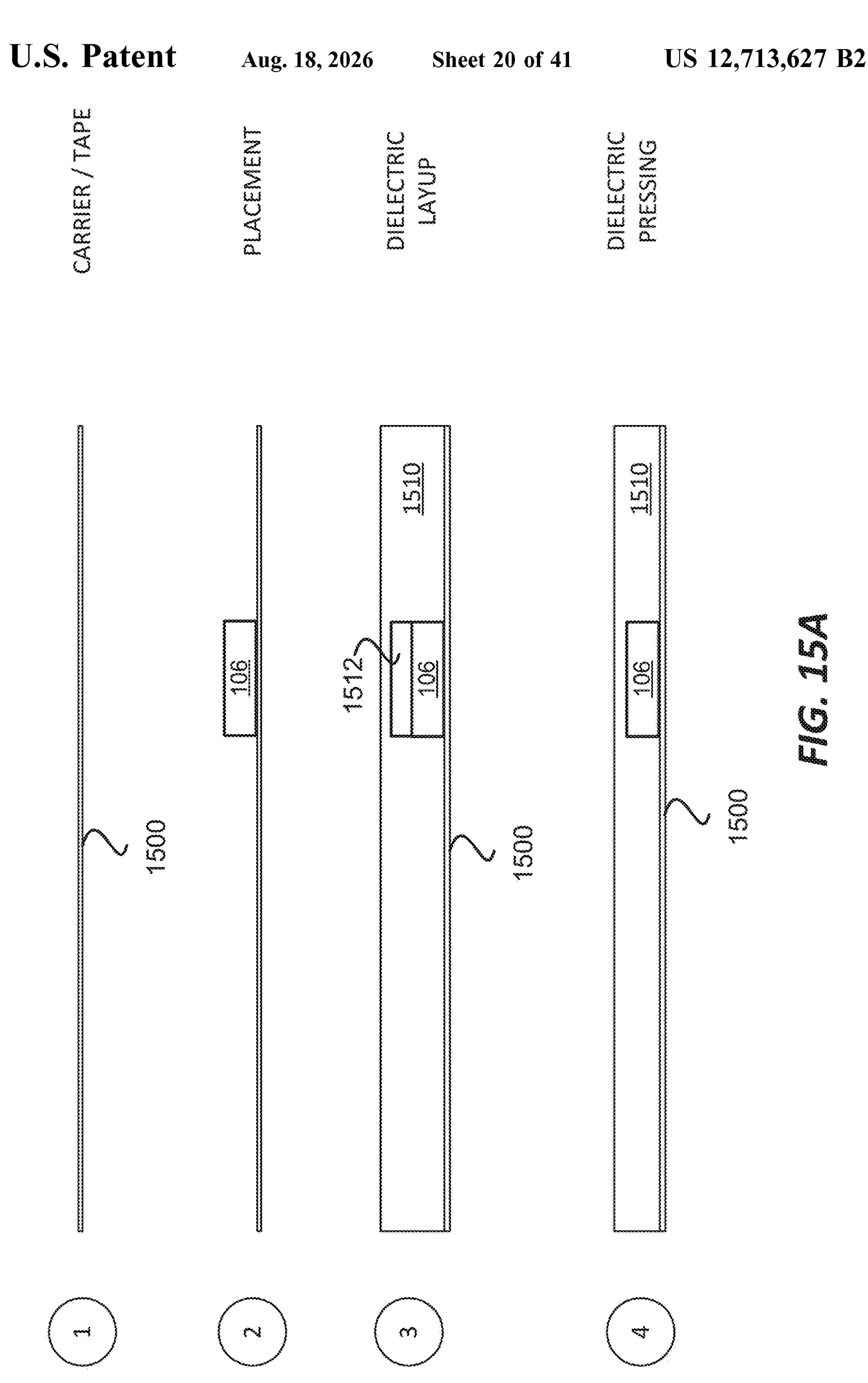
FIGS. 15A-15E illustrate an exemplary sequence for fabricating a substrate comprising a stacked capacitor structure.

Stage 1, as shown in FIG. 15A, illustrates a state after a carrier 1500 is provided. The carrier 1500 may include a tape.

Stage 2 illustrates a state after a capacitor structure 106 is coupled to the carrier 1500. The capacitor structure 106 may be placed on the carrier 1500. Instead of or in addition to the capacitor structure 106, other capacitor structures (e.g., 406, 506) may be coupled to the carrier 1500.

Stage 3 illustrates a state after a dielectric layer 1510 is provided over the carrier 1500 and the capacitor structure 106. There is a cavity 1512 in the dielectric layer 1510 over the capacitor structure 106. The cavity 1512 is formed so that in a subsequent pressing of the dielectric layer 1510, the dielectric layer 1510 does not damage the capacitor structure 106. A deposition and/or layup process may be used to form the dielectric layer 1510.

Stage 4 illustrates a state after the dielectric layer 1510 is pressed, which compresses the dielectric layer 1510. The dielectric layer 1510 is formed around the capacitor structure 106. Examples of the dielectric layer 1510 include glass, prepreg and and/or Ajinomoto Build-Up Film (ABF).

Figure 15B:
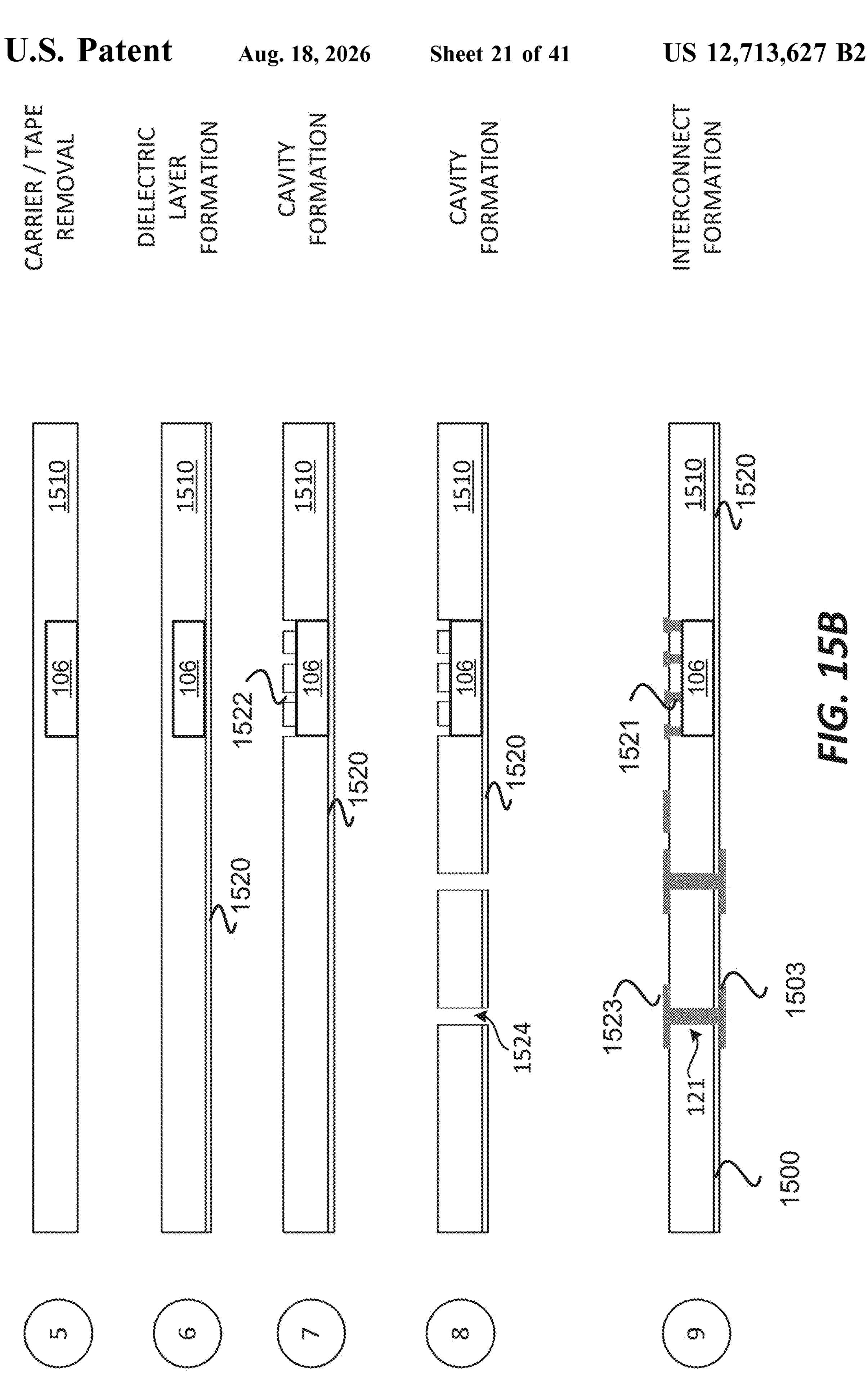

Stage 5, as shown in FIG. 15B, illustrates a state after the carrier 1500 is decoupled from the dielectric layer 1510 and the capacitor structure 106. For example, when the carrier 1500 includes a tape, the carrier 1500 may be de-taped from the dielectric layer 1510 and the capacitor structure 106. A cleaning process (e.g., plasma clean) may be performed on the dielectric layer 1510 and the capacitor structure 106 after the carrier 1500 is removed.

Stage 6 illustrates a state after a dielectric layer 1520 is formed on the dielectric layer 1510 and the capacitor structure 106. The dielectric layer 1520 may include prepreg. A deposition and/or lamination process may be used to form the dielectric layer 1520. The dielectric layer 1520 may be formed on a surface of the dielectric layer 1510 and/or a surface of the capacitor structure 106. It is noted that forming the dielectric layer 1520 may be optional. Thus, in some implementations, the dielectric layer 1520 is not formed nor provided.

Stage 7 illustrates a state after a plurality of cavities 1522 are formed in the dielectric layer 1510. The plurality of cavities 1522 may be formed through an etching process (e.g., photo etching process) and/or laser process. The plurality of cavities 1522 may expose interconnects of the capacitor structure 106.

Stage 8 illustrates a state after a plurality of cavities 1524 are formed in the dielectric layer 1510 and the dielectric layer 1520. The plurality of cavities 1524 may be formed through an etching process, a laser process and/or a drilling process. The plurality of cavities 1524 may be formed through one or more etching processes (e.g., photo etching processes). For example, the plurality of cavities 1524 may be formed through a first surface of the dielectric layer 1510 and through a second surface of the dielectric layer 1520. The dielectric layer 1510 and/or the dielectric layer 1520 may be represented as a core layer 120. The dielectric layer 1510 and/or the dielectric layer 1520 may include prepreg.

Stage 9 illustrates a state after a plurality of core interconnects are formed in the plurality of cavities 1522 and the plurality of cavities 1524. For example, a plurality of core interconnects 121 may be formed in the plurality of cavities 1524. The plurality of core interconnects 121 may be an example of a first plurality of core interconnects. A second plurality of core interconnects 1521 may be formed in the plurality of cavities 1522. The second plurality of core interconnects 1521 may extend through part of the dielectric layer 1510. The second plurality of core interconnects 1521 may extend between a surface (e.g., top surface) of the dielectric layer 1510 and the capacitor structure 106. The second plurality of core interconnects 1521 is coupled to the capacitor structure 106. The second plurality of core interconnects 1521 may be considered part of the plurality of core interconnects 121. A plating process may be used to form the plurality of core interconnects 121 and the second plurality of core interconnects 1521. However, different implementations may use different processes for forming the plurality of core interconnects 121 and/or the second plurality of core interconnects 1521. The plurality of core interconnects 121 may include core vias located in the dielectric layer 1510 and the dielectric layer 1520. The second plurality of core interconnects 1521 may include core vias located in the dielectric layer 1510.

Stage 9 also illustrates a state after a plurality of interconnects 1523 are formed over the first surface (e.g., top surface) of the dielectric layer 1510. The plurality of interconnects 1523 may be coupled to the plurality of core interconnects 121 and the second plurality of core interconnects 1521. The plurality of interconnects 1523 may be configured to be coupled to the capacitor structure 106 through the second plurality of core interconnects 1521. Stage 9 also illustrates a state after a plurality of interconnects 1503 are formed over (e.g., below) the second surface (e.g., bottom surface) of the dielectric layer 1520. If there is no dielectric layer 1520, the plurality of interconnects 1503 are formed over the second surface (e.g., bottom surface) of the dielectric layer 1510. The plurality of interconnects 1503 may be coupled to the plurality of core interconnects 121. A patterning process, a stripping process and/or a plating process may be used to form the plurality of interconnects 1503 and the plurality of interconnects 1523. Stage 9 illustrates the capacitor structure 106 located in the dielectric layer 1510.

Figure 15C:
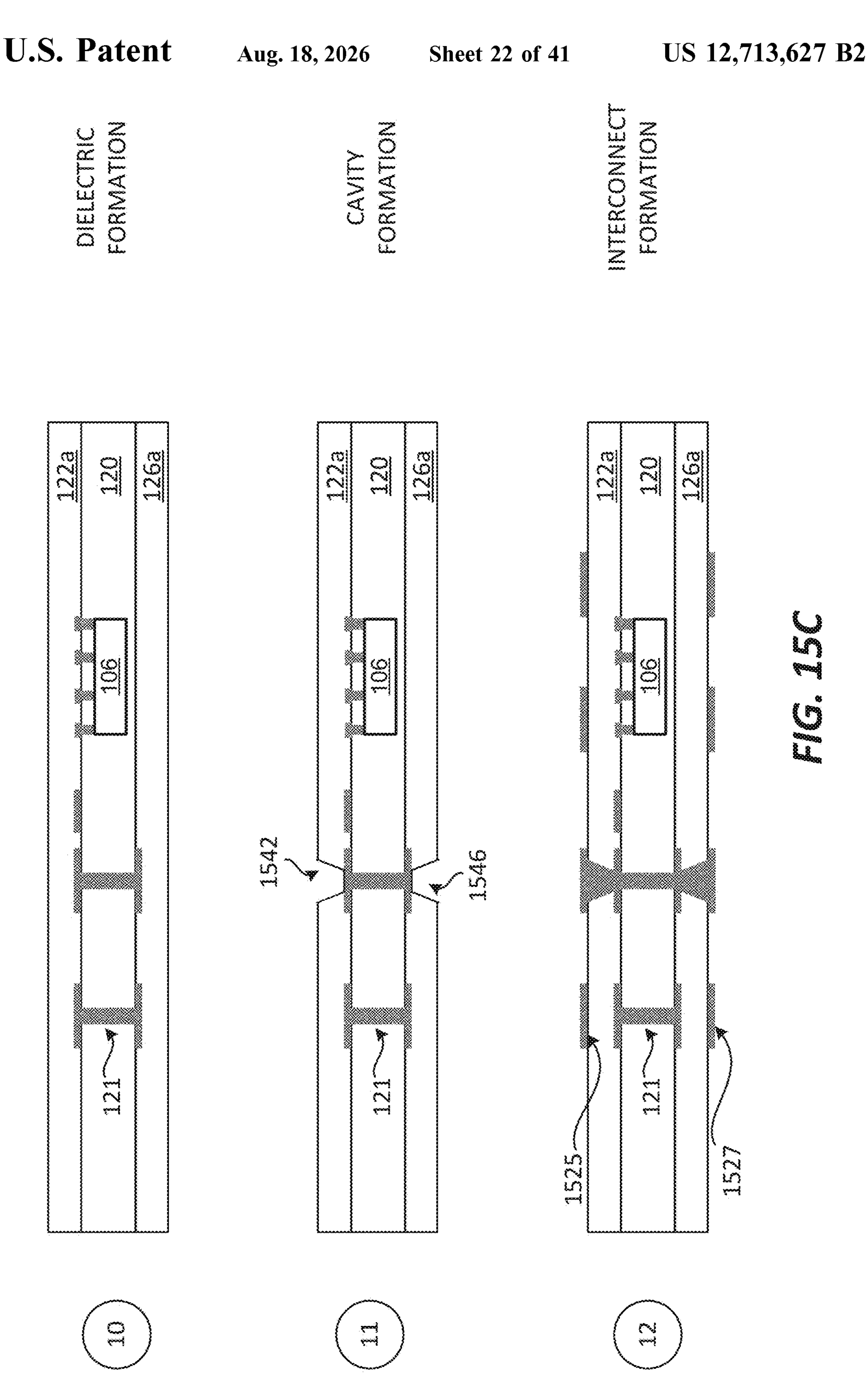

Stage 10, as shown in FIG. 15C, illustrates a state after a dielectric layer 122*a* is formed over the first surface of the core layer 120, and a dielectric layer 126*a* is formed over the second surface of the core layer 120. The core layer 120 may represent the dielectric layer 1510 and/or the dielectric layer 1520. A deposition process and/or lamination process may be used to form dielectric layers 122*a* and 126*a*. The dielectric layers 122*a* and 126*a* may include prepreg (e.g., prepreg layers). Stage 10 illustrates the capacitor structure 106 located in the core layer 120.

Stage 11 illustrates a state after a plurality of cavities 1542 is formed in the dielectric layer 122*a*, and a plurality of cavities 1546 is formed in the dielectric layer 126*a*. An etching process (e.g., photo etching process) and/or a laser process (e.g., laser drilling, laser ablation) may be used to form the plurality of cavities 1542 and the plurality of cavities 1546.

Stage 12 illustrates a state after a plurality of interconnects 1525 is formed over and coupled to the dielectric layer 122*a* and the plurality of cavities 1542. The plurality of interconnects 1525 may be coupled to the plurality of interconnects 1523. Stage 12 also illustrates a state after a plurality of interconnects 1527 is formed over and coupled the dielectric layer 126*a* and the plurality of cavities 1546. The plurality of interconnects 1527 may be coupled to the plurality of interconnects 1503. A patterning process, a stripping process and/or a plating process may be used to form the plurality of interconnects 1525 and the plurality of interconnects 1527.

Figure 15D:
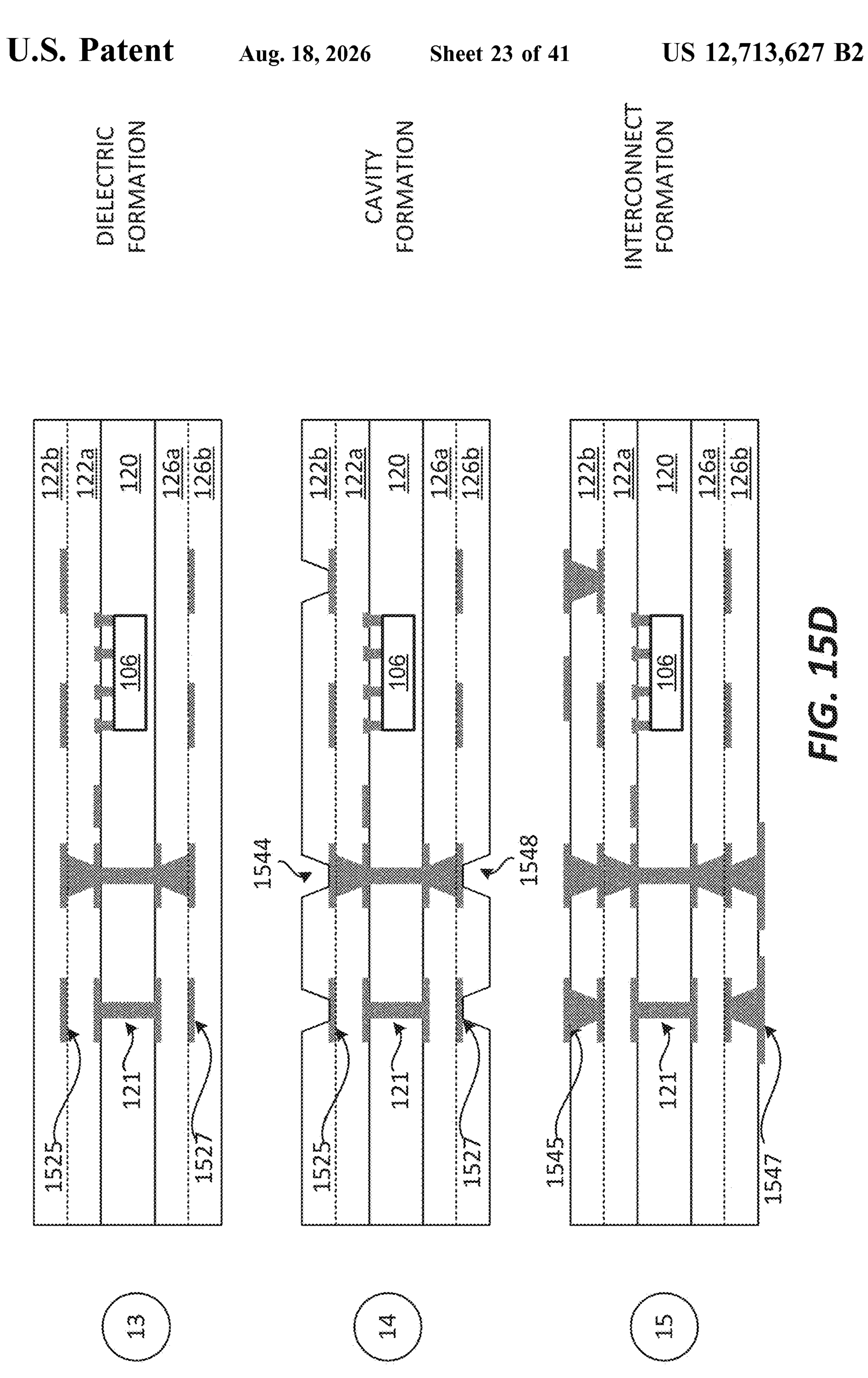

Stage 13, as shown in FIG. 15D, illustrates a state after a dielectric layer 122*b* is formed over and coupled to a first surface of dielectric layer 122*a*, and a dielectric layer 126*b* is formed over and coupled to a second surface of the dielectric layer 126*a*. A deposition process and/or lamination process may be used to form dielectric layers 122*b* and 126*b*. The dielectric layers 122*b* and 126*b* may include prepreg (e.g., prepreg layers).

Stage 14 illustrates a state after a plurality of cavities 1544 is formed in the dielectric layer 122*b*, and a plurality of cavities 1548 is formed in the dielectric layer 126*b*. An etching process and/or a laser process (e.g., laser drilling, laser ablation) may be used to form the plurality of cavities 1544 and the plurality of cavities 1548.

Stage 15 illustrates a state after a plurality of interconnects 1545 is formed over and coupled to the dielectric layer 122*b* and the plurality of cavities 1544. The plurality of interconnects 1545 may be coupled to the plurality of interconnects 1525. Stage 12 also illustrates a state after a plurality of interconnects 1547 is formed over and coupled to the dielectric layer 126*b* and the plurality of cavities 1548. The plurality of interconnects 1547 may be coupled to the plurality of interconnects 1527. A patterning process, a stripping process and/or a plating process may be used to form the plurality of interconnects 1545 and the plurality of interconnects 1547. It is noted that additional dielectric layers and additional interconnects may be formed by repeating Stages 13-15 of FIG. 15D, as described above.

Figure 15E:

Stage 16, as shown in FIG. 15E, illustrates a state after a solder resist layer 140 is formed over a surface of the dielectric layer 122*b*, and a solder resist layer 142 is formed over a surface of the dielectric layer 126*b*. The plurality of interconnects 125 may represent the plurality of interconnects 1525, the plurality of interconnects 1545 and/or the plurality of interconnects 1523. The plurality of interconnects 127 may represent the plurality of interconnects 1527, the plurality of interconnects 1547 and/or the plurality of interconnects 1503.

Stage 17 illustrates a state after a plurality of solder interconnects 150 are coupled to the substrate 102. A solder reflow process may be used to couple the plurality of solder interconnects 150 to the plurality of interconnects 127.

Exemplary Sequences for Fabricating a Substrate Comprising Stacked Trench Capacitor Devices FIGS. 16A-16E illustrate an exemplary sequence for providing or fabricating a substrate that includes stacked trench capacitors. In some implementations, the sequence of FIGS. 16A-16E may be used to provide or fabricate the substrate 102 of FIG. 7, or other substrates described in the disclosure.

It should be noted that the sequence of FIGS. 16A-16E may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate a substrate differently.

Figure 16A:
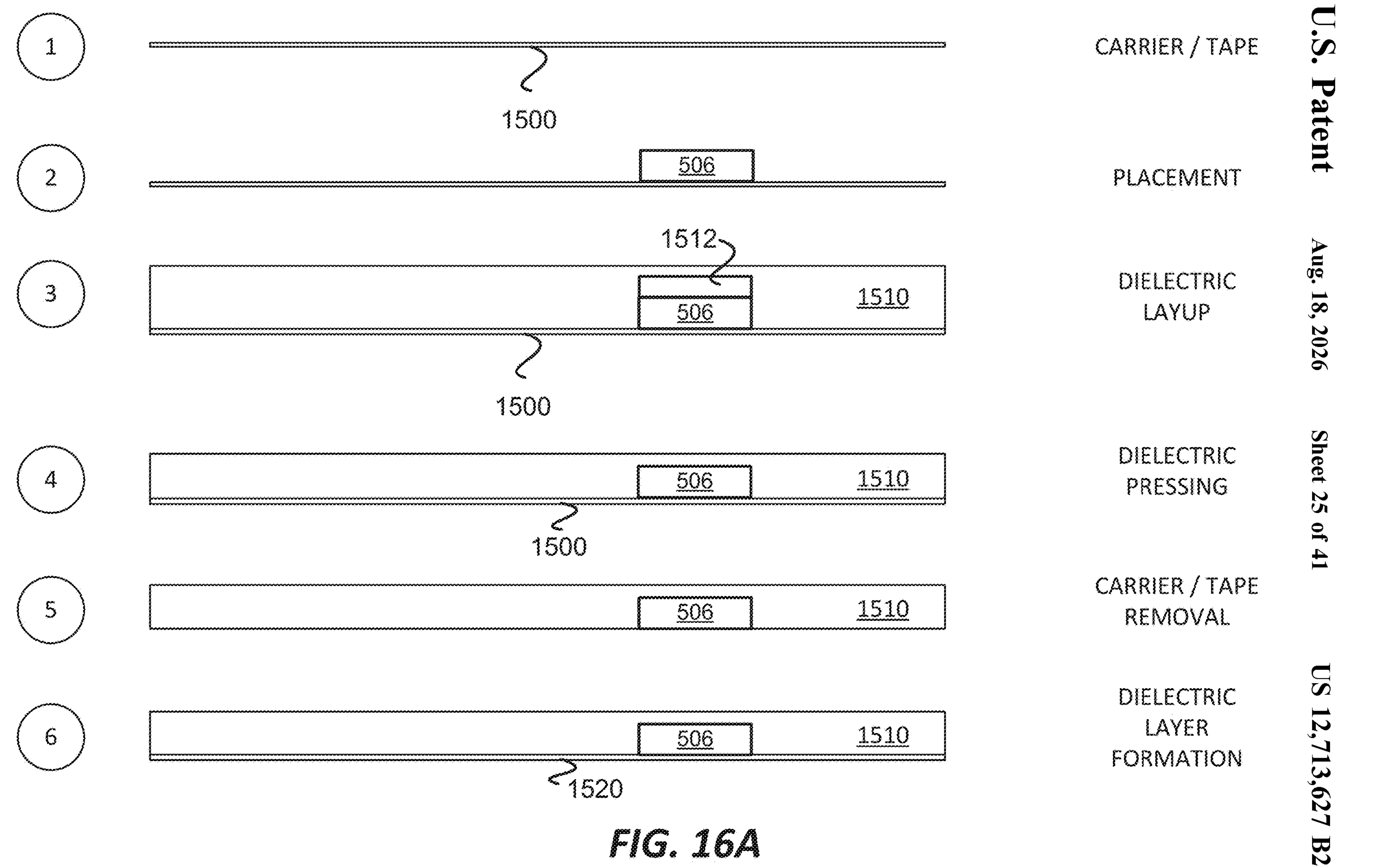

Stage 1, as shown in FIG. 16A, illustrates a state after a carrier 1500 is provided. The carrier 1500 may include tape.

Stage 2 illustrates a state after a capacitor structure 506 is coupled to the carrier 1500. The capacitor structure 506 may be placed on the carrier 1500. Instead of or in addition to the capacitor structure 506, other capacitor structures (e.g., 106, 406) may be coupled to the carrier 1500.

Stage 3 illustrates a state after a dielectric layer 1510 is provided over the carrier 1500 and the capacitor structure 506. There is a cavity 1512 in the dielectric layer 1510 over the capacitor structure 506. The cavity 1512 is formed so that in a subsequent pressing of the dielectric layer 1510, the dielectric layer 1510 does not damage the capacitor structure 506. A deposition and/or layup process may be used to form the dielectric layer 1510.

Stage 4 illustrates a state after the dielectric layer 1510 is pressed, which compresses the dielectric layer 1510. The dielectric layer 1510 is formed around the capacitor structure 506.

Stage 5 illustrates a state after the carrier 1500 is decoupled from the dielectric layer 1510 and the capacitor structure 506. For example, when the carrier 1500 includes a tape, the carrier 1500 may be de-taped from the dielectric layer 1510 and the capacitor structure 506. A cleaning process (e.g., plasma clean) may be performed on the dielectric layer 1510 and the capacitor structure 506 after the carrier 1500 is removed.

Stage 6 illustrates a state after a dielectric layer 1520 is formed on the dielectric layer 1510 and the capacitor structure 506. The dielectric layer 1520 may include prepreg. A deposition and/or lamination process may be used to form the dielectric layer 1520. The dielectric layer 1520 may be formed on a surface of the dielectric layer 1510 and/or a surface of the capacitor structure 506.

Figure 16B:
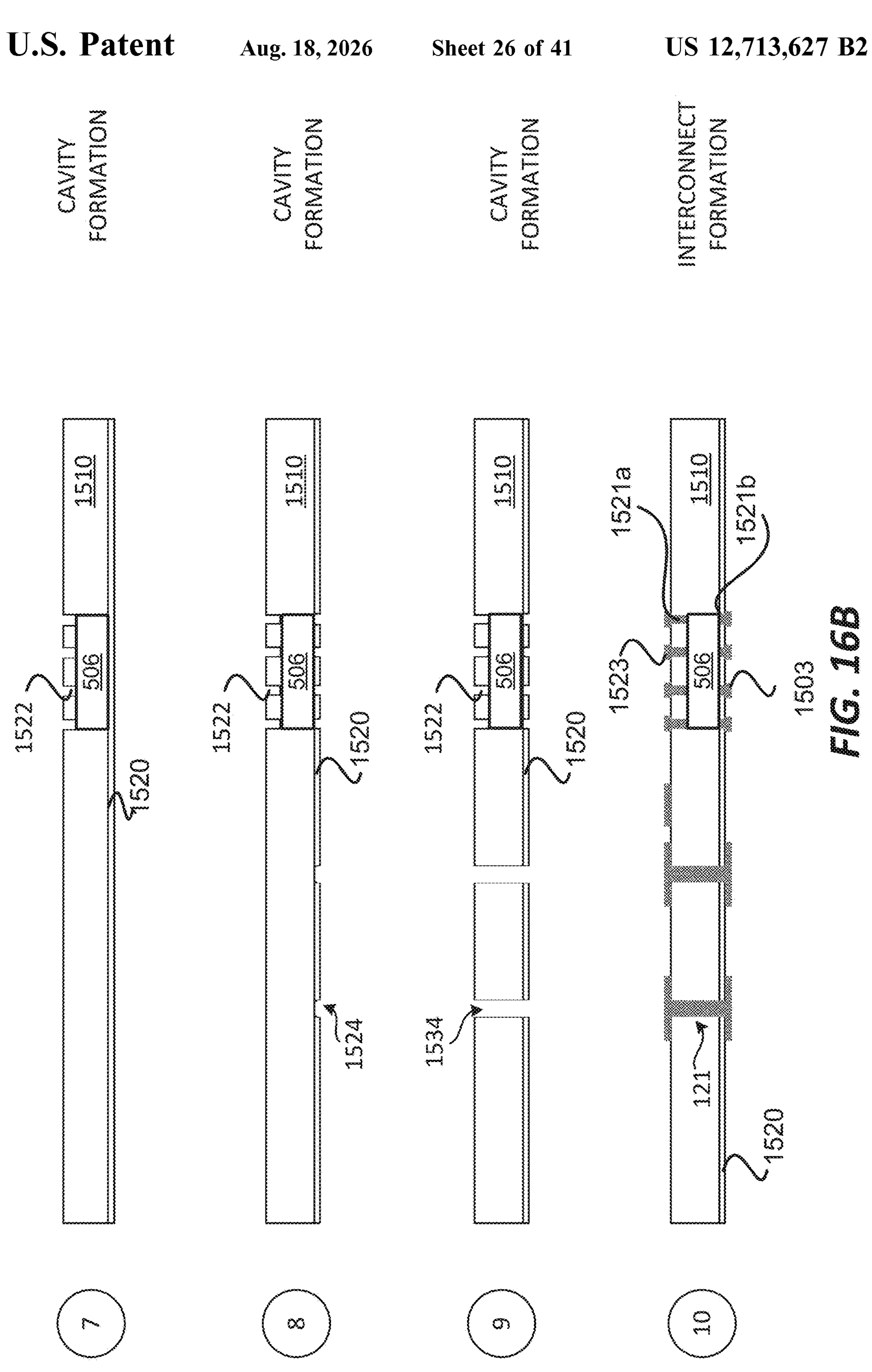

Stage 7, as shown in FIG. 16B, illustrates a state after a plurality of cavities 1522 are formed in the dielectric layer 1510. The plurality of cavities 1522 may be formed through an etching process (e.g., photo etching process) and/or a laser process. The plurality of cavities 1522 may expose interconnects of the capacitor structure 506.

Stage 8 illustrates a state after a plurality of cavities 1524 are formed in the dielectric layer 1520. The plurality of cavities 1524 may be formed through a laser process and/or a drilling process. The plurality of cavities 1524 may be formed through one or more etching processes (e.g., photo etching processes). For example, the plurality of cavities 1524 may be formed through a surface of the dielectric layer 1520. Some of the plurality of cavities 1524 may expose part of the capacitor structure 506. For example, the plurality of cavities 1524 may expose interconnects of the capacitor structure 506.

Stage 9 illustrates a state after a plurality of cavities 1534 are formed in the dielectric layer 1510 and/or the dielectric layer 1520. The plurality of cavities 1534 may be formed through a laser process and/or a drilling process. The plurality of cavities 1534 may be formed through one or more etching processes (e.g., photo etching processes). For example, the plurality of cavities 1534 may be formed through a first surface of the dielectric layer 1510 and/or through a second surface of the dielectric layer 1520. The plurality of cavities 1534 may be aligned with at least some of cavities from the plurality of cavities 1524. The plurality of cavities 1534 may include at least some of cavities from the plurality of cavities 1524.

Stage 10 illustrates a state after a plurality of core interconnects are formed in the plurality of cavities 1522, the plurality of cavities 1524 and the plurality of cavities 1534. For example, a plurality of core interconnects 121 may be formed in the plurality of cavities 1534. The plurality of core interconnects 121 may be an example of a first plurality of core interconnects. A second plurality of core interconnects 1521*a* may be formed in the plurality of cavities 1522. The second plurality of core interconnects 1521*a* may extend through part of the dielectric layer 1510. The second plurality of core interconnects 1521*a* may extend between a surface (e.g., top surface) of the dielectric layer 1510 and the capacitor structure 506. The second plurality of core interconnects 1521*a* is coupled to the capacitor structure 506. The second plurality of core interconnects 1521*a* may be considered part of the plurality of core interconnects 121. A third plurality of core interconnects 1521*b* may be formed in the plurality of cavities 1524. The third plurality of core interconnects 1521*b* may extend through part of the dielectric layer 1510 and/or the dielectric layer 1520. The third plurality of core interconnects 1521*b* may extend between a surface (e.g., bottom surface) of the dielectric layer 1520 and the capacitor structure 506. The third plurality of core interconnects 1521*b* is coupled to the capacitor structure 506. The third plurality of core interconnects 1521*b* may be considered part of the plurality of core interconnects 121. A plating process may be used to form the plurality of core interconnects 121, the second plurality of core interconnects 1521*a* and/or the third plurality of core interconnects 1521*b*. However, different implementations may use different processes for forming the plurality of core interconnects 121, the second plurality of core interconnects 1521*a* and/or the third plurality of core interconnects 1521*b*. The plurality of core interconnects 121 may include core vias located in the dielectric layer 1510 and the dielectric layer 1520. The second plurality of core interconnects 1521*a* may include core vias located in the dielectric layer 1510. The third plurality of core interconnects 1521*b* may include core vias located in the dielectric layer 1510 and/or the dielectric layer 1520. The dielectric layer 1510 and/or the dielectric layer 1520 may be represented as a core layer 120.

Stage 10 also illustrates a state after a plurality of interconnects 1523 are formed over the first surface (e.g., top surface) of the dielectric layer 1510. The plurality of interconnects 1523 may be coupled to the plurality of core interconnects 121 and the second plurality of core interconnects 1521*a*. The plurality of interconnects 1523 may be configured to be coupled to the capacitor structure 506 through the second plurality of core interconnects 1521*a*. Stage 10 also illustrates a state after a plurality of interconnects 1503 are formed over (e.g., below) the second surface (e.g., bottom surface) of the dielectric layer 1520. The plurality of interconnects 1503 may be coupled to the plurality of core interconnects 121 and the third plurality of core interconnects 1521*b*. The plurality of interconnects 1503 may be configured to be coupled to the capacitor structure 506 through the third plurality of core interconnects 1521*b*. A patterning process, a stripping process and/or a plating process may be used to form the plurality of interconnects 1503 and/or the plurality of interconnects 1523. Stage 10 illustrates the capacitor structure 506 located in the dielectric layer 1510.

Figure 16C:
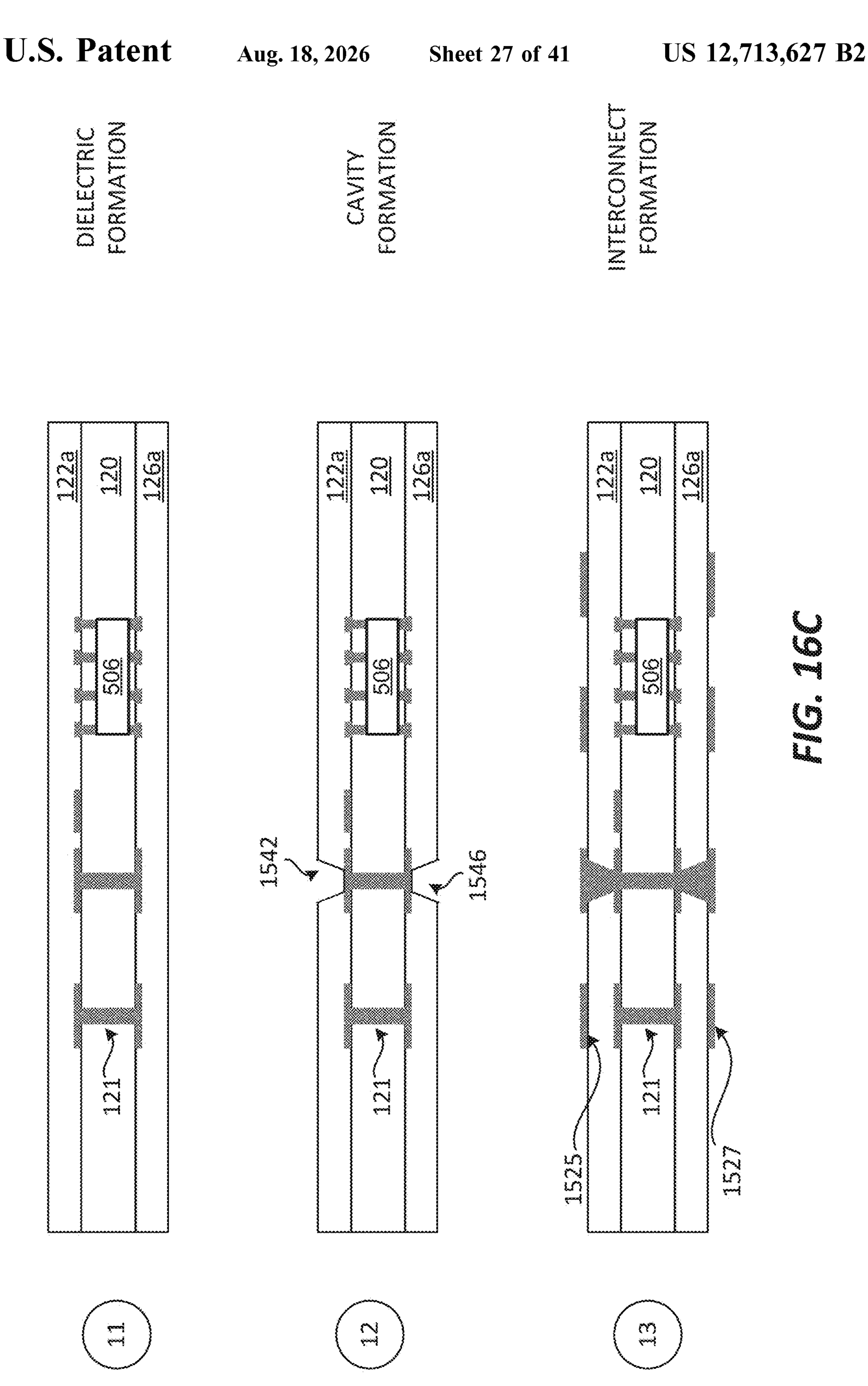

Stage 11, as shown in FIG. 16C, illustrates a state after a dielectric layer 122*a* is formed over the first surface of the core layer 120, and a dielectric layer 126*a* is formed over the second surface of the core layer 120. The core layer 120 may represent the dielectric layer 1510 and/or the dielectric layer 1520. A deposition process and/or lamination process may be used to form dielectric layers 122*a* and 126*a*. The dielectric layers 122*a* and 126*a* may include prepreg (e.g., prepreg layers). Stage 11 illustrates the capacitor structure 506 located in the core layer 120.

Stage 12 illustrates a state after a plurality of cavities 1542 is formed in the dielectric layer 122*a*, and a plurality of cavities 1546 is formed in the dielectric layer 126*a*. An etching process (e.g., photo etching process) and/or a laser process (e.g., laser drilling, laser ablation) may be used to form the plurality of cavities 1542 and the plurality of cavities 1546.

Stage 13 illustrates a state after a plurality of interconnects 1525 is formed over and coupled to the dielectric layer 122*a* and the plurality of cavities 1542. The plurality of interconnects 1525 may be coupled to the plurality of interconnects 1523. Stage 12 also illustrates a state after a plurality of interconnects 1527 is formed over and coupled the dielectric layer 126*a* and the plurality of cavities 1546. The plurality of interconnects 1527 may be coupled to the plurality of interconnects 1503. A patterning process, a stripping process and/or a plating process may be used to form the plurality of interconnects 1525 and the plurality of interconnects 1527.

Figure 16D:
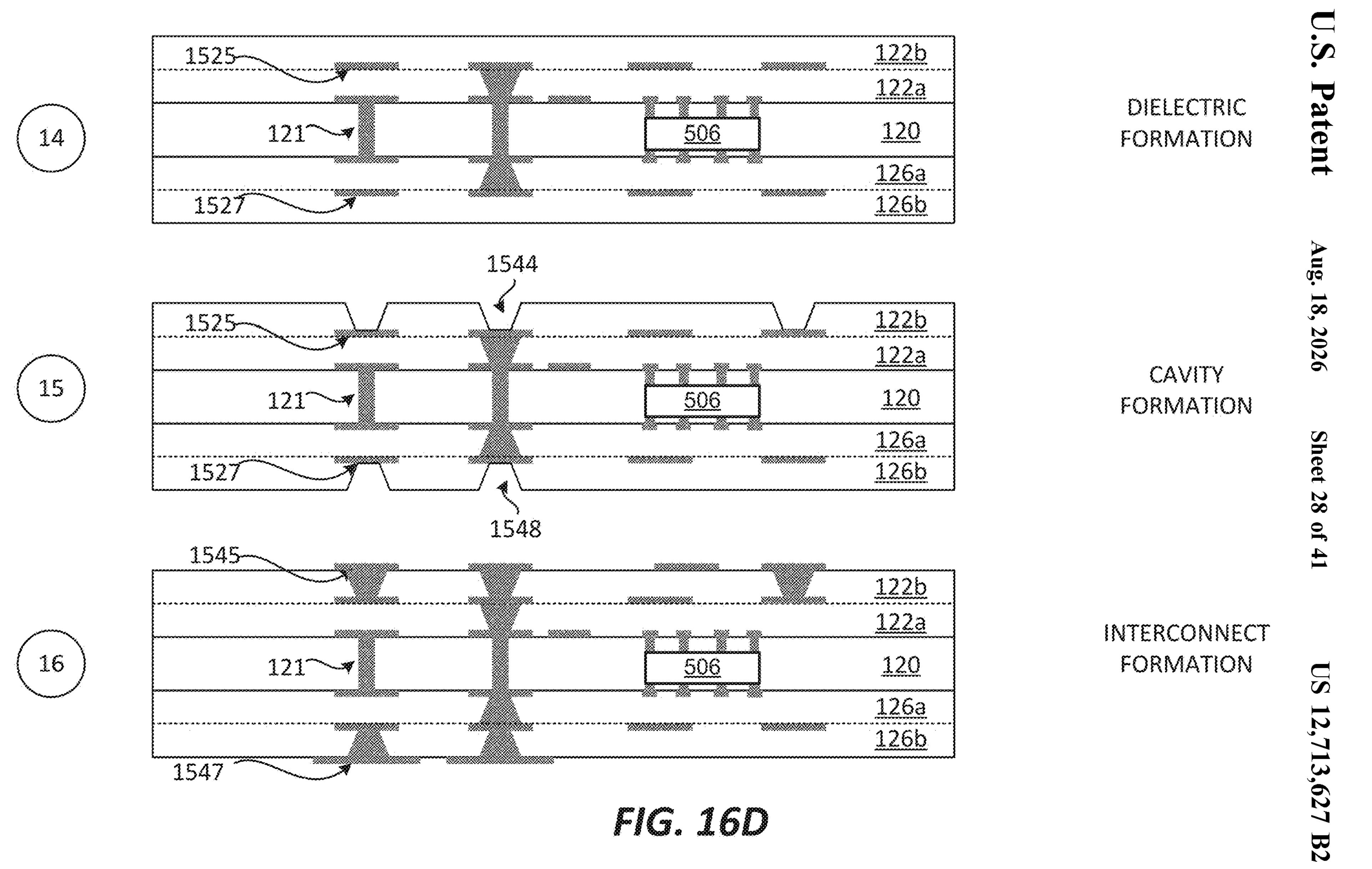

Stage 14, as shown in FIG. 16D, illustrates a state after a dielectric layer 122*b* is formed over and coupled to a first surface of dielectric layer 122*a*, and a dielectric layer 126*b* is formed over and coupled to a second surface of the dielectric layer 126*a*. A deposition process and/or lamination process may be used to form dielectric layers 122*b* and 126*b*. The dielectric layers 122*b* and 126*b* may include prepreg (e.g., prepreg layers).

Stage 15 illustrates a state after a plurality of cavities 1544 is formed in the dielectric layer 122*b*, and a plurality of cavities 1548 is formed in the dielectric layer 126*b*. An etching process and/or a laser process (e.g., laser drilling, laser ablation) may be used to form the plurality of cavities 1544 and the plurality of cavities 1548.

Stage 16 illustrates a state after a plurality of interconnects 1545 is formed over and coupled to the dielectric layer 122*b* and the plurality of cavities 1544. The plurality of interconnects 1545 may be coupled to the plurality of interconnects 1525. Stage 12 also illustrates a state after a plurality of interconnects 1547 is formed over and coupled to the dielectric layer 126*b* and the plurality of cavities 1548. The plurality of interconnects 1547 may be coupled to the plurality of interconnects 1527. A patterning process, a stripping process and/or a plating process may be used to form the plurality of interconnects 1545 and the plurality of interconnects 1547. It is noted that additional dielectric layers and additional interconnects may be formed by repeating Stages 14-16 of FIG. 16D, as described above.

Figure 16E:
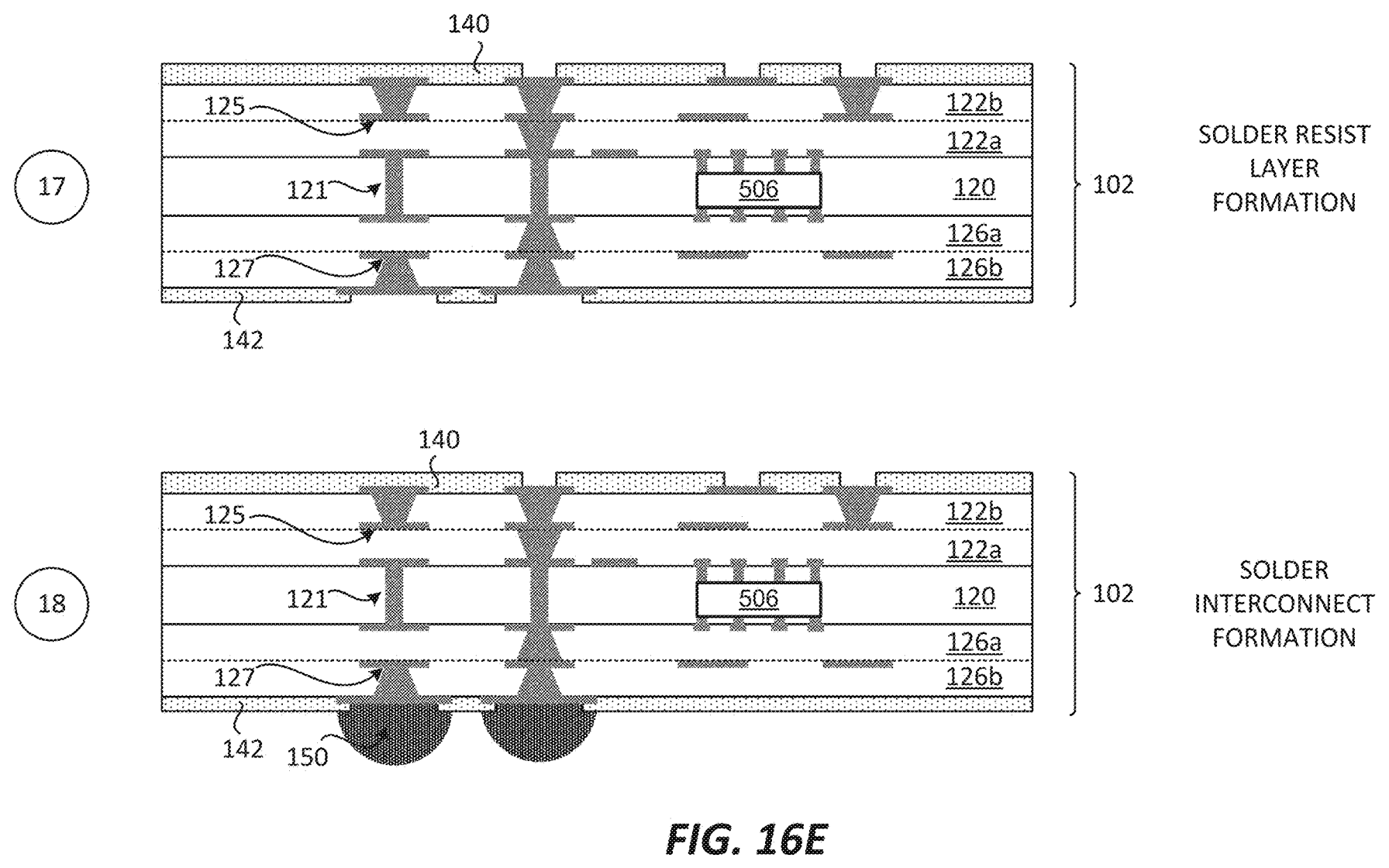

Stage 17, as shown in FIG. 16E, illustrates a state after a solder resist layer 140 is formed over a surface of the dielectric layer 122*b*, and a solder resist layer 142 is formed over a surface of the dielectric layer 126*b*. The plurality of interconnects 125 may represent the plurality of interconnects 1525, the plurality of interconnects 1545 and/or the plurality of interconnects 1523. The plurality of interconnects 127 may represent the plurality of interconnects 1527, the plurality of interconnects 1547 and/or the plurality of interconnects 1503.

Stage 18 illustrates a state after a plurality of solder interconnects 150 are coupled to the substrate 102. A solder reflow process may be used to couple the plurality of solder interconnects 150 to the plurality of interconnects 127.

Exemplary Sequences for Fabricating a Substrate Comprising Stacked Trench Capacitor Devices FIGS. 17A-17E illustrate an exemplary sequence for providing or fabricating a substrate that includes stacked trench capacitors. In some implementations, the sequence of FIGS. 17A-17E may be used to provide or fabricate the substrate 102 of FIG. 8, or other substrates described in the disclosure.

It should be noted that the sequence of FIGS. 17A-17E may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate a substrate differently.

Figure 17A:
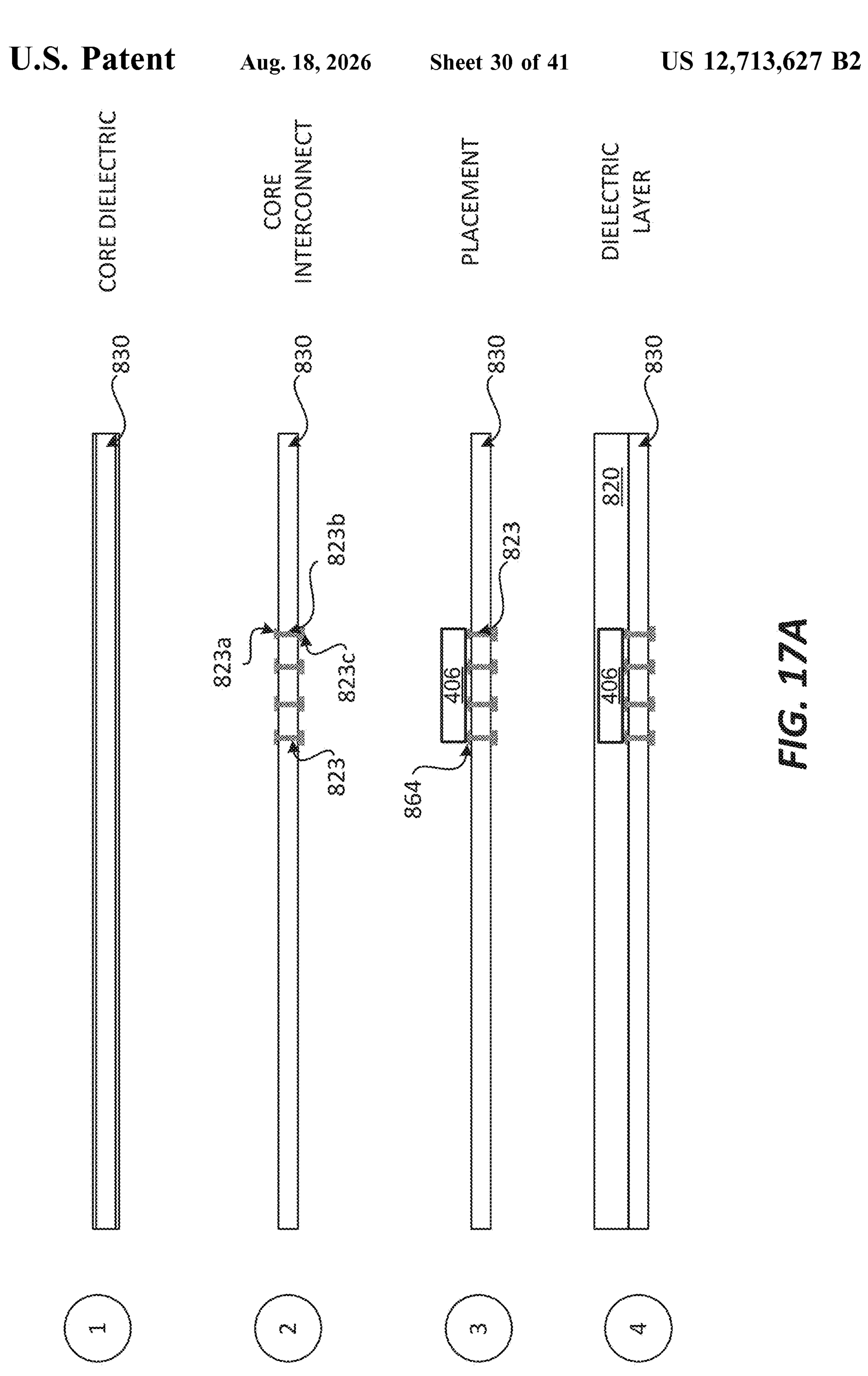

Stage 1, as shown in FIG. 17A, illustrates a state after a core dielectric layer 830 is provided. The core dielectric layer 830 may include a metal layer (e.g., seed layer) on a first surface of the core dielectric layer 830 and a metal layer (e.g., seed layer) on a second surface of the core layer.

Stage 2 illustrates a state after a plurality of core interconnects 823 are formed in the core dielectric layer 830. The plurality of core interconnects 823 may be formed by forming cavities in the core dielectric layer 830 and forming the plurality of core interconnects 823 in the cavities of the core dielectric layer 830. The plurality of core interconnects 823 may also be formed on the surface(s) of the core dielectric layer 830. A laser process may be used to form the cavities in the core dielectric layer 830. A plating process may be used to form the plurality of core interconnects 823. The plurality of core interconnects 823 may include a core interconnect 823*a* (e.g., core pad interconnect), a core interconnect 823*b* (e.g., core via interconnect) and a core interconnect 823*c*. As will be further described below, in some implementations, the core interconnect 823*c* may be considered an interconnect that is located outside of a core layer. In some implementations, the core interconnect 823*c* is not formed during this stage. Thus, in some implementations, after Stage 2, the core dielectric layer 830 may include the core interconnect 823*a* and the core interconnect 823*b* but not the core interconnect 823*c*.

Stage 3 illustrates a state after a capacitor structure 406 is coupled to the core dielectric layer 830 through a plurality of solder interconnects 864. A reflow process may be used to couple the capacitor structure 406 to the plurality of core interconnects 823. Instead of or in addition to the capacitor structure 406, other capacitor structures (e.g., 106, 506) may be coupled to the core dielectric layer 830.

Stage 4 illustrates a state after a core dielectric layer 820 is formed over the core dielectric layer 830 and the capacitor structure 406. A deposition process, a layup process and/or a pressing process may be used to form the core dielectric layer 820. The core dielectric layer 820 surrounds the capacitor structure 406. The core dielectric layer 820 may include prepreg.

Figure 17B:
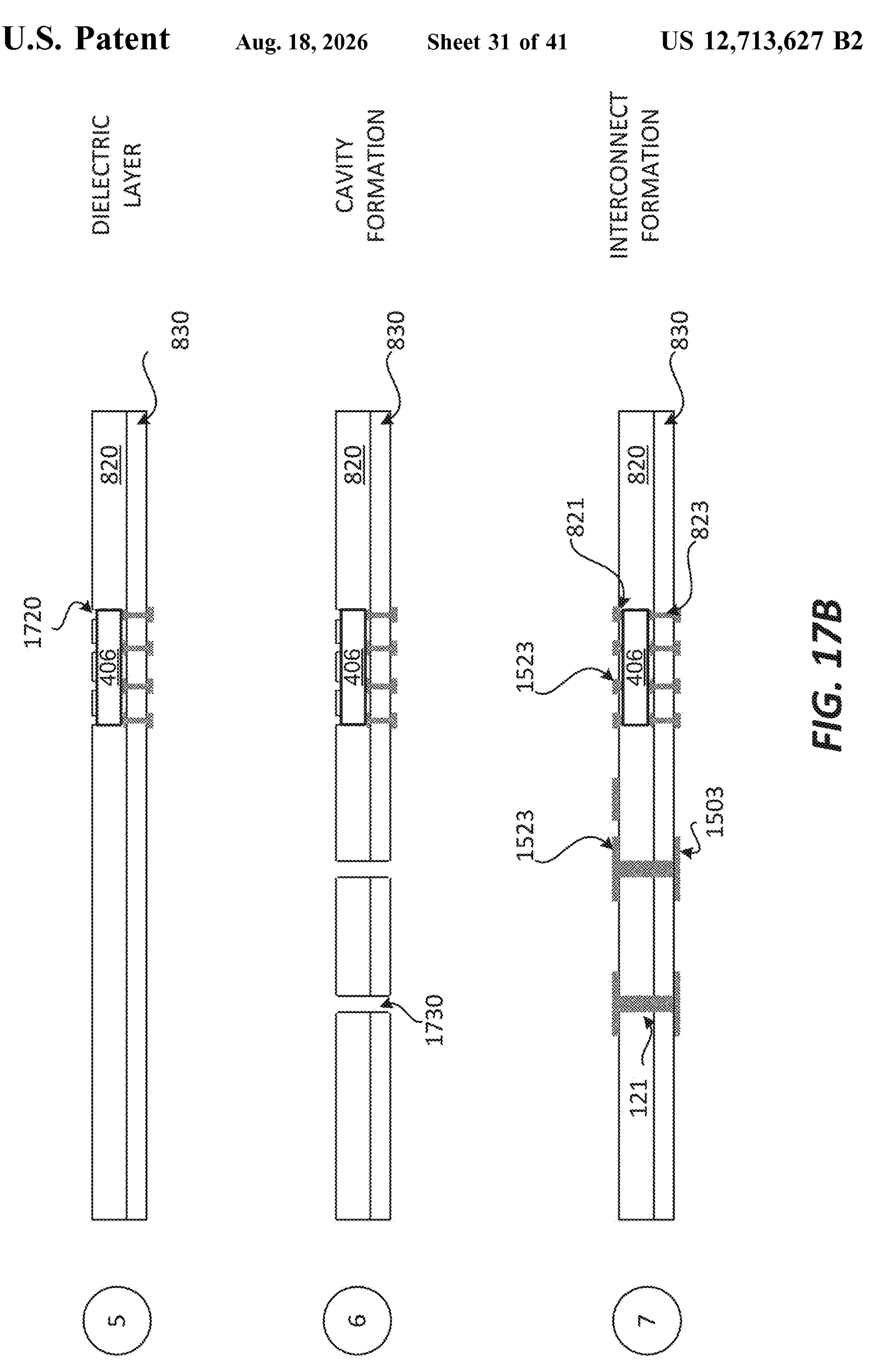

Stage 5, as shown in FIG. 17B, illustrates a state after a plurality of cavities 1720 are formed in the core dielectric layer 820 and over the capacitor structure 406. The plurality of cavities 1720 may expose interconnects from the capacitor structure 406. An etching process and/or a laser ablation process may be used to form the plurality of cavities 1720.

Stage 6 illustrates a state after a plurality of cavities 1730 are formed in the core dielectric layer 820 and the core dielectric layer 830 using an etching process, a laser process and/or a drilling process. The plurality of cavities 1730 may extend through the core dielectric layer 820 and the core dielectric layer 830.

Stage 7 illustrates a state after a plurality of core interconnects 121 are formed in the plurality of cavities 1720 and/or the plurality of cavities 1730. For example, a plurality of core interconnects 121 may be formed in the plurality of cavities 1730. The plurality of core interconnects 121 may be an example of a first plurality of core interconnects. A plurality of core interconnects 821 may be formed between the capacitor structure 406 and the plurality of interconnects 1523. The plurality of interconnects 1523 may be coupled to interconnects of the capacitor structure 406 through the plurality of core interconnects 821. The plurality of core interconnects 821 may be located in the core dielectric layer 820. A plating process may be used to form the plurality of core interconnects 121 and the plurality of core interconnects 821. However, different implementations may use different processes for forming the plurality of core interconnects 121 and/or the plurality of core interconnects 821. The first plurality of core interconnects 121 may include core vias located in the core dielectric layer 820 and the core dielectric layer 830.

Stage 7 also illustrates a state after a plurality of interconnects 1523 are formed over the first surface (e.g., top surface) of the core dielectric layer 820. The plurality of interconnects 1523 may be coupled to the plurality of core interconnects 121. Stage 7 also illustrates a state after a plurality of interconnects 1503 are formed over (e.g., below) the second surface (e.g., bottom surface) of the core dielectric layer 830. The plurality of interconnects 1503 may be coupled to the plurality of core interconnects 121. The plurality of interconnects 1503 may be coupled to interconnects of the capacitor structure 406 through the plurality of core interconnects 823. A patterning process, a stripping process and/or a plating process may be used to form the plurality of interconnects 1503 and the plurality of interconnects 1523. Stage 7 illustrates the capacitor structure 406 located in the core dielectric layer 820.

Figure 17C:
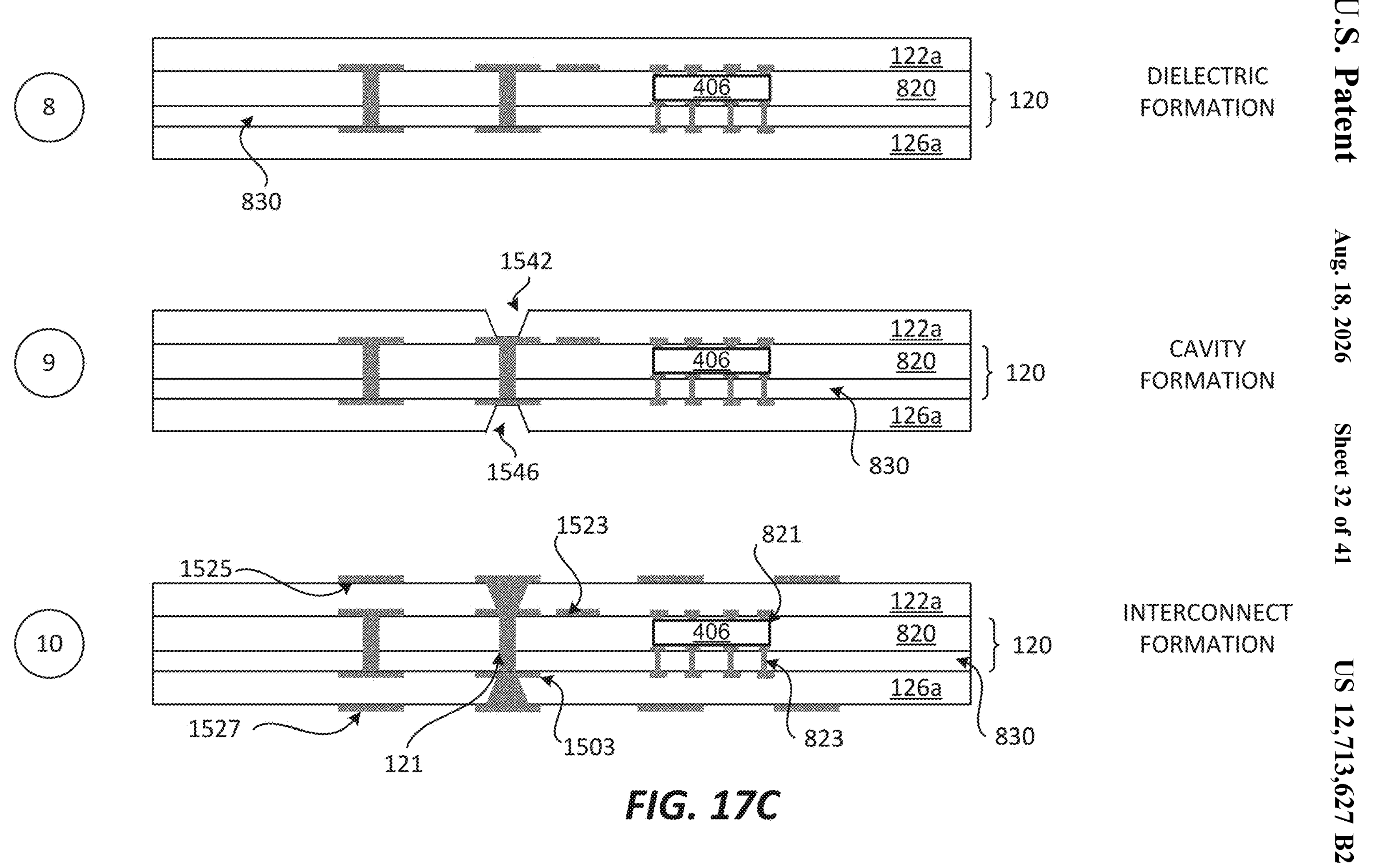

Stage 8, as shown in FIG. 17C, illustrates a state after a dielectric layer 122*a* is formed over the first surface of the core dielectric layer 820, and a dielectric layer 126*a* is formed over the second surface of the core dielectric layer 830. The core layer 120 may represent the core dielectric layer 820 and the core dielectric layer 830. A deposition process and/or lamination process may be used to form dielectric layers 122*a* and 126*a*. The dielectric layers 122*a* and 126*a* may include prepreg (e.g., prepreg layers). Stage 8 illustrates the capacitor structure 406 located in the core layer 120.

Stage 9 illustrates a state after a plurality of cavities 1542 is formed in the dielectric layer 122*a*, and a plurality of cavities 1546 is formed in the dielectric layer 126*a*. An etching process and/or a laser process (e.g., laser drilling, laser ablation) may be used to form the plurality of cavities 1542 and the plurality of cavities 1546.

Stage 10 illustrates a state after a plurality of interconnects 1525 is formed over and coupled to the dielectric layer 122*a* and the plurality of cavities 1542. The plurality of interconnects 1525 may be coupled to the plurality of interconnects 1523. Stage 9 also illustrates a state after a plurality of interconnects 1527 is formed over and coupled the dielectric layer 126*a* and the plurality of cavities 1546. The plurality of interconnects 1527 may be coupled to the plurality of interconnects 1503 and/or the plurality of core interconnects 823. A patterning process, a stripping process and/or a plating process may be used to form the plurality of interconnects 1525 and the plurality of interconnects 1527.

Figure 17D:
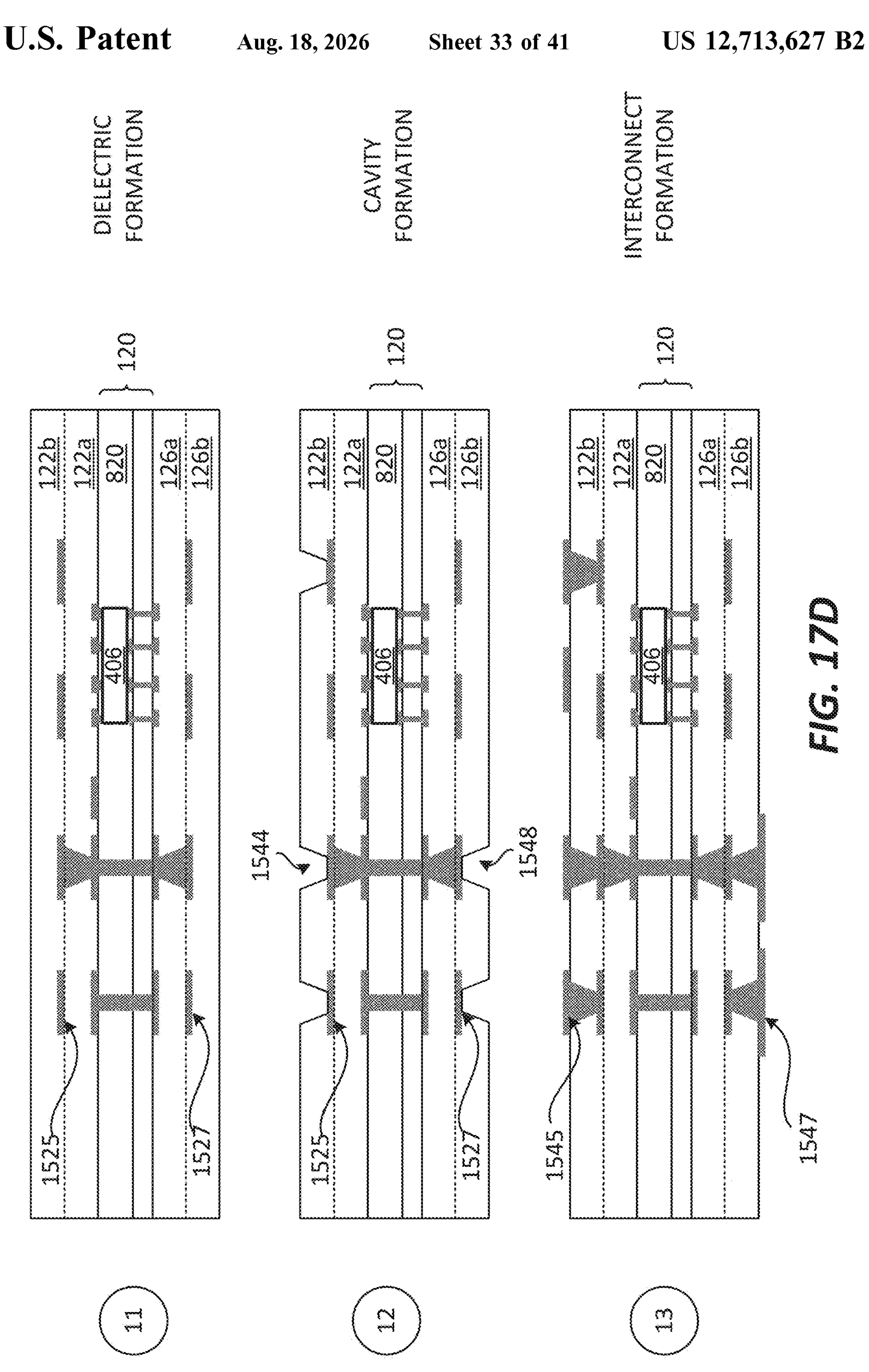

Stage 11, as shown in FIG. 17D, illustrates a state after a dielectric layer 122*b* is formed over and coupled to a first surface of dielectric layer 122*a*, and a dielectric layer 126*b* is formed over and coupled to a second surface of the dielectric layer 126*a*. A deposition process and/or lamination process may be used to form dielectric layers 122*b* and 126*b*. The dielectric layers 122*b* and 126*b* may include prepreg (e.g., prepreg layers).

Stage 12 illustrates a state after a plurality of cavities 1544 is formed in the dielectric layer 122*b*, and a plurality of cavities 1548 is formed in the dielectric layer 126*b*. An etching process and/or a laser process (e.g., laser drilling, laser ablation) may be used to form the plurality of cavities 1544 and the plurality of cavities 1548.

Stage 13 illustrates a state after a plurality of interconnects 1545 is formed over and coupled to the dielectric layer 122*b* and the plurality of cavities 1544. The plurality of interconnects 1545 may be coupled to the plurality of interconnects 1525. Stage 13 also illustrates a state after a plurality of interconnects 1547 is formed over and coupled to the dielectric layer 126*b* and the plurality of cavities 1548. The plurality of interconnects 1547 may be coupled to the plurality of interconnects 1527. A patterning process, a stripping process and/or a plating process may be used to form the plurality of interconnects 1545 and the plurality of interconnects 1547. It is noted that additional dielectric layers and additional interconnects may be formed by repeating Stages 11-13 of FIG. 17D, as described above.

Stage 14, as shown in FIG. 17E, illustrates a state after a solder resist layer 140 is formed over a surface of the dielectric layer 122*b*, and a solder resist layer 142 is formed over a surface of the dielectric layer 126*b*. The plurality of interconnects 125 may represent the plurality of interconnects 1525, the plurality of interconnects 1545 and/or the plurality of interconnects 1523. The plurality of interconnects 127 may represent the plurality of interconnects 1527, the plurality of interconnects 1547, the plurality of interconnects 1503, and/or interconnects from the plurality of core interconnects 823 that is located in the dielectric layer 126*a*.

Stage 15 illustrates a state after a plurality of solder interconnects 150 are coupled to the substrate 102. A solder reflow process may be used to couple the plurality of solder interconnects 150 to the plurality of interconnects 127.

Exemplary Sequences for Fabricating a Substrate Comprising Stacked Trench Capacitor Devices FIGS. 18A-18E illustrate an exemplary sequence for providing or fabricating a substrate that includes stacked trench capacitors. In some implementations, the sequence of FIGS. 18A-18E may be used to provide or fabricate the substrate 402 of FIG. 4, or other substrates described in the disclosure.

It should be noted that the sequence of FIGS. 18A-18E may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate a substrate differently.

Figure 18A:
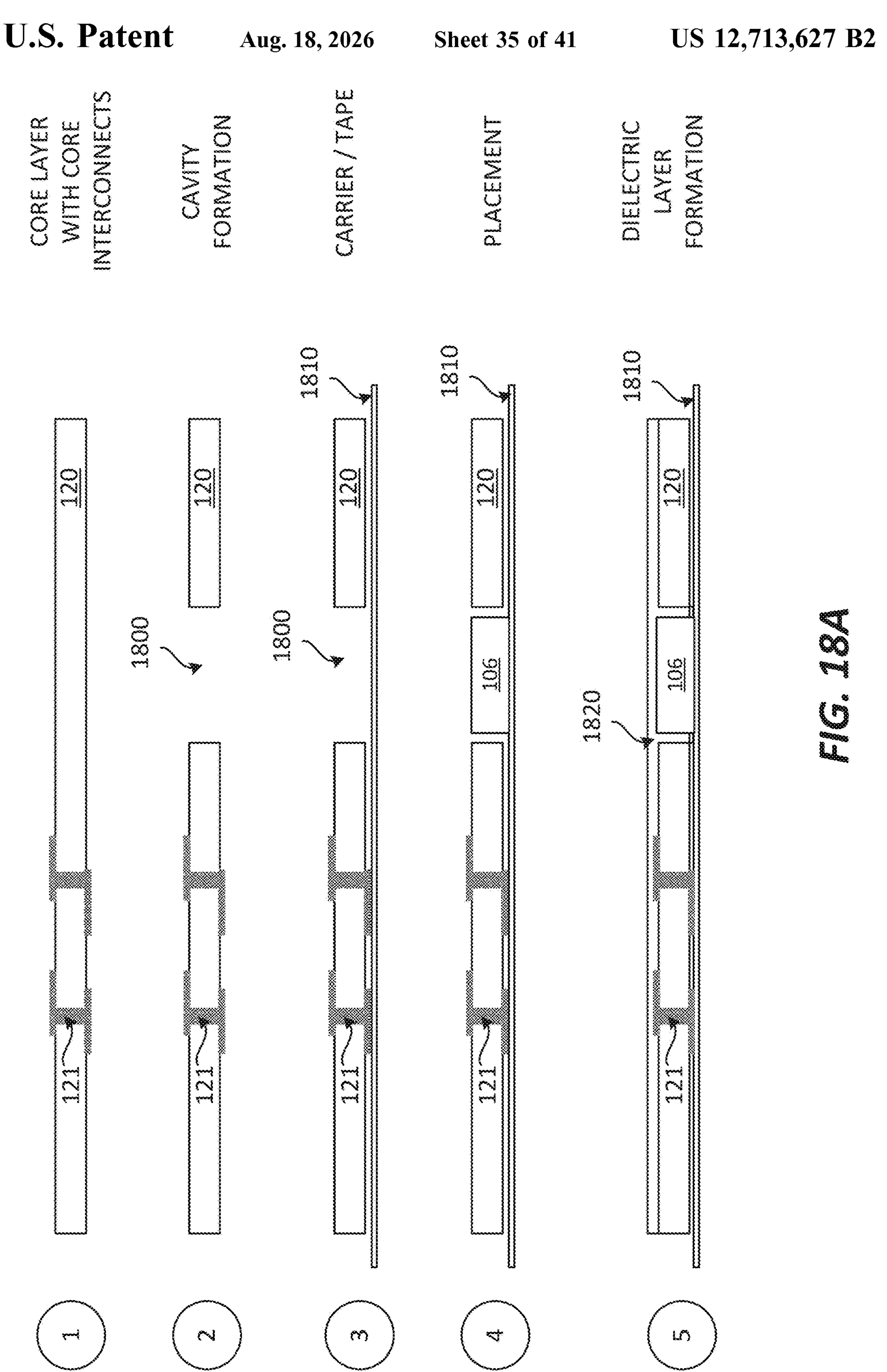
FIGS. 18A-18E illustrate an exemplary sequence for fabricating a substrate comprising a stacked capacitor structure.

Stage 1, as shown in FIG. 18A, illustrates a state after a core layer 120 that includes a plurality of core interconnects 121 are provided. The core layer 120 may be a core dielectric layer. The plurality of core interconnects 121 includes core interconnects 121 that extend through the thickness of the core layer 120*a*, and interconnects that are located on a first surface and a second surface of the core layer 120. The core layer 120 and the plurality of core interconnects 121 may be fabricated using an etching process, a patterning process, a stripping process and/or a plating process.

Stage 2 illustrates a state after at least one cavity 1800 is formed through the core layer 120. A laser process and/or a drilling process may be used to form the at least one cavity 1800.

Stage 3 illustrates a state after the core layer 120 and the plurality of core interconnects 121 are coupled to a carrier 1810 and/or a tape. The carrier 1810 may include a tape.

Stage 4 illustrates a state after the capacitor structure 106 is coupled to the carrier 1810 through the cavity 1800 of the core layer 120. The capacitor structure 106 may be placed through the cavity 1800 and onto the carrier 1810.

Stage 5 illustrates a state after a dielectric layer 1820 is formed over a top surface of the capacitor structure 106, the core layer 120 and the plurality of core interconnects 121. The dielectric layer 1820 may be formed in the cavity 1800 of the core layer 120. A deposition and/or lamination process may be used to form the dielectric layer 1820. The dielectric layer 1820 may include prepreg. The dielectric layer 1820 may include the same material as the core layer 120.

Figure 18B:
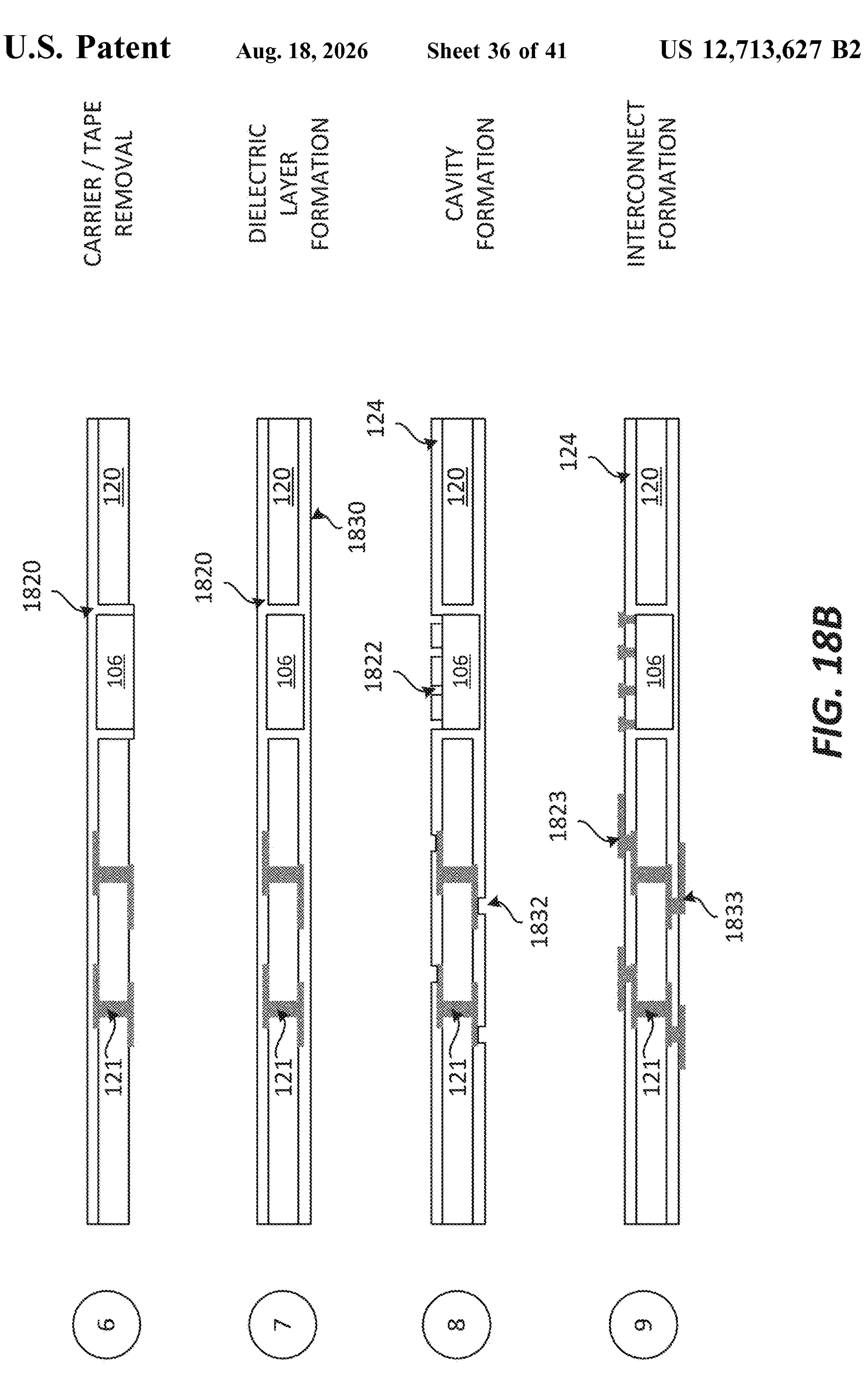

Stage 6, as shown in FIG. 18B, illustrates a state after the carrier 1810 is decoupled from the core layer 120, the capacitor structure 106, the dielectric layer 1820, and the plurality of core interconnects 121. For example, the carrier 1810 may be de-taped from the core layer 120, the capacitor structure 106, the dielectric layer 1820, and the plurality of core interconnects 121. A cleaning process (e.g., plasma clean) may be performed on the core layer 120, the dielectric layer 1820 and the capacitor structure 106 after the carrier 1810 is removed.

Stage 7 illustrates a state after the dielectric layer 1830 is formed over a bottom surface of the capacitor structure 106, the core layer 120*a* and the plurality of core interconnects 121. A deposition and/or lamination process may be used to form the dielectric layer 1830. The dielectric layer 1830 may include prepreg. The dielectric layer 1830 may be similar or the same as the core layer 120 and/or the dielectric layer 1820. Stage 7 illustrates the capacitor structure 106 surrounded (e.g., laterally surrounded) by and touching the dielectric layer 1820 and the dielectric layer 1830. The capacitor structure 106 is located laterally to the core layer 120.

Stage 8 illustrates a state after a plurality of cavities 1822 and a plurality of cavities 1832 are formed in the dielectric layer 124. The dielectric layer 124 may represent the dielectric layer 1820 and/or the dielectric layer 1830. The plurality of cavities 1822 may be formed through a first surface (e.g., top surface) of the dielectric layer 124, and the plurality of cavities 1832 may be formed through a second surface (e.g., bottom surface) of the dielectric layer 124. The plurality of cavities 1822 may expose interconnects from the capacitor structure 106 and interconnects from the plurality of core interconnects 121. The plurality of cavities 1832 may expose interconnects from the plurality of core interconnects 121.

Stage 9 illustrates a state after a plurality of interconnects 1823 are formed over (e.g., above) the first surface (e.g., top surface) of the dielectric layer 124 and in the dielectric layer 124. Some of interconnects from the plurality of interconnects 1823 may be located in the plurality of cavities 1822. The plurality of interconnects 1823 may be coupled to the plurality of core interconnects 121. The plurality of interconnects 1823 may be configured to be coupled to interconnects from the capacitor structure 106.

Stage 9 also illustrates a state after a plurality of interconnects 1833 are formed over (e.g., below) the second surface (e.g., bottom surface) of the dielectric layer 124 and in the dielectric layer 124. Some of interconnects from the plurality of interconnects 1833 may be located in the plurality of cavities 1832. The plurality of interconnects 1833 may be coupled to the plurality of core interconnects 121. A patterning process, a stripping process and/or a plating process may be used to form the plurality of interconnects 1823 and/or the plurality of interconnects 1833.

Figure 18C:
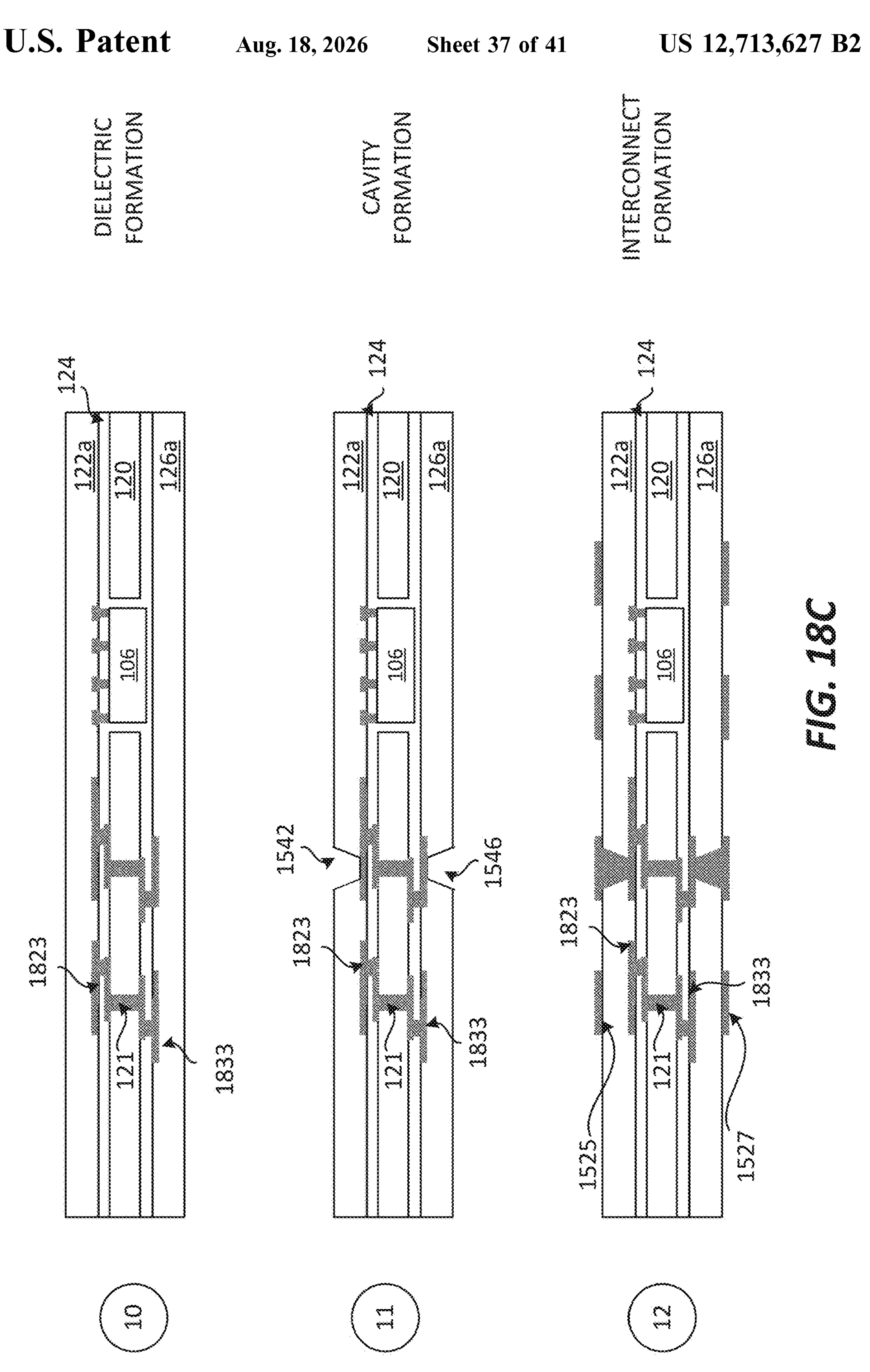

Stage 10, as shown in FIG. 18C, illustrates a state after a dielectric layer 122*a* is formed over (e.g., above) the first surface (e.g., top surface) of the dielectric layer 124, and a dielectric layer 126*a* is formed over (e.g., below) the second surface (e.g., bottom surface) of the dielectric layer 124. A deposition process and/or lamination process may be used to form dielectric layers 122*a* and 126*a*. The dielectric layers 122*a* and 126*a* may include prepreg (e.g., prepreg layers).

Stage 11 illustrates a state after a plurality of cavities 1542 is formed in the dielectric layer 122*a*, and a plurality of cavities 1546 is formed in the dielectric layer 126*a*. An etching process (e.g., photo etching process) and/or a laser process (e.g., laser drilling, laser ablation) may be used to form the plurality of cavities 1542 and the plurality of cavities 1546.

Stage 12 illustrates a state after a plurality of interconnects 1525 is formed over and coupled to the dielectric layer 122*a* and the plurality of cavities 1542. The plurality of interconnects 1525 may be coupled to the plurality of interconnects 1823. Stage 12 also illustrates a state after a plurality of interconnects 1527 is formed over and coupled the dielectric layer 126*a* and the plurality of cavities 1546. The plurality of interconnects 1527 may be coupled to the plurality of interconnects 1833. A patterning process, a stripping process and/or a plating process may be used to form the plurality of interconnects 1525 and the plurality of interconnects 1527.

Figure 18D:
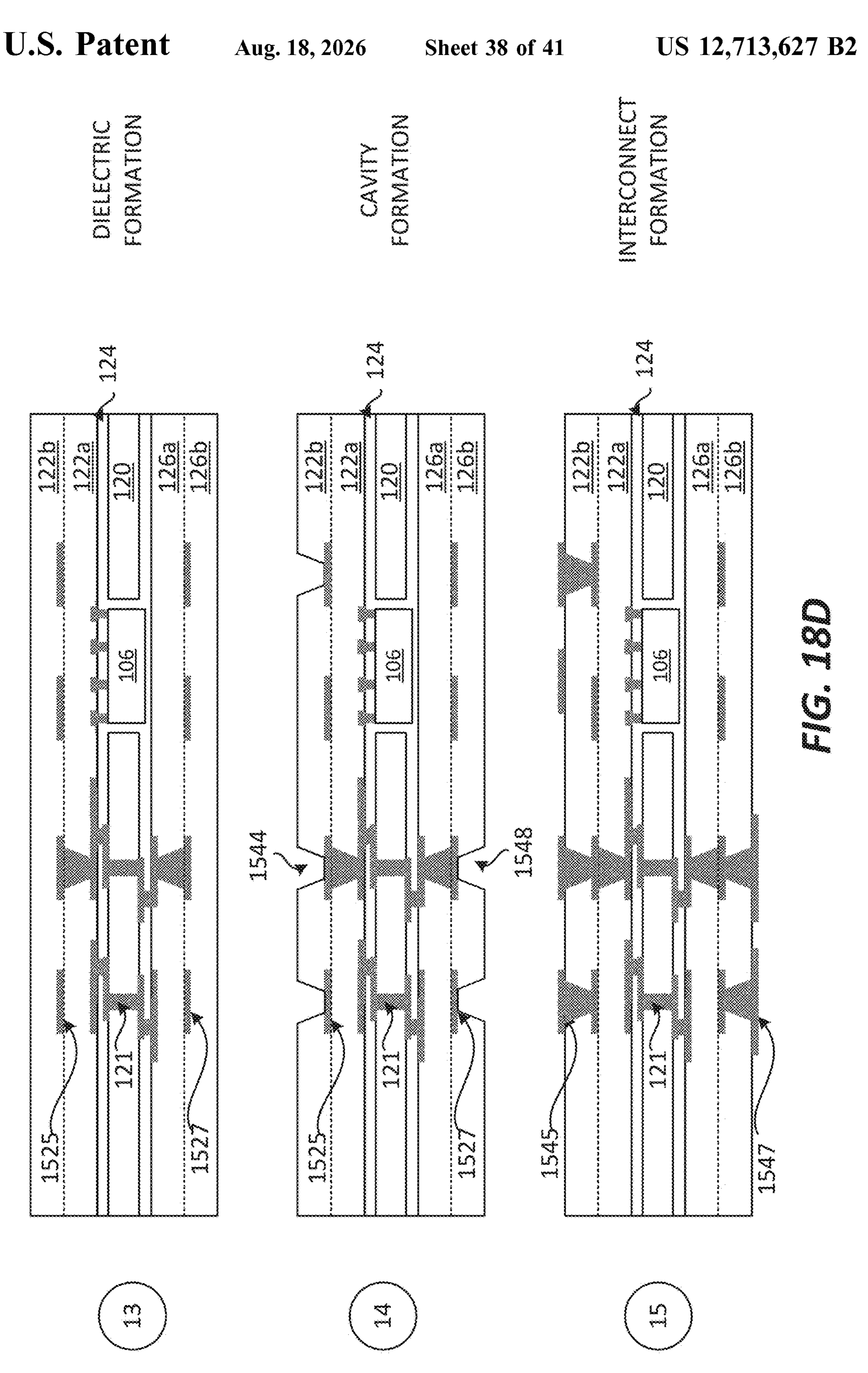

Stage 13, as shown in FIG. 18D, illustrates a state after a dielectric layer 122*b* is formed over and coupled to a first surface of dielectric layer 122*a*, and a dielectric layer 126*b* is formed over and coupled to a second surface of the dielectric layer 126*a*. A deposition process and/or lamination process may be used to form dielectric layers 122*b* and 126*b*. The dielectric layers 122*b* and 126*b* may include prepreg (e.g., prepreg layers).

Stage 14 illustrates a state after a plurality of cavities 1544 is formed in the dielectric layer 122*b*, and a plurality of cavities 1548 is formed in the dielectric layer 126*b*. An etching process and/or a laser process (e.g., laser drilling, laser ablation) may be used to form the plurality of cavities 1544 and the plurality of cavities 1548.

Stage 15 illustrates a state after a plurality of interconnects 1545 is formed over and coupled to the dielectric layer 122*b* and the plurality of cavities 1544. The plurality of interconnects 1545 may be coupled to the plurality of interconnects 1525. Stage 12 also illustrates a state after a plurality of interconnects 1547 is formed over and coupled to the dielectric layer 126*b* and the plurality of cavities 1548. The plurality of interconnects 1547 may be coupled to the plurality of interconnects 1527. A patterning process, a stripping process and/or a plating process may be used to form the plurality of interconnects 1545 and the plurality of interconnects 1547. It is noted that additional dielectric layers and additional interconnects may be formed by repeating Stages 13-15 of FIG. 18D, as described above.

Figure 18E:
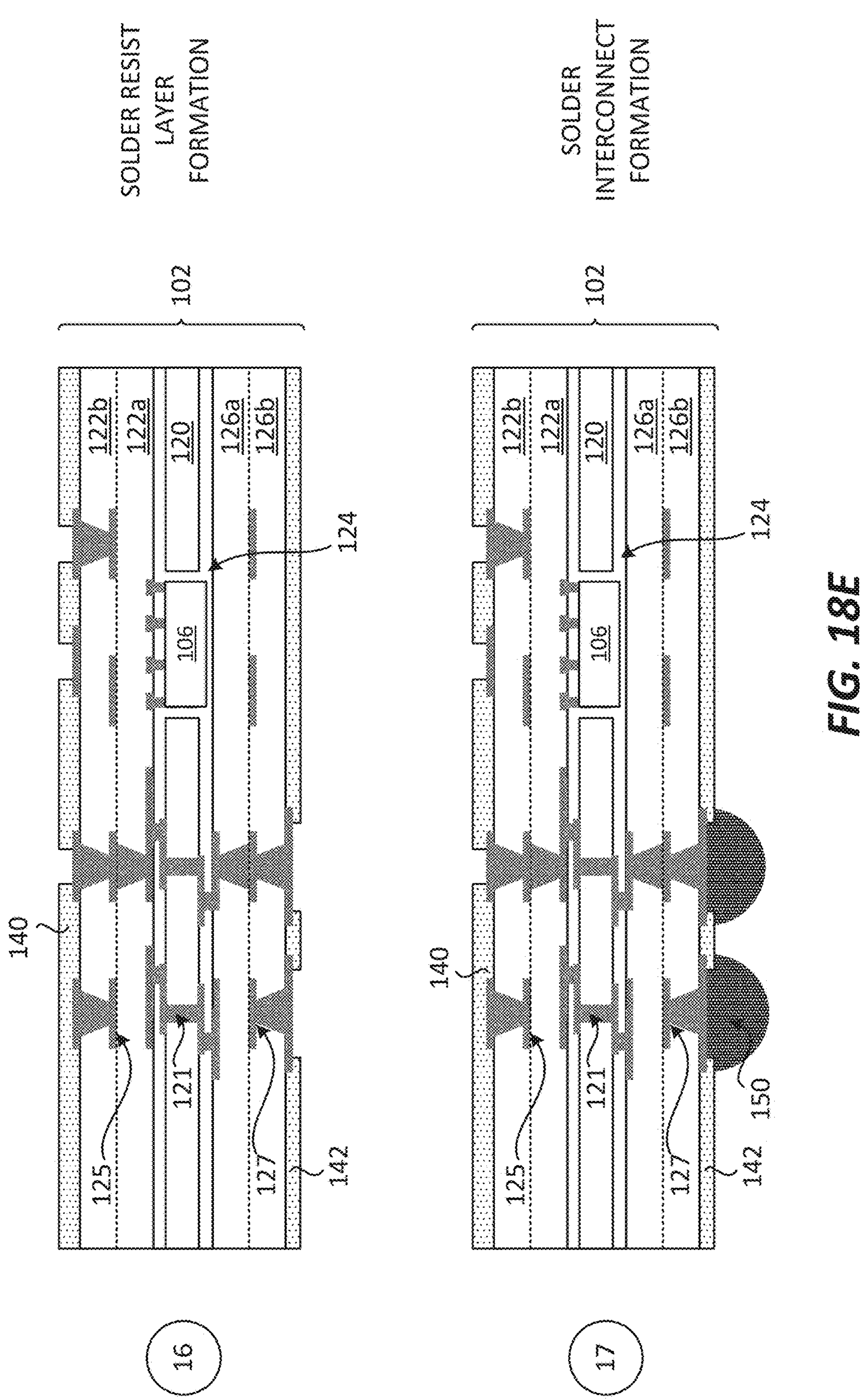

Stage 16, as shown in FIG. 18E, illustrates a state after a solder resist layer 140 is formed over a surface of the dielectric layer 122*b*, and a solder resist layer 142 is formed over a surface of the dielectric layer 126*b*. The plurality of interconnects 125 may represent the plurality of interconnects 1525, the plurality of interconnects 1545 and/or the plurality of interconnects 1823. The plurality of interconnects 127 may represent the plurality of interconnects 1527, the plurality of interconnects 1547 and/or the plurality of interconnects 1833.

Stage 17 illustrates a state after a plurality of solder interconnects 150 are coupled to the substrate 102. A solder reflow process may be used to couple the plurality of solder interconnects 150 to the plurality of interconnects 127.

Figure 19:
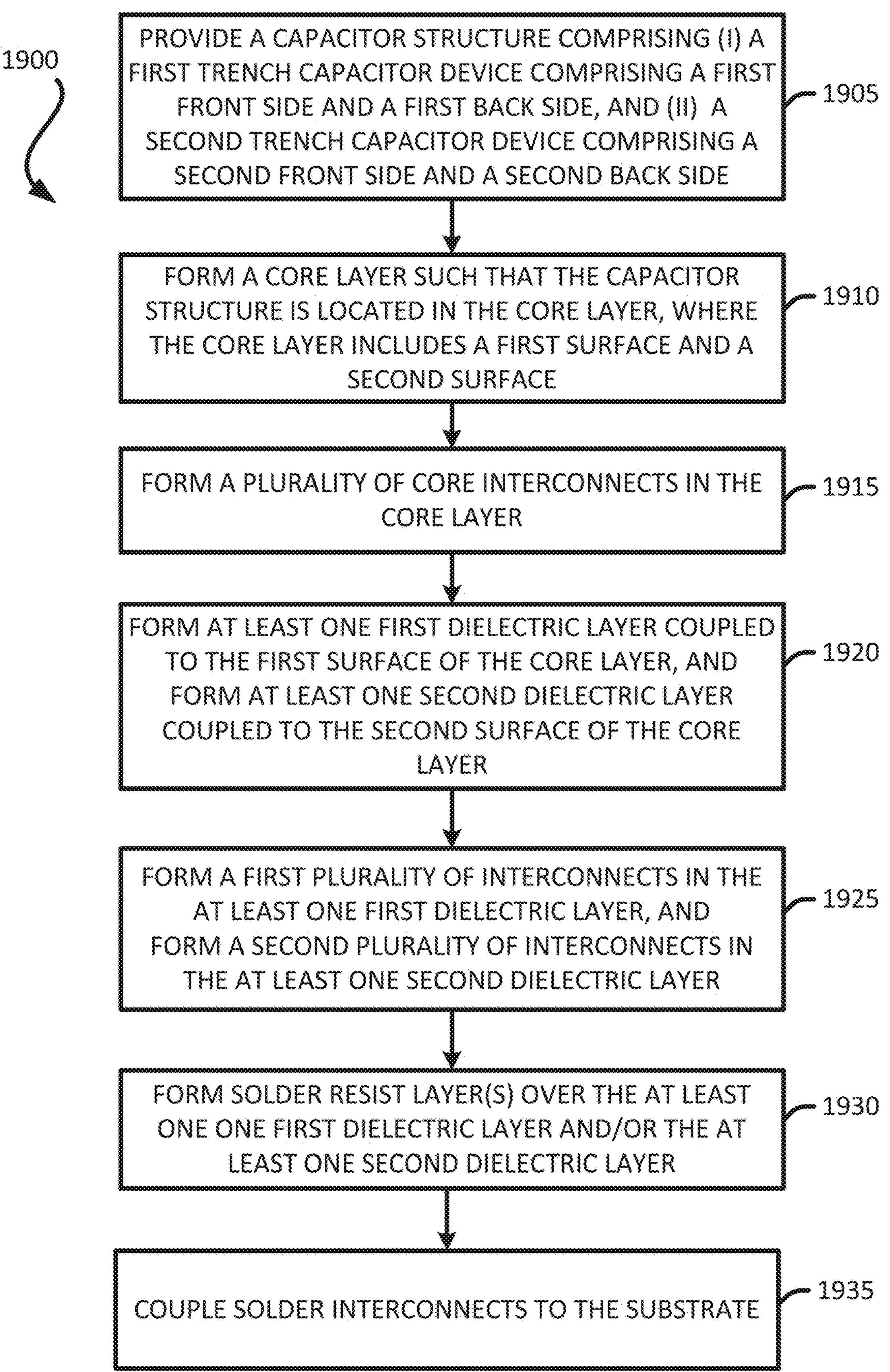
FIG. 19 illustrates an exemplary flow diagram of a method for fabricating a substrate comprising a stacked capacitor structure.

Exemplary Flow Diagram of a Method for Fabricating a Substrate Stacked Trench Capacitors In some implementations, fabricating a substrate includes several processes. FIG. 19 illustrates an exemplary flow diagram of a method 1900 for providing or fabricating a substrate. In some implementations, the method 1900 of FIG. 19 may be used to provide or fabricate the substrate 102 of FIG. 6. However, the method 1900 of FIG. 19 may be used fabricate any substrate in the disclosure.

It should be noted that the method 1900 of FIG. 19 may combine one or more processes in order to simplify and/or clarify the method for providing or fabricating a substrate. In some implementations, the order of the processes may be changed or modified.

The method provides (at 1905) a capacitor structure (e.g., 106, 406, 506) that includes (i) a first trench capacitor device comprising a first front side and a first back side, and (ii) a second trench capacitor device comprising a second front side and a second back side. Examples of trench capacitors include the trench capacitor device 200 and/or the trench capacitor device 300.

The method forms (at 1910) a core layer (e.g., 120) such that the capacitor structure is located in the core layer, where the core layer includes a first surface and a second surface. Examples of forming the core layer are illustrated and shown in at least (i) Stages 3 through 6 of FIGS. 15A and 15B, (ii) Stages 3 through 6 of FIG. 16A, and (iii) Stages 2 through 4 of FIG. 17A.

The method forms (at 1915) a plurality core interconnects (e.g., 121) in the core layer (e.g., 120). Forming the plurality of core interconnects includes forming a plurality of cavities in the core layer. An etching process and/or a laser process or a drilling process may be used to form the cavities. The plurality of cavities may travel through the core layer 120.

The method forms (at 1920) at least one first dielectric layer (e.g., 122) coupled to the first surface of the core layer and forms (at 1920) at least one second dielectric layer (e.g., 126) coupled to the second surface of the core layer. Forming the first dielectric layer and the second dielectric layer may include a deposition, a layup and/or a lamination process.

The method forms (at 1925) a first plurality of interconnects (e.g., 125) in the at least one first dielectric layer, and forms (at 1925) a second plurality of interconnects (e.g., 127) in the at least one second dielectric layer. Forming the plurality of interconnects may include forming a plurality of cavities in the dielectric layers and forming interconnects in the plurality of cavities of the dielectric layers. A patterning process, a stripping process and/or a plating process may be used to form the plurality of interconnects. A laser process (e.g., laser drilling, laser ablation) may be used to form the plurality of cavities in a dielectric layer.

The method forms (at 1930) solder resist layers (e.g., 140, 142) over the at least one first dielectric layer (e.g., 122) and/or the at least one second dielectric layer (e.g., 126). A deposition and/or lamination process may be used to form the solder resist layers.

The method may couple (at 1935) a plurality of solder interconnects (e.g., 150) to the substrate (e.g., 102, 402). For example, a reflow solder process may be used to couple the plurality of solder interconnects 150 to the plurality of interconnects 127 of the substrate 102.

Exemplary Electronic Devices

FIG. 20 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 2002, a laptop computer device 2004, a fixed location terminal device 2006, a wearable device 2008, or automotive vehicle 2010 may include a device 2000 as described herein. The device 2000 may be, for example, any of the devices and/or integrated circuit (IC) packages described herein. The devices 2002, 2004, 2006 and 2008 and the vehicle 2010 illustrated in FIG. 20 are merely exemplary. Other electronic devices may also feature the device 2000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-12, 13A-13F, 14A-14E, 15A-15E, 16A-16E, 17A-17E, 18A-18E and/or 19-20 may be rearranged and/or combined into a single component, process, feature or function or embodied in several components, processes, or functions. Additional elements, components, processes, and/or functions may also be added without departing from the disclosure. It should also be noted FIGS. 1-12, 13A-13F, 14A-14E, 15A-15E, 16A-16E, 17A-17E, 18A-18E and/or 19-20 and its corresponding description in the present disclosure is not limited to dies and/or ICs. In some implementations, FIGS. 1-12, 13A-13F, 14A-14E, 15A-15E, 16A-16E, 17A-17E, 18A-18E and/or 19-20 and its corresponding description may be used to manufacture, create, provide, and/or produce devices and/or integrated devices. In some implementations, a device may include a die, an integrated device, an integrated passive device (IPD), a die package, an integrated circuit (IC)

device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word “exemplary” is used herein to mean “serving as an example, instance, or illustration.” Any implementation or aspect described herein as “exemplary” is not necessarily to be construed as preferred or advantageous over other aspects of the disclosure. Likewise, the term “aspects” does not require that all aspects of the disclosure include the discussed feature, advantage or mode of operation. The term “coupled” is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term “electrically coupled” may mean that two objects are directly or indirectly coupled together such that an electrical current (e.g., signal, power, ground) may travel between the two objects. Two objects that are electrically coupled may or may not have an electrical current traveling between the two objects. The use of the terms “first”, “second”. “third” and “fourth” (and/or anything above fourth) is arbitrary. Any of the components described may be the first component, the second component, the third component or the fourth component. For example, a component that is referred to a second component, may be the first component, the second component, the third component or the fourth component. The term “encapsulating” means that the object may partially encapsulate or completely encapsulate another object. The terms “top” and “bottom” are arbitrary. A component that is located on top may be located over a component that is located on a bottom. A top component may be considered a bottom component, and vice versa. As described in the disclosure, a first component that is located “over” a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term “over” as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located “in” a second component may be partially located in the second component or completely located in the second component. The term “about ‘value X’”, or “approximately value X”, as used in the disclosure means within 10 percent of the ‘value X’. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A package that includes a substrate and an integrated device coupled to the substrate. The substrate includes a core layer comprising a first surface and a second surface, a plurality of core interconnects located in the core layer, at least one first dielectric layer coupled to the first surface of the core layer, a first plurality of interconnects located in the at least one first dielectric layer, at least one second dielectric layer coupled to the second surface of the core layer, a second plurality of interconnects located in the at least one second dielectric layer, and a capacitor structure located in the core layer. The capacitor structure comprises a first trench capacitor device comprising a first front side and a first back side and a second trench capacitor device coupled to the first trench capacitor device, wherein the second trench capacitor device comprises a second front side and a second back side.

Aspect 2: The package of aspect 1, wherein the second trench capacitor device is located over the first trench capacitor device.

Aspect 3: The package of aspects 1 through 2, wherein the first back side of the first trench capacitor device is coupled to the second back side of the second trench capacitor device.

Aspect 4: The package of aspects 1 through 2, wherein the first back side of the first trench capacitor device is coupled to the second front side of the second trench capacitor device.

Aspect 5: The package of aspects 1 through 4, wherein the second trench capacitor device is coupled to the first trench capacitor device through a plurality of solder interconnects.

Aspect 6: The package of aspects 1 through 4, wherein the second trench capacitor device is coupled to the first trench capacitor device through copper to copper bonding.

Aspect 7: The package of aspects 1 through 6, wherein the plurality of core interconnects includes a first core interconnect between the capacitor structure and the first surface of the core layer, and wherein the first core interconnect is coupled to the capacitor structure and the first plurality of interconnects.

Aspect 8: The package of aspect 7, wherein the plurality of core interconnects further includes a second core interconnect between the capacitor structure and the second surface of the core layer, and wherein the second core interconnect is coupled to the capacitor structure and the first plurality of interconnects.

Aspect 9: The package of aspects 1 through 6, wherein the plurality of core interconnects includes a core interconnect between the capacitor structure and the second surface of the core layer, and wherein the core interconnect is coupled to the capacitor structure and the second plurality of interconnects.

Aspect 10: The package of aspects 1 through 9, wherein the integrated device is configured to be electrically coupled to the capacitor structure in the core layer.

Aspect 11: The package of aspects 1 through 10, wherein the capacitor structure includes 3 or more vertically stacked trench capacitors devices.

Aspect 12: The package of aspects 1 through 11, wherein the capacitor structure is configured to operate as a decoupling capacitor and a power management integrated circuit (PMIC) output capacitor.

Aspect 13: The package of aspects 1 through 12, further comprising another capacitor structure coupled to a first surface of the substrate or a second surface of the substrate.

Aspect 14: A device comprising a package. The package includes a substrate and an integrated device coupled to the substrate. The substrate includes a core layer comprising a first surface and a second surface, a plurality of core interconnects located in the core layer, at least one first dielectric layer coupled to the first surface of the core layer, a first plurality of interconnects located in the at least one first dielectric layer, at least one second dielectric layer coupled to the second surface of the core layer, a second plurality of interconnects located in the at least one second dielectric layer; and means for stacked trench capacitance located in the core layer.

Aspect 15: The device of aspect 14, wherein the means for stacked trench capacitance comprises means for first trench capacitance and means for second trench capacitance coupled to the means for first trench capacitance, wherein the means for second trench capacitance is located over the means for first trench capacitance.

Aspect 16: The device of aspect 15, wherein a first back side of the means for first trench capacitance is coupled to a second back side of the means for second trench capacitance.

Aspect 17: The device of aspect 15, wherein a first back side of the means for first trench capacitance is coupled to a second front side of the second trench capacitance.

Aspect 18: The device of aspects 15 through 17, wherein the means for second trench capacitance is coupled to the means for first trench capacitance through a plurality of solder interconnects.

Aspect 19: The device of aspects 15 through 17, wherein the means for second trench capacitance is coupled to the means for first trench capacitance through copper to copper bonding.

Aspect 20: The device of aspects 14 through 19, wherein the plurality of core interconnects includes a first core interconnect that is located between the means for capacitance means for stacked trench capacitance and the first surface of the core layer, and wherein the first core interconnect is coupled to the means for stacked trench capacitance and the first plurality of interconnects.

Aspect 21: The device of aspect 20, wherein the plurality of core interconnects further includes a second core interconnect that is located between the means for stacked trench capacitance and the second surface of the core layer, and wherein the second core interconnect is coupled to the means for stacked trench capacitance and the second plurality of interconnects.

Aspect 22: The device of aspects 14 through 21, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 23: A method for fabricating a substrate. The method provides a capacitor structure comprising a first trench capacitor device comprising a first front side and a first back side and a second trench capacitor device coupled to the first trench capacitor device, wherein the second trench capacitor device comprises a second front side and a second back side. The method forms a core layer such that the capacitor structure is located in the core layer, where the core layer includes a first surface and a second surface. The method forms a plurality of core interconnects in the core layer. The method forms at least one first dielectric layer coupled to the first surface of the core layer. The method forms at least one second dielectric layer coupled to the second surface of the core layer. The method forms a first plurality of interconnects in the at least one first dielectric layer. The method forms a second plurality of interconnects in the at least one second dielectric layer.

Aspect 24: The method of aspect 23, wherein the second trench capacitor device is located over the first trench capacitor device.

Aspect 25: The method of aspects 23 through 24, wherein the first back side of the first trench capacitor device is coupled to the second back side of the second trench capacitor device.

Aspect 26: The method of aspects 23 through 24, wherein the first back side of the first trench capacitor device is coupled to the second front side of the second trench capacitor device.

Aspect 27: The method of aspects 23 through 26, wherein the second trench capacitor device is coupled to the first trench capacitor device through a plurality of solder interconnects.

Aspect 28: The method of aspects 23 through 26, wherein the second trench capacitor device is coupled to the first trench capacitor device through copper to copper bonding.

Aspect 29: The method of aspects 23 through 28, wherein the plurality of core interconnects includes a first core interconnect that is located between the capacitor structure and the first surface of the core layer, and wherein the first core interconnect is coupled to the capacitor structure and the first plurality of interconnects.

Aspect 30: The method of aspect 29, wherein the plurality of core interconnects further includes a second core interconnect that is located between the capacitor structure and the second surface of the core layer, and wherein the second core interconnect is coupled to the capacitor structure and the second plurality of interconnects.

Aspect 31: A package comprising a coreless substrate and an integrated device coupled to the coreless substrate. The coreless substrate includes at least one dielectric layer, a plurality of interconnects located in the at least one dielectric layer, a capacitor structure located in the at least one dielectric layer. The capacitor structure includes a first trench capacitor device comprising a first front side and a first back side and a second trench capacitor device coupled to the first trench capacitor device, wherein the second trench capacitor device comprises a second front side and a second back side.

Aspect 32: The package of aspect 31, wherein the second trench capacitor device is located over the first trench capacitor device.

Aspect 33: The package of aspects 31 through 32, wherein the first back side of the first trench capacitor device is coupled to the second back side of the second trench capacitor device.

Aspect 34: The package of aspects 31 through 32, wherein the first back side of the first trench capacitor device is coupled to the second front side of the second trench capacitor device.

Aspect 35: The package of aspects 31 through 34, wherein the second trench capacitor device is coupled to the first trench capacitor device through a plurality of solder interconnects.

Aspect 36: The package of aspects 31 through 34, wherein the second trench capacitor device is coupled to the first trench capacitor device through copper to copper bonding.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate comprising:
a core layer comprising a first surface and a second surface;
a plurality of core interconnects located in the core layer;
at least one first dielectric layer coupled to the first surface of the core layer;
a first plurality of interconnects located in the at least one first dielectric layer;
at least one second dielectric layer coupled to the second surface of the core layer;
a second plurality of interconnects located in the at least one second dielectric layer; and
a capacitor structure located in the core layer, wherein the capacitor structure comprises:
a first trench capacitor device comprising a first front side and a first back side; and
a second trench capacitor device coupled to the first trench capacitor device,
wherein the second trench capacitor device comprises a second front side and a second back side,
wherein the second trench capacitor device is coupled to the first trench capacitor device such that there is an electrical path that extends between the first trench capacitor device and the second trench capacitor device;
a third dielectric layer at least partially surrounding the capacitor structure within a cavity of the core layer; and
an integrated device coupled to the substrate.

2. The package of claim 1,
wherein the second trench capacitor device is located over the first trench capacitor device,
wherein the first trench capacitor device includes a first plurality of trench capacitors,
wherein the first front side of the first trench capacitor device is a side of the first trench capacitor device that includes the first plurality of trench capacitors,
wherein the second trench capacitor device includes a second plurality of trench capacitors, and
wherein the second front side of the second trench capacitor device is a side of the second trench capacitor device that includes the second plurality of trench capacitors.

3. The package of claim 2, wherein the first back side of the first trench capacitor device is coupled to the second back side of the second trench capacitor device.

4. The package of claim 2, wherein the first back side of the first trench capacitor device is coupled to the second front side of the second trench capacitor device.

5. The package of claim 1,
wherein the second trench capacitor device is coupled to the first trench capacitor device through a plurality of solder interconnects, and
wherein the electrical path within the capacitor structure between the first trench capacitor device and the second trench capacitor device includes the plurality of solder interconnects.

6. The package of claim 1, wherein the second trench capacitor device is coupled to the first trench capacitor device through copper to copper bonding.

7. The package of claim 1,
wherein the plurality of core interconnects includes a first core interconnect between the capacitor structure and the first surface of the core layer, and
wherein the first core interconnect is coupled to the capacitor structure and the first plurality of interconnects.

8. The package of claim 7,
wherein the plurality of core interconnects further includes a second core interconnect between the capacitor structure and the second surface of the core layer, and
wherein the second core interconnect is coupled to the capacitor structure and the first plurality of interconnects.

9. The package of claim 1,
wherein the plurality of core interconnects includes a core interconnect between the capacitor structure and the second surface of the core layer, and
wherein the core interconnect is coupled to the capacitor structure and the second plurality of interconnects.

10. The package of claim 1, wherein the integrated device is configured to be electrically coupled to the capacitor structure in the core layer.

11. The package of claim 1, wherein the capacitor structure includes 3 or more vertically stacked trench capacitors devices.

12. The package of claim 1, wherein the capacitor structure is configured to operate as a decoupling capacitor and a power management integrated circuit (PMIC) output capacitor.

13. The package of claim 1, further comprising another capacitor structure coupled to a first surface of the substrate or a second surface of the substrate.

14. A device comprising:
a package comprising:
a substrate comprising:
a core layer comprising a first surface and a second surface;
a plurality of core interconnects located in the core layer;
at least one first dielectric layer coupled to the first surface of the core layer;
a first plurality of interconnects located in the at least one first dielectric layer;
at least one second dielectric layer coupled to the second surface of the core layer;
a second plurality of interconnects located in the at least one second dielectric layer; and
means for stacked trench capacitance located in the core layer, wherein the means for stacked trench capacitance comprises:
means for first trench capacitance; and
means for second trench capacitance coupled to the means for first trench capacitance, wherein the means for second trench capacitance is coupled to the means for first trench capacitance such that there is an electrical path within the means for stacked trench capacitance that is between the means for first trench capacitance and the means for second trench capacitance;
a third dielectric layer at least partially surrounding the means for stacked trench capacitance within a cavity of the core layer; and
an integrated device coupled to the substrate.

15. The device of claim 14,
wherein the means for first trench capacitance comprises a first plurality of trench capacitors,
wherein a first front side of the means for first trench capacitance is a side of the first means for first trench capacitance that includes the first plurality of trench capacitors,
wherein the means for second trench capacitance comprises a first plurality of trench capacitors, and
wherein a second front side of the means for second trench capacitance is a side of the first means for first trench capacitance that includes the second plurality of trench capacitors.

16. The device of claim 15, wherein a first back side of the means for first trench capacitance is coupled to a second back side of the means for second trench capacitance.

17. The device of claim 15, wherein a first back side of the means for first trench capacitance is coupled to the second front side of the second trench capacitance.

18. The device of claim 15,
wherein the means for second trench capacitance is coupled to the means for first trench capacitance through a plurality of solder interconnects,
wherein the electrical path within the means for stacked trench capacitance that is between the means for first trench capacitance and the means for second trench capacitance includes the plurality of solder interconnects.

19. The device of claim 15, wherein the means for second trench capacitance is coupled to the means for first trench capacitance through copper to copper bonding.

20. The device of claim 14,
wherein the plurality of core interconnects includes a first core interconnect that is located between the means for capacitance means for stacked trench capacitance and the first surface of the core layer, and
wherein the first core interconnect is coupled to the means for stacked trench capacitance and the first plurality of interconnects.

21. The device of claim 20,
wherein the plurality of core interconnects further includes a second core interconnect that is located between the means for stacked trench capacitance and the second surface of the core layer, and
wherein the second core interconnect is coupled to the means for stacked trench capacitance and the second plurality of interconnects.

22. The device of claim 14, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

23. A method for fabricating a substrate, comprising:
providing a capacitor structure comprising:
a first trench capacitor device comprising a first front side and a first back side; and
a second trench capacitor device coupled to the first trench capacitor device,
wherein the second trench capacitor device comprises a second front side and a second back side, and
wherein the second trench capacitor device is coupled to the first trench capacitor device such that there is an electrical path that extends between the first trench capacitor device and the second trench capacitor device;
forming a core layer and a cavity within the core layer, such that the capacitor structure is located in the core layer and in the cavity, where the core layer comprising a first surface and a second surface;
forming a third dielectric layer at least partially surrounding the capacitor structure within the cavity;
forming a plurality of core interconnects in the core layer;
forming at least one first dielectric layer coupled to the first surface of the core layer;
forming at least one second dielectric layer coupled to the second surface of the core layer;
forming a first plurality of interconnects in the at least one first dielectric layer; and
forming a second plurality of interconnects in the at least one second dielectric layer.

24. The method of claim 23, wherein the second trench capacitor device is located over the first trench capacitor device.

25. The method of claim 23, wherein the first back side of the first trench capacitor device is coupled to the second back side of the second trench capacitor device.

26. The method of claim 23, wherein the first back side of the first trench capacitor device is coupled to the second front side of the second trench capacitor device.

27. The method of claim 23, wherein the second trench capacitor device is coupled to the first trench capacitor device through a plurality of solder interconnects.

28. The method of claim 23, wherein the second trench capacitor device is coupled to the first trench capacitor device through copper to copper bonding.

29. The method of claim 23, wherein the plurality of core interconnects includes a first core interconnect that is located between the capacitor structure and the first surface of the core layer, and wherein the first core interconnect is coupled to the capacitor structure and the first plurality of interconnects.

30. The method of claim 29, wherein the plurality of core interconnects further includes a second core interconnect that is located between the capacitor structure and the second surface of the core layer, and wherein the second core interconnect is coupled to the capacitor structure and the second plurality of interconnects.

* * * * *